(12) United States Patent
Thomas et al.

(10) Patent No.: US 12,113,486 B2
(45) Date of Patent: Oct. 8, 2024

(54) AMPLIFIER WITH STACKED TRANSCONDUCTING CELLS IN PARALLEL AND/OR CASCADE "CURRENT MODE" COMBINING

(71) Applicant: The Boeing Company, Chicago, IL (US)

(72) Inventors: Chris M. Thomas, Playa Vista, CA (US); Brian K. Kormanyos, Edmonds, WA (US)

(73) Assignee: The Boeing Company, Chicago, IL (US)

( * ) Notice: Subject to any disclaimer, the term of this patent is extended or adjusted under 35 U.S.C. 154(b) by 497 days.

(21) Appl. No.: 17/378,564

(22) Filed: Jul. 16, 2021

(65) Prior Publication Data
US 2022/0166385 A1 May 26, 2022

Related U.S. Application Data

(60) Provisional application No. 63/116,668, filed on Nov. 20, 2020.

(51) Int. Cl.
*H03F 3/45* (2006.01)
*H03F 1/02* (2006.01)
(Continued)

(52) U.S. Cl.
CPC ........... *H03F 1/223* (2013.01); *H03F 1/0222* (2013.01); *H03F 3/195* (2013.01); *H03F 3/245* (2013.01);
(Continued)

(58) Field of Classification Search
CPC ........................................................ H03F 3/45
(Continued)

(56) References Cited

U.S. PATENT DOCUMENTS

| 4,590,437 A | 5/1986 | Butler et al. | |
|---|---|---|---|
| 6,317,016 B1 * | 11/2001 | Kuo | H03H 11/045 333/167 |

(Continued)

OTHER PUBLICATIONS

Agah, Amir et al., "Multi-Drive Stacked-FET Power Amplifiers at 90 GHz in 45 nm SOI CMOS," in IEEE Journal of Solid-State Circuits, vol. 49, no. 5, pp. 1148-1157, May 2014.

(Continued)

*Primary Examiner* — Henry Choe
(74) *Attorney, Agent, or Firm* — Haynes and Boone, LLP

(57) ABSTRACT

An amplifier with stacked transconducting cells in parallel and/or cascade "current mode" combining is disclosed herein. In one or more embodiments, a method for operation of a high-voltage signal amplifier comprises inputting, into each transconducting cell of a plurality of transconducting cells, a direct current (DC) supply current (Idc), an alternating current (AC) radio frequency (RF) input current ($I_{RF\_IN}$), and an RF input signal ($RF_{IN}$). The method further comprises outputting, by each of the transconducting cells of the plurality of transconducting cells, the DC supply current (Idc) and an AC RF output current ($I_{RF\_OUT}$). In one or more embodiments, the transconducting cells are connected together in cascode for the DC supply current (Idc), are connected together in parallel (or in cascade) for the RF input signal ($RF_{IN}$), and are connected together in parallel (or in cascade) for the AC RF output currents ($I_{RF\_OUT}$).

20 Claims, 52 Drawing Sheets

(51) Int. Cl.
*H03F 1/22* (2006.01)
*H03F 3/195* (2006.01)
*H03F 3/24* (2006.01)

(52) U.S. Cl.
CPC .. *H03F 2200/318* (2013.01); *H03F 2200/451* (2013.01)

(58) Field of Classification Search
USPC .......................................... 330/253, 261, 310
See application file for complete search history.

(56) References Cited

U.S. PATENT DOCUMENTS

| | | | | |
|---|---|---|---|---|
| 6,812,771 | B1 * | 11/2004 | Behel .................... | H03F 1/22 327/356 |
| 6,909,292 | B1 * | 6/2005 | Kavadias .......... | H03H 11/1291 324/623 |
| 7,642,845 | B2 * | 1/2010 | Gehring ................. | H03F 3/191 327/552 |
| 9,543,915 | B1 | 1/2017 | Bonebright et al. | |
| 9,755,680 | B2 * | 9/2017 | Zhu .................... | H03F 3/45475 |
| 2007/0222519 | A1 | 9/2007 | Deng et al. | |
| 2010/0123520 | A1 * | 5/2010 | Shifrin ................ | H03F 3/45183 330/254 |
| 2020/0014351 | A1 | 1/2020 | Emira et al. | |

OTHER PUBLICATIONS

Jaymon, Jefy A., et al., "Multigate-Cell Stacked FET Design for Millimeter-Wave CMOS Power Amplifiers," IEEE Journal of Solid-State Circuits, vol. 51, No. 9, pp. 2027-2039, Sep. 2016.

Jaymon, Jefy, et al., "A W-band Stacked FET Power Amplifier with 17 dBm Psat in 45-nm SOI CMOS," 2013 IEEE Radio and Wireless Symposium, Austin, TX, USA, 2013, pp. 256-258, doi: 10.1109/RWS.2013.6486706.

Pornpromlikit, Sataporn, et al., "A Watt-Level Stacked-FET Linear Power Amplifier in Silicon-on-Insulator CMOS," in IEEE Transactions on Microwave Theory and Techniques, vol. 58, No. 1, pp. 57-64, Jan. 2010.

Schellenberg, James, "High-Efficiency, Packaged Ka-Band MMIC Operating at 24 Volts," 1998 IEEE MTT-S International Microwave Symposium Digest (Cat. No.98CH36192), Baltimore, MD, USA, 1998, pp. 577-580, vol. 2.

* cited by examiner

AMPLIFIER WITH STACKED TRANSCONDUCTING CELLS IN PARALLEL AND/OR CASCADE "CURRENT MODE" COMBINING

CROSS REFERENCE TO RELATED APPLICATION

The present application claims priority to Provisional U.S. Patent Application Ser. No. 63/116,668, filed Nov. 20, 2020, which is hereby incorporated by reference in its entirety.

FIELD

The present disclosure relates to an amplifier. In particular, the present disclosure relates to an amplifier with stacked transconducting cells in parallel and/or cascade "current mode" combining.

BACKGROUND

Signal amplifiers intended for high frequency millimeter-wave bands, operating at tens of gigahertz (GHz) to hundreds of GHz, often require that the amplifier is implemented with a semiconductor technology having high frequency performance, which is denoted by a unity frequency gain figure of merit (Ft). Typically, a device with high Ft has smaller-device fabricated feature sizes, which reduce the voltage handling and device voltage breakdown, thereby limiting the output power obtainable from a single device. For systems that require higher output power than available from a single device, or for systems limited to high voltage supplies, techniques of device stacking, in which a common current is shared amongst a cascode of devices splitting the power supply voltage across each device, have been adopted. However, these conventional stacked device approaches have known limitations on layout size when using power combining techniques, and have reliability concerns when using "voltage mode" combining techniques.

In light of the foregoing, there is a need for an improved design for a high-voltage signal amplifier.

SUMMARY

The present disclosure relates to a method, system, and apparatus for an amplifier with stacked transconducting cells in current mode combining. In one or more embodiments, a method for operation of a high-voltage signal amplifier comprises inputting, into each transconducting cell of a plurality of transconducting cells, a direct current (DC) supply current (Idc), an alternating current (AC) radio frequency (RF) input current ($I_{RF\_IN}$), and an RF input signal ($RF_{IN}$). The method further comprises outputting, by each of the transconducting cells of the plurality of transconducting cells, the DC supply current (Idc) and an AC RF output current ($I_{RF\_OUT}$). In one or more embodiments, the transconducting cells are connected together in cascode for the DC supply current (Idc), are connected together in cascade (or in parallel) for the RF input signal ($RF_{IN}$), and are connected together in cascade (or in parallel) for the AC RF output currents ($I_{RF\_OUT}$).

In at least one embodiment, the method further comprises providing, by an input signal source (Vin), the RF input signal ($RF_{IN}$) to an input matching network (M1). In some embodiments, the input matching network (M1) is a single-input single-output matching network. In one or more embodiments, the method further comprises transforming, by the input matching network (M1), the RF input signal ($RF_{IN}$) to provide a power match to an input of each of the transconducting cells.

In one or more embodiments, when the transconducting cells are connected together in cascade for the RF input signal ($RF_{IN}$), the input matching network (M1) is connected to an input junction of one of the transconducting cells.

In at least one embodiment, the method further comprises inputting, the AC RF output current ($I_{RF\_OUT}$) outputted from the transconducting cells of the plurality transconducting cells, into an output matching network (M2) to deliver power to a load impedance ($R_L$). In some embodiments, the output matching network (M2) is a single-input single-output matching network.

In one or more embodiments, when the transconducting cells are connected together in cascade for the AC RF output currents, the output matching network (M2) is connected to an output junction of one of the transconducting cells.

In at least one embodiment, each of the transconducting cells comprises a metal oxide silicon field effect transistor (MOSFET). In some embodiments, each of the transconducting cells comprises a bipolar junction transistor (BJT).

In one or more embodiments, the method further comprises splitting a power supply voltage (Vdd) evenly amongst the transconducting cells to power the transconducting cells. In some embodiments, a DC supply voltage drop of Vdd/N, where N is a number of the transconducting cells, is across each of the transconducting cells.

In at least one embodiment, a method for operation of a high-voltage multi-stage signal amplifier comprises inputting, into each transconducting cell of a plurality of transconducting cells of a first stage, a direct current (DC) supply current (Idc), an alternating current (AC) radio frequency (RF) input current ($I_{RF\_IN}$), and an RF input signal ($RF_{IN}$). The method further comprises inputting, into each transconducting cell of a plurality of transconducting cells of a second stage, the DC supply current (Idc), the AC RF input current ($I_{RF\_IN}$), and the RF input signal ($RF_{IN}$). Also, the method comprises outputting, by each of the transconducting cells of the plurality of transconducting cells of the first stage, the DC supply current (Idc) and an AC RF output current ($I_{RF\_OUT}$). In addition, the method comprises outputting, by each of the transconducting cells of the plurality of transconducting cells of the second stage, the DC supply current (Idc) and the AC RF output current ($I_{RF\_OUT}$). In one or more embodiments, the transconducting cells of the first stage are connected together in cascode for the DC supply current (Idc), are connected together in parallel (or in cascade) for the RF input signal ($RF_{IN}$), and are connected together in parallel (or in cascade) for the AC RF output currents ($I_{RF\_OUT}$). In at least one embodiment, the transconducting cells of the second stage are connected together in cascode for the DC supply current (Idc), are connected together in parallel (or in cascade) for the RF input signal ($RF_{IN}$), and are connected together in parallel (or in cascade) for the AC RF output currents ($I_{RF\_OUT}$). In some embodiments, the first stage and the second stage are connected together in cascode for the DC supply current.

In one or more embodiments, the method further comprises splitting a power supply voltage (Vdd) evenly amongst the transconducting cells of the first stage and the second stage to power the transconducting cells of the first stage and the second stage. In some embodiments, a DC supply voltage drop of Vdd/N, where N is a number of the transconducting cells of the first stage and the second stage, is across each of the transconducting cells of the first stage and the second stage.

In at least one embodiment, the method further comprises providing, by an input signal source (Vin), the RF input signal ($RF_{IN}$) to an input matching network (M1). In some embodiments, the input matching network (M1) is a single-input single-output matching network. In one or more embodiments, the method further comprises transforming, by the input matching network (M1), the RF input signal ($RF_{IN}$) to provide a power match to an input of each of the transconducting cells of the first stage.

In one or more embodiments, the method further comprises inputting, the AC RF output current ($I_{RF\_OUT}$) outputted from at least one of the transconducting cells of the plurality transconducting cells of the first stage, into an inner stage matching network (M2) to deliver power to the transconducting cells of the second stage. In some embodiments, the inner stage matching network (M2) is a single-input single-output matching network.

In at least one embodiment, the method further comprises inputting, the AC RF output current ($I_{RF\_OUT}$) outputted from at least one of the transconducting cells of the plurality transconducting cells of the second stage, into an output matching network (M3) to deliver power to a load ($R_L$). In some embodiments, the output matching network (M3) is a single-input single-output matching network.

In one or more embodiments, a high-voltage signal amplifier comprises a plurality of transconducting cells, each configured to receive a direct current (DC) supply current (Idc), an alternating current (AC) radio frequency (RF) input current ($I_{RF\_IN}$), and an RF input signal ($RF_{IN}$); and each configured to output the DC supply current (Idc) and an AC RF output current ($I_{RF\_OUT}$). In at least one embodiment, the transconducting cells are connected together in cascode for the DC supply current (Idc), are connected together in parallel (or in cascade) for the RF input signal ($RF_{IN}$), and are connected together in parallel (or in cascade) for the AC RF output currents ($I_{RF\_OUT}$).

In at least one embodiment, the amplifier further comprises an input signal source (Vin) to provide the RF input signal ($RF_{IN}$) to an input matching network (M1). In some embodiments, the input matching network (M1) is to transform the RF input signal ($RF_{IN}$) to provide a power match to an input of each of the transconducting cells. In one or more embodiments, when the transconducting cells are connected together in cascade for the RF input signal ($RF_{IN}$), the input matching network (M1) is connected to an input junction of one of the transconducting cells.

In one or more embodiments, the AC RF output current ($I_{RF\_OUT}$) outputted from the transconducting cells of the plurality transconducting cells is inputted into an output matching network (M2) to deliver power to a load impedance ($R_L$). In some embodiments, when the transconducting cells are connected together in cascade for the AC RF output currents, the output matching network (M2) is connected to an output junction of one of the transconducting cells.

In at least one embodiment, a power supply voltage (Vdd) is split evenly amongst the transconducting cells to power the transconducting cells. In some embodiments, a DC supply voltage drop of Vdd/N, where N is a number of the transconducting cells, is across each of the transconducting cells.

In one or more embodiments, a high-voltage multi-stage signal amplifier comprises a plurality of transconducting cells of a first stage, each configured to receive a direct current (DC) supply current (Idc), an alternating current (AC) radio frequency (RF) input current ($I_{RF\_IN}$), and an RF input signal ($RF_{IN}$); and each configured to output the DC supply current (Idc) and an AC RF output current ($I_{RF\_OUT}$). The amplifier further comprises a plurality of transconducting cells of a second stage, each configured to receive the DC supply current (Idc), the AC RF input current ($I_{RF\_IN}$), and the RF input signal ($RF_{IN}$); and each configured to output the DC supply current (Idc) and the AC RF output current ($I_{RF\_OUT}$). In one or more embodiments, the transconducting cells of the first stage are connected together in cascode for the DC supply current (Idc), are connected together in parallel (or in cascade) for the RF input signal ($RF_{IN}$), and are connected together in parallel (or in cascade) for the AC RF output currents ($I_{RF\_OUT}$). In at least one embodiment, the transconducting cells of the second stage are connected together in cascode for the DC supply current (Idc), are connected together in parallel (or in cascade) for the RF input signal ($RF_{IN}$), and are connected together in parallel (or in cascade) for the AC RF output currents ($I_{RF\_OUT}$). In some embodiments, the first stage and the second stage are connected together in cascode for the DC supply current.

In at least one embodiment, a power supply voltage (Vdd) is split evenly amongst the transconducting cells of the first stage and the second stage to power the transconducting cells of the first stage and the second stage. In one or more embodiments, a DC supply voltage drop of Vdd/N, where N is a number of the transconducting cells of the first stage and the second stage, is across each of the transconducting cells of the first stage and the second stage.

In one or more embodiments, the amplifier further comprises an input signal source (Vin) to provide the RF input signal ($RF_{IN}$) to an input matching network (M1). In at least one embodiment, the input matching network (M1) is a single-input single-output matching network. In some embodiments, the input matching network (M1) is to transform the RF input signal ($RF_{IN}$) to provide a power match to an input of each of the transconducting cells of the first stage.

In at least one embodiments, the AC RF output current ($I_{RF\_OUT}$) outputted from at least one of the transconducting cells of the plurality transconducting cells of the first stage is inputted into an inner stage matching network (M2) to deliver power to the transconducting cells of the second stage. In one or more embodiments, the AC RF output current ($I_{RF\_OUT}$) outputted from at least one of the transconducting cells of the plurality transconducting cells of the second stage is inputted into an output matching network (M3) to deliver power to a load ($R_L$). In some embodiments, the output matching network (M3) is a single-input single-output matching network.

In one or more embodiments, a method for operation of a high-voltage signal amplifier comprises inputting, into each transconducting cell of a plurality of transconducting cells, a direct current (DC) supply current (Idc), an alternating current (AC) radio frequency (RF) input current ($I_{RF\_IN}$), and an RF input signal ($RF_{IN}$). The method further comprises outputting, by each of the transconducting cells of the plurality of transconducting cells, the DC supply current (Idc) and an AC RF output current ($I_{RF\_OUT}$). In one or more embodiments, the transconducting cells are connected together in cascode for the DC supply current, and are connected together in cascade for the AC RF input and output currents.

In one or more embodiments, the method further comprises splitting a power supply voltage (Vdd) evenly amongst the transconducting cells to power the transconducting cells. In at least one embodiment, a DC supply voltage drop of Vdd/N, where N is a number of the transconducting cells, is across each of the transconducting cells.

In at least one embodiment, the method further comprises providing, by an input signal source (Vin), the RF input signal ($RF_{IN}$) to an input matching network (M1). In some embodiments, the input matching network (M1) is a single-input single-output matching network. In one or more embodiments, the method further comprises transforming, by the input matching network (M1), the RF input signal ($RF_{IN}$) to provide a power match to an input of each of the transconducting cells.

In one or more embodiments, the method further comprises inputting, the AC RF output current ($I_{RF\_OUT}$) outputted from a last transconducting cell of the plurality transconducting cells, into an output matching network (M2) to deliver power to a load impedance ($R_L$). In some embodiments, the output matching network (M2) is a single-input single-output matching network.

In at least one embodiment, each of the transconducting cells comprises a metal oxide silicon field effect transistor (MOSFET). In some embodiments, each of the transconducting cells comprises a bipolar junction transistor (BJT).

In one or more embodiments, a high-voltage signal amplifier comprises a plurality of transconducting cells, each configured to receive a direct current (DC) supply current (Idc), an alternating current (AC) radio frequency (RF) input current ($I_{RF\_IN}$), and an RF input signal ($RF_{IN}$); and each configured to output the DC supply current (Idc) and an AC RF output current ($I_{RF\_OUT}$). In at least one embodiment, the transconducting cells are connected together in cascode for the DC supply current, and are connected together in cascade for the AC RF input and output currents.

In at least one embodiment, each of the transconducting cells is further configured to receive a supply voltage (Vdd), which is split evenly amongst the transconducting cells, to power the transconducting cells. In some embodiments, a DC supply voltage drop of Vdd/N, where N is a number of the transconducting cells, is across each of the transconducting cells.

In one or more embodiments, the amplifier further comprises an input matching network (M1). In some embodiments, the amplifier further comprises an input signal source (Vin) to provide the RF input signal ($RF_{IN}$) to the input matching network (M1). In at least one embodiment, the input matching network (M1) is configured to transform the RF input signal ($RF_{IN}$) to provide a power match to an input of each of the transconducting cells.

In at least one embodiment, the amplifier further comprises an output matching network (M2) configured to receive the AC RF output current ($I_{RF\_OUT}$) outputted from a last transconducting cell of the plurality transconducting cells to deliver power to a load impedance ($R_L$).

In one or more embodiments, a method for operation of a high-voltage multi-stage signal amplifier comprises inputting, into each transconducting cell of a plurality of transconducting cells of a first stage, a DC supply current (Idc), an AC RF input current ($I_{RF\_IN}$), and an RF input signal ($RF_{IN}$). The method further comprises inputting, into each transconducting cell of a plurality of transconducting cells of a second stage, the DC supply current (Idc), the AC RF input current ($I_{RF\_IN}$), and the RF input signal ($RF_{IN}$). Also, the method comprises outputting, by each of the transconducting cells of the plurality of transconducting cells of the first stage, the DC supply current (Idc) and an AC RF output current ($I_{RF\_OUT}$). Further, the method comprises outputting, by each of the transconducting cells of the plurality of transconducting cells of the second stage, the DC supply current (Idc) and the AC RF output current ($I_{RF\_OUT}$). In one or more embodiments, the transconducting cells of the first stage are connected together in cascode for the DC supply current, and are connected together in cascade for the AC RF input and output currents. In at least one embodiment, the transconducting cells of the second stage are connected together in cascode for the DC supply current, and are connected together in cascade for the AC RF input and output currents. In some embodiments, the first stage and the second stage are connected together in cascode for the DC supply current, and are connected together in cascade for the AC RF input and output currents.

In at least one embodiment, the method further comprises splitting a power supply voltage (Vdd) evenly amongst the transconducting cells of the first stage and the second stage to power the transconducting cells of the first stage and the second stage. In some embodiments, a DC supply voltage drop of Vdd/N, where N is a number of the transconducting cells of the first stage and the second stage, is across each of the transconducting cells of the first stage and the second stage.

In one or more embodiments, the method further comprises providing, by an input signal source (Vin), the RF input signal ($RF_{IN}$) to an input matching network (M1). In some embodiments, the input matching network (M1) is a single-input single-output matching network. In at least one embodiment, the method further comprises transforming, by the input matching network (M1), the RF input signal ($RF_{IN}$) to provide a power match to an input of each of the transconducting cells of the first stage.

In at least one embodiment, the method further comprises inputting, the AC RF output current ($I_{RF\_OUT}$) outputted from a last transconducting cell of the plurality transconducting cells of the first stage, into an inner stage matching network (M2) to deliver power to the transconducting cells of the second stage. In some embodiments, the inner stage matching network (M2) is a single-input single-output matching network.

In one or more embodiments, the method further comprises inputting, the AC RF output current ($I_{RF\_OUT}$) outputted from a last transconducting cell of the plurality transconducting cells of the second stage, into an output matching network (M3) to deliver power to a load ($R_L$). In some embodiments, the output matching network (M3) is a single-input single-output matching network.

In at least one embodiment, a high-voltage multi-stage signal amplifier comprises a plurality of transconducting cells of a first stage, each configured to receive a direct current (DC) supply current (Idc), an alternating current (AC) radio frequency (RF) input current ($I_{RF\_IN}$), and an RF input signal ($RF_{IN}$); and each configured to output the DC supply current (Idc) and an AC RF output current ($I_{RF\_OUT}$). In one or more embodiments, the transconducting cells of the first stage are connected together in cascode for the DC supply current, and are connected together in cascade for the AC RF input and output currents. The amplifier further comprises a plurality of transconducting cells of a second stage, each configured to receive the DC supply current (Idc), the AC RF input current ($I_{RF\_IN}$), and the RF input signal ($RF_{IN}$); and each configured to output the DC supply current (Idc) and the AC RF output current ($I_{RF\_OUT}$). In one or more embodiments, the transconducting cells of the second stage are connected together in cascode for the DC supply current, and are connected together in cascade for the AC RF input and output currents. In some embodiments, the first stage and the second stage are connected together in cascode for the DC supply current, and are connected together in cascade for the AC RF input and output currents.

In one or more embodiments, each of the transconducting cells of the first stage and the second stage is configured to receive a supply voltage (Vdd), which is split evenly amongst the transconducting cells of the first stage and the second stage to power the transconducting cells of the first stage and the second stage. In some embodiments, a DC supply voltage drop of Vdd/N, where N is a number of the transconducting cells of the first stage and the second stage, is across each of the transconducting cells of the first stage and the second stage.

In at least one embodiment, the amplifier further comprises an input matching network (M1). In some embodiments, the amplifier further comprises an input signal source (Vin) to provide the RF input signal ($RF_{IN}$) to the input matching network (M1). In at least one embodiment, the input matching network (M1) is further configured to transform the RF input signal ($RF_{IN}$) to provide a power match to an input of each of the transconducting cells of the first stage.

In one or more embodiments, the amplifier further comprises an inner stage matching network (M2) configured to receive the AC RF output current ($I_{RF\_OUT}$), which is outputted from a last transconducting cell of the plurality transconducting cells of the first stage, to deliver power to the transconducting cells of the second stage.

In at least one embodiment, the amplifier further comprises an output matching network (M3) configured to receive the AC RF output current ($I_{RF\_OUT}$), which is outputted from a last transconducting cell of the plurality transconducting cells of the second stage, to deliver power to a load ($R_L$).

The features, functions, and advantages can be achieved independently in various embodiments of the present disclosure or may be combined in yet other embodiments.

DRAWINGS

These and other features, aspects, and advantages of the present disclosure will become better understood with regard to the following description, appended claims, and accompanying drawings where:

Figure 5A:
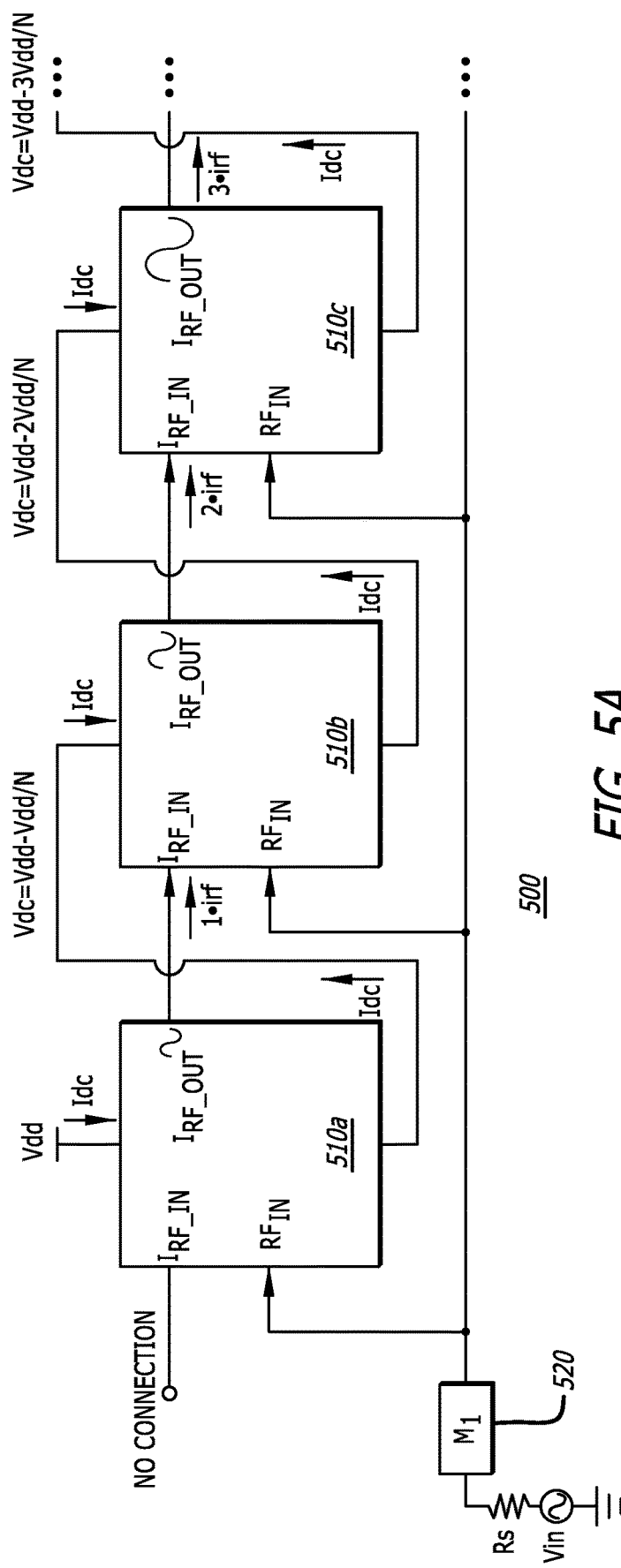
Figure 5B:
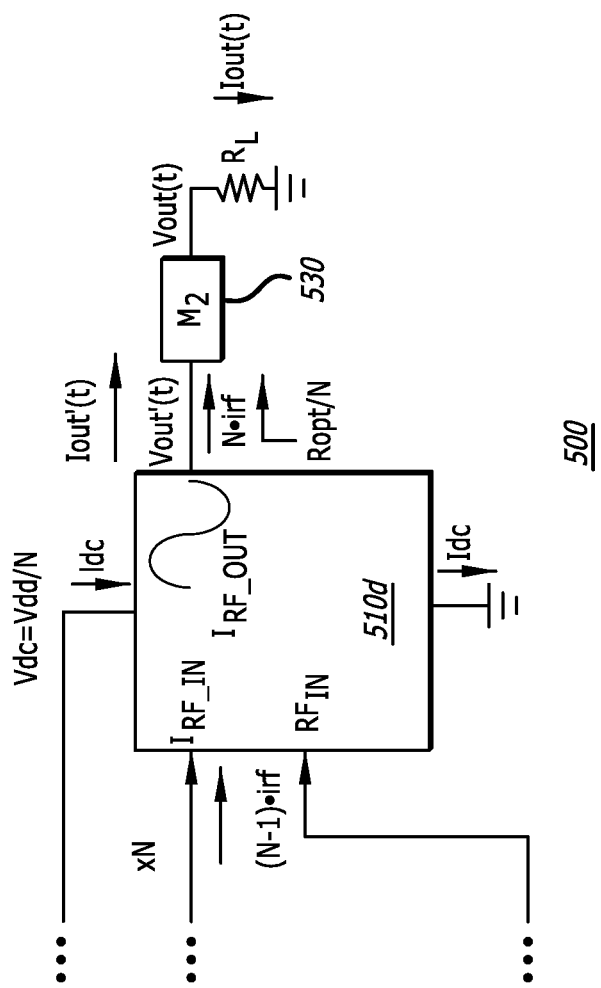

FIGS. 5A and 5B together are a schematic circuit diagram of the disclosed single-ended single-stage "current mode" amplifier, in accordance with at least one embodiment of the present disclosure.

Figure 5C:
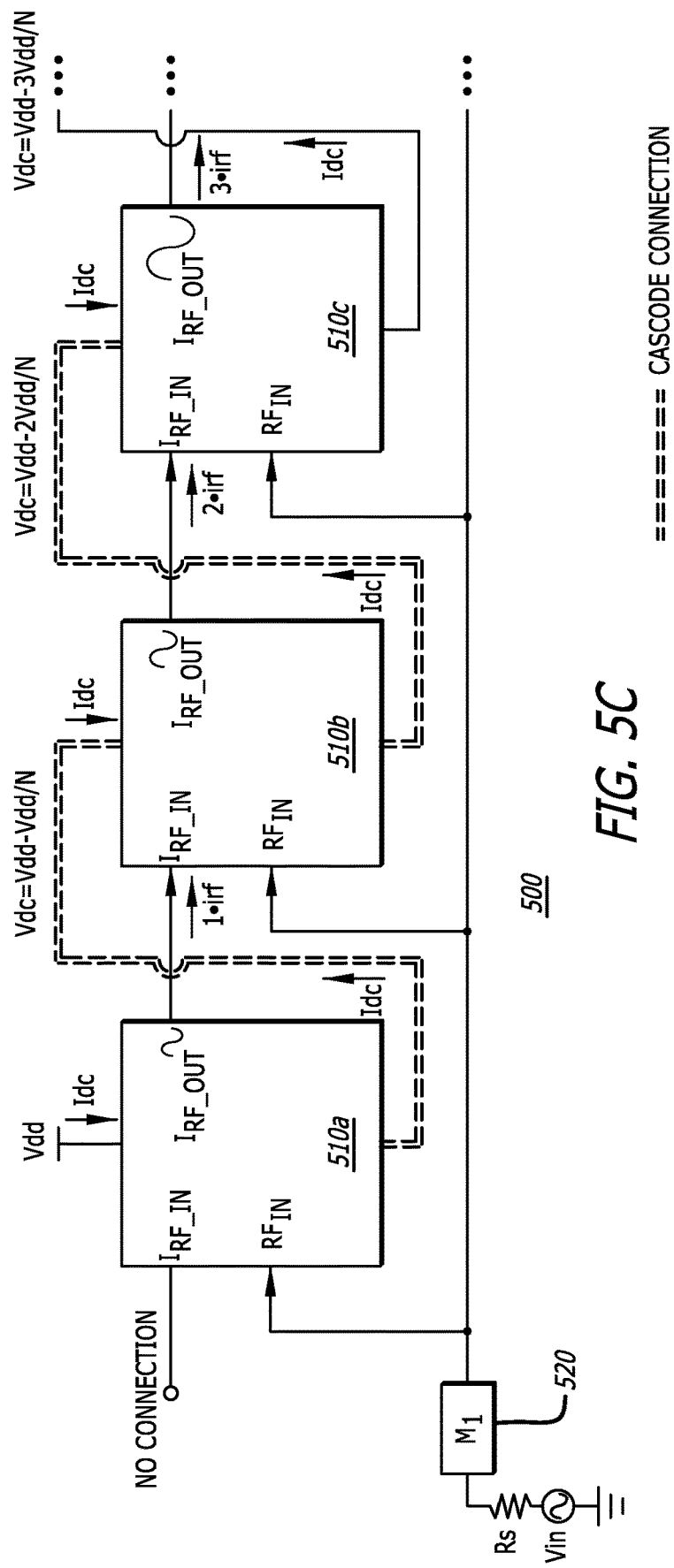

FIG. 5C is a schematic circuit diagram of the disclosed single-stage "current mode" amplifier of FIG. 5A denoting the cascade connection of the transconducting cells for the DC supply current, in accordance with at least one embodiment of the present disclosure.

Figure 5D:
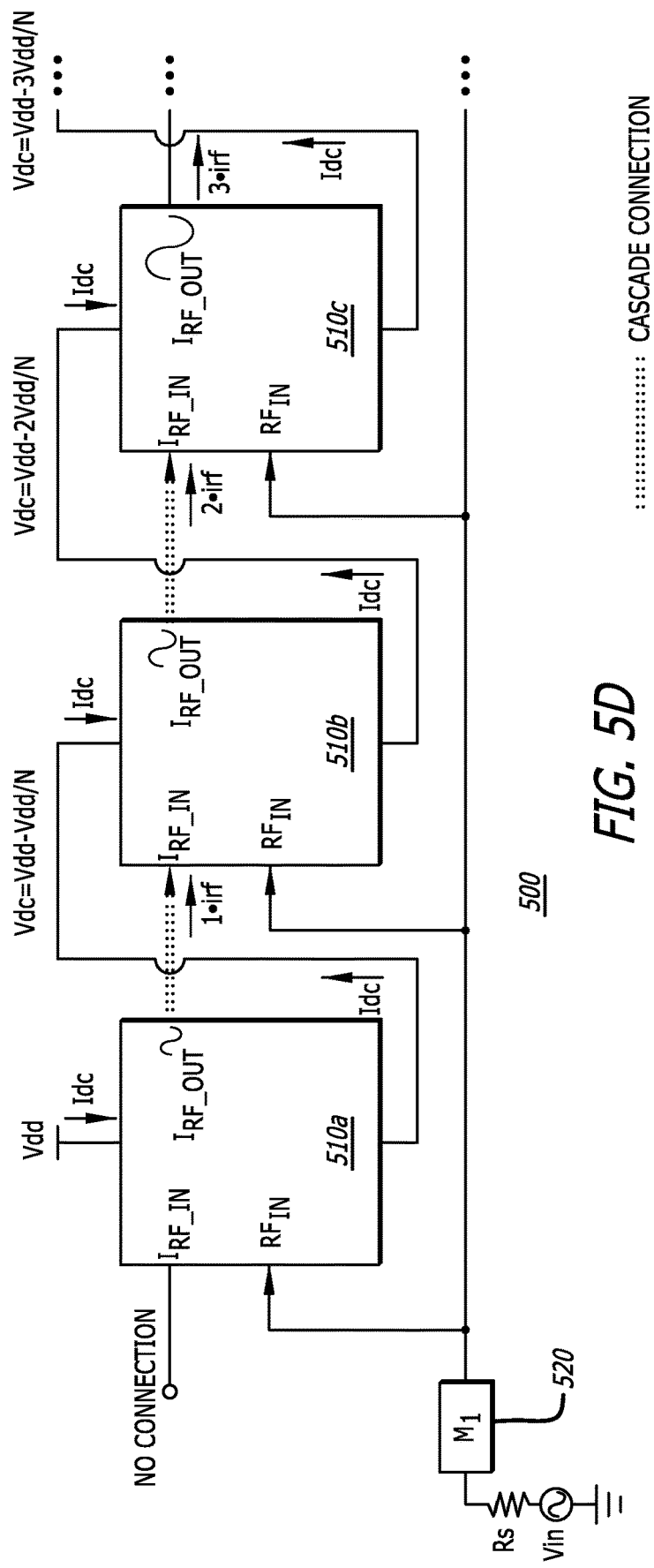

FIG. 5D is a schematic circuit diagram of the disclosed single-stage "current mode" amplifier of FIG. 5A denoting the cascade connection of the transconducting cells for the AC RF input and output currents, in accordance with at least one embodiment of the present disclosure.

Figure 5E:
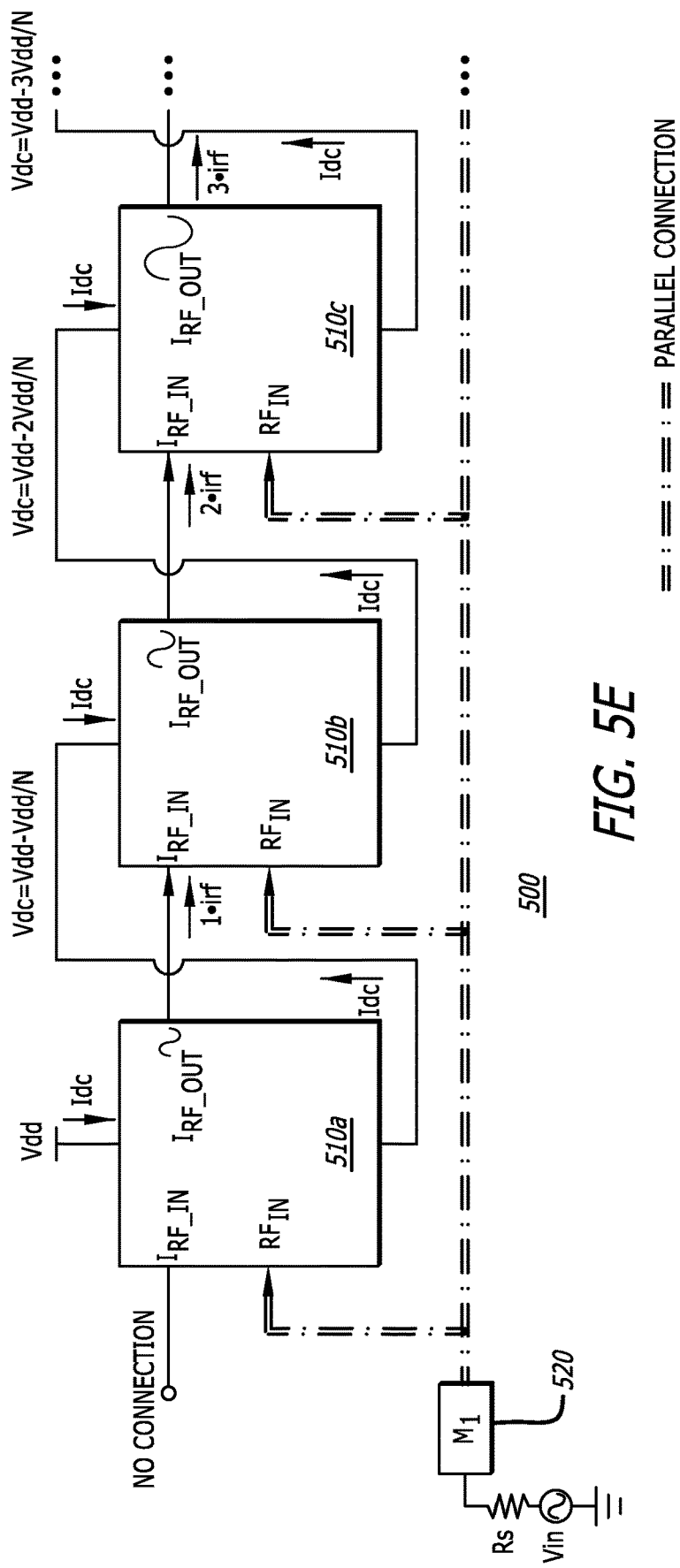

FIG. 5E is a schematic circuit diagram of the disclosed single-stage "current mode" amplifier of FIG. 5A showing the input matching network (M1) driving each transconducting cell's RF input signal ($RF_{IN}$) in parallel, in accordance with at least one embodiment of the present disclosure.

Figure 5F:
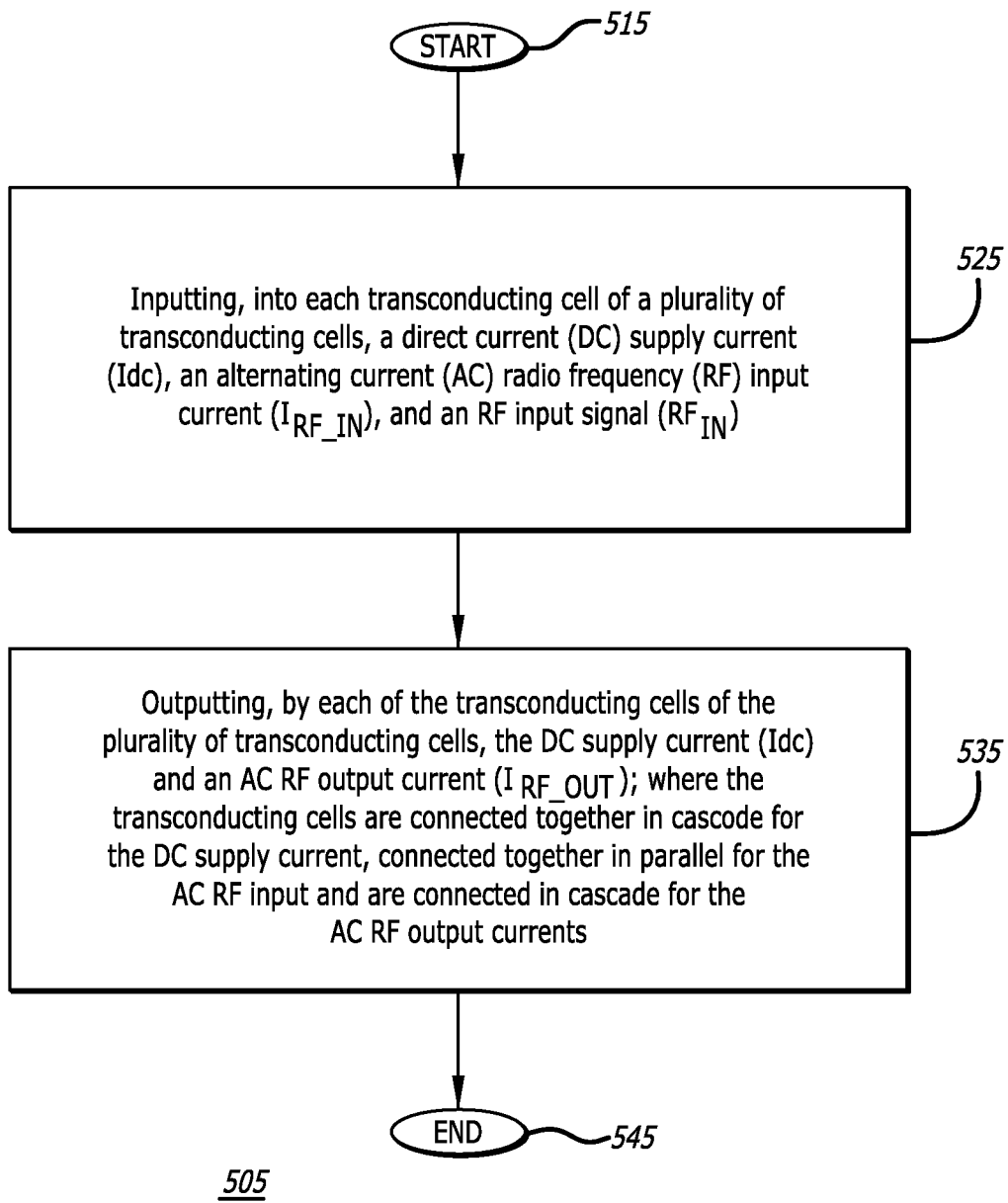

FIG. 5F is a flow chart showing the disclosed method for operation of the disclosed single-ended single-stage "current mode" amplifier, in accordance with at least one embodiment of the present disclosure.

Figure 6A:
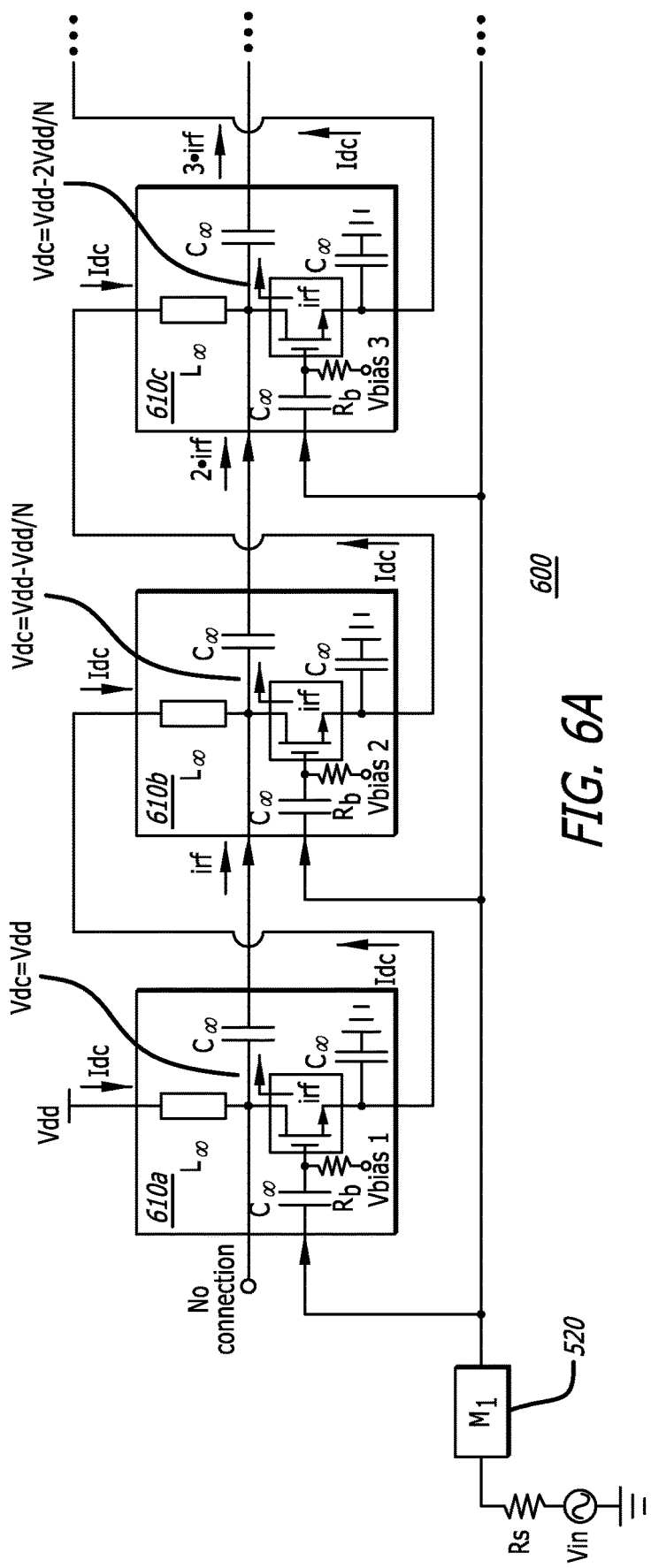
Figure 6B:
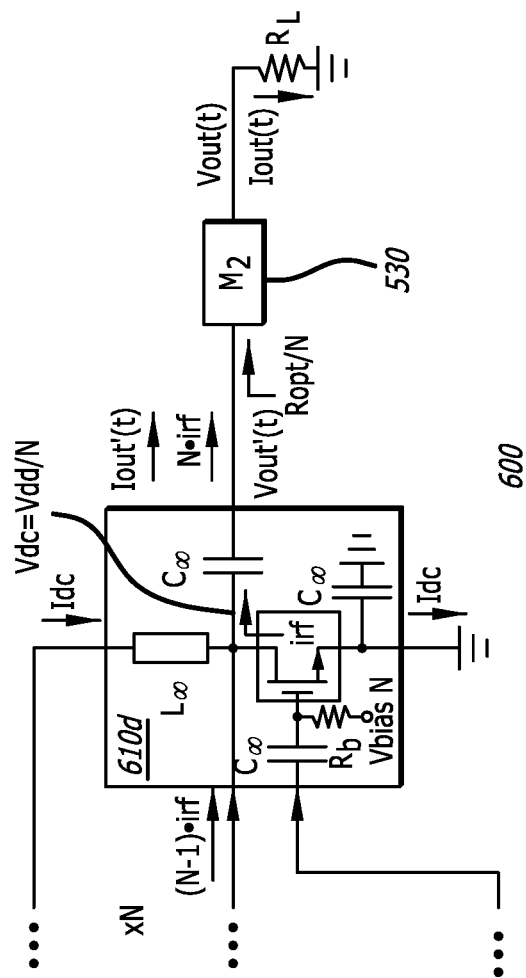

FIGS. 6A and 6B together are a schematic circuit diagram of the disclosed single-ended single-stage "current mode" amplifier, with transconductance cells implemented as common-source cells with RF unit element devices as metal-oxide-semiconductor field-effect transistor (MOSFET), and in particular, an n-channel MOSFET (NMOS), in accordance with at least one embodiment of the present disclosure.

Figure 7A:
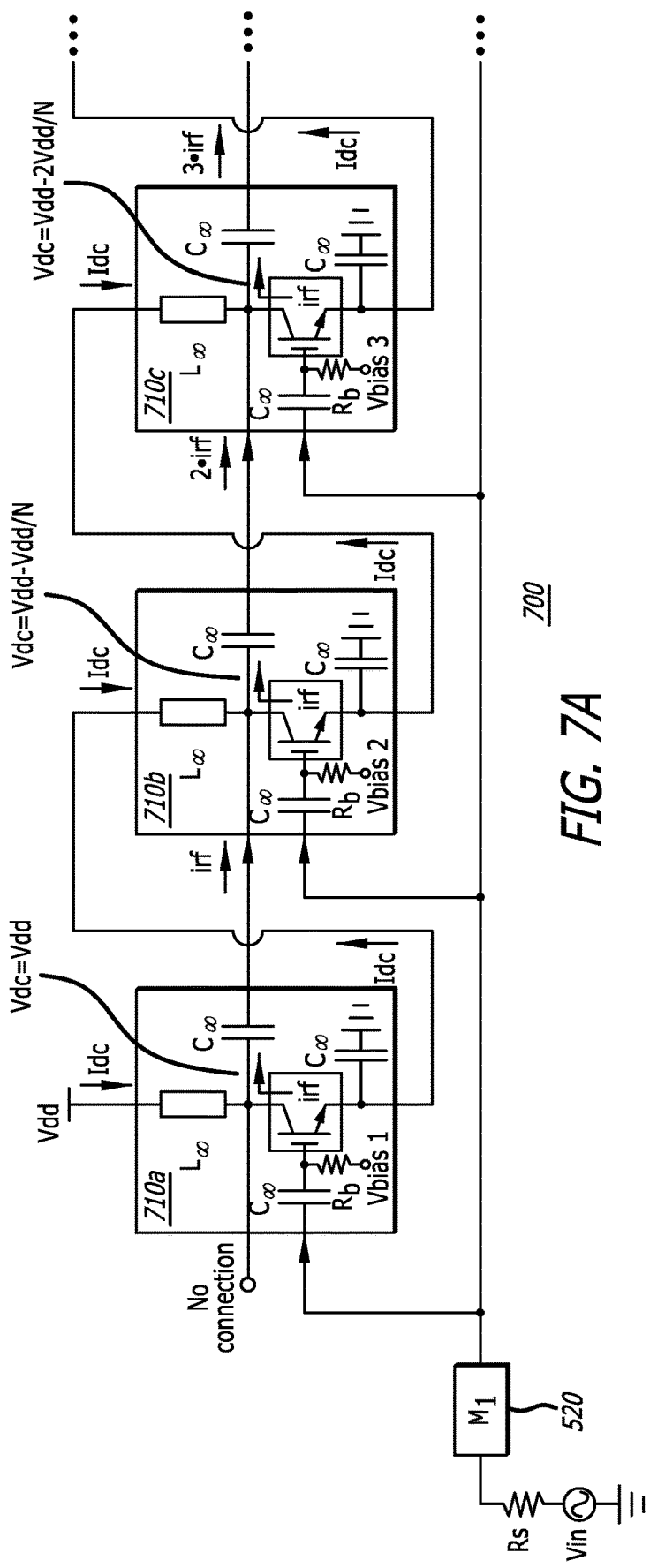
Figure 7B:
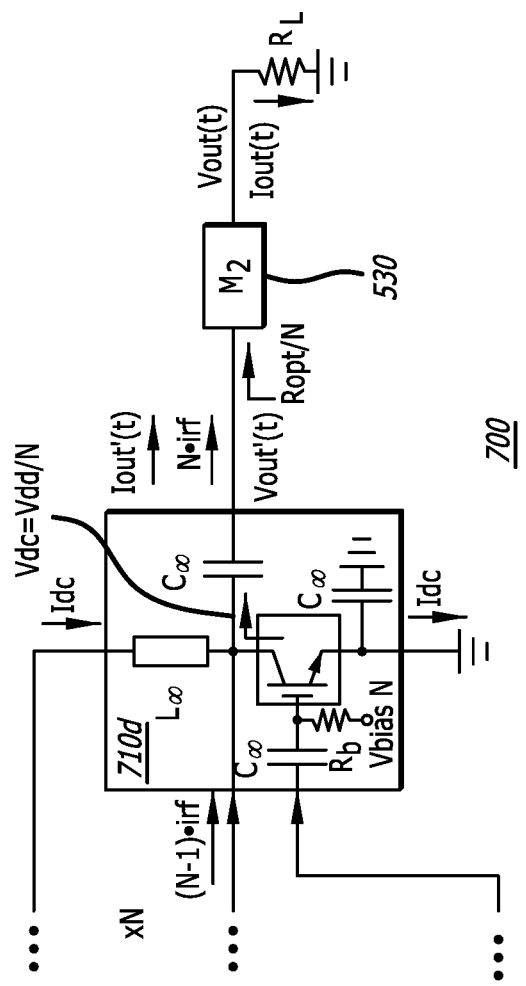

FIGS. 7A and 7B together are a schematic circuit diagram of the disclosed single-ended single-stage "current mode" amplifier, with transconductance cells implemented as common-emitter cells with RF unit element devices as a BJT, in accordance with at least one embodiment of the present disclosure.

Figure 8:
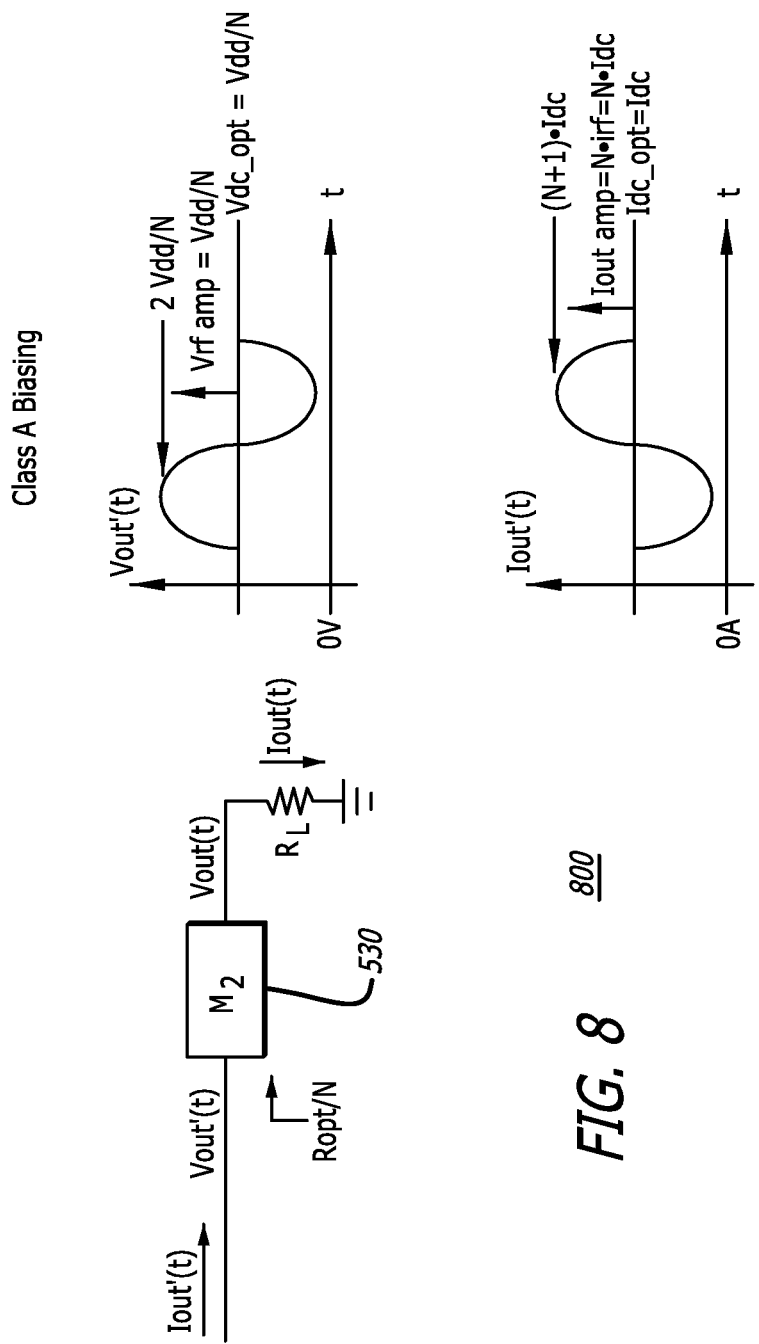

FIG. 8 is an illustration of class A biasing of the "current mode" amplifier of FIGS. 5A and 5B, 6A and 6B, and 7A and 7B, in accordance with at least one embodiment of the present disclosure.

Figure 9A:
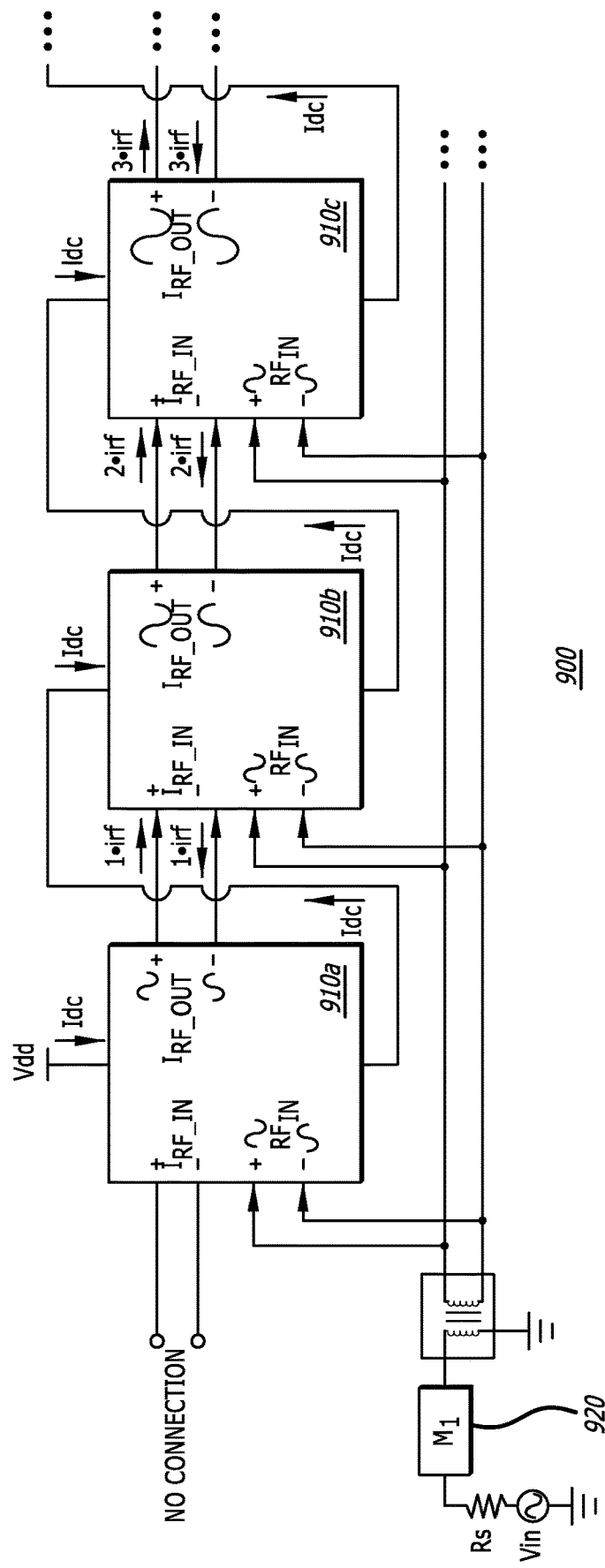
Figure 9B:
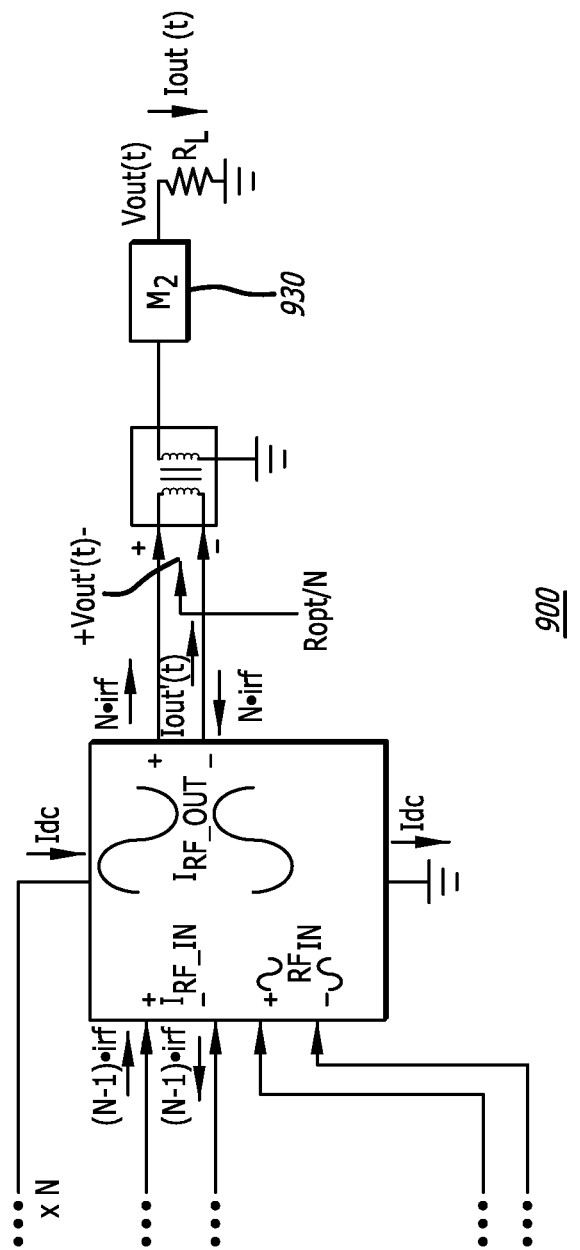

FIGS. 9A and 9B together are a schematic circuit diagram of the disclosed differential single-stage "current mode" amplifier, in accordance with at least one embodiment of the present disclosure.

Figure 10A:
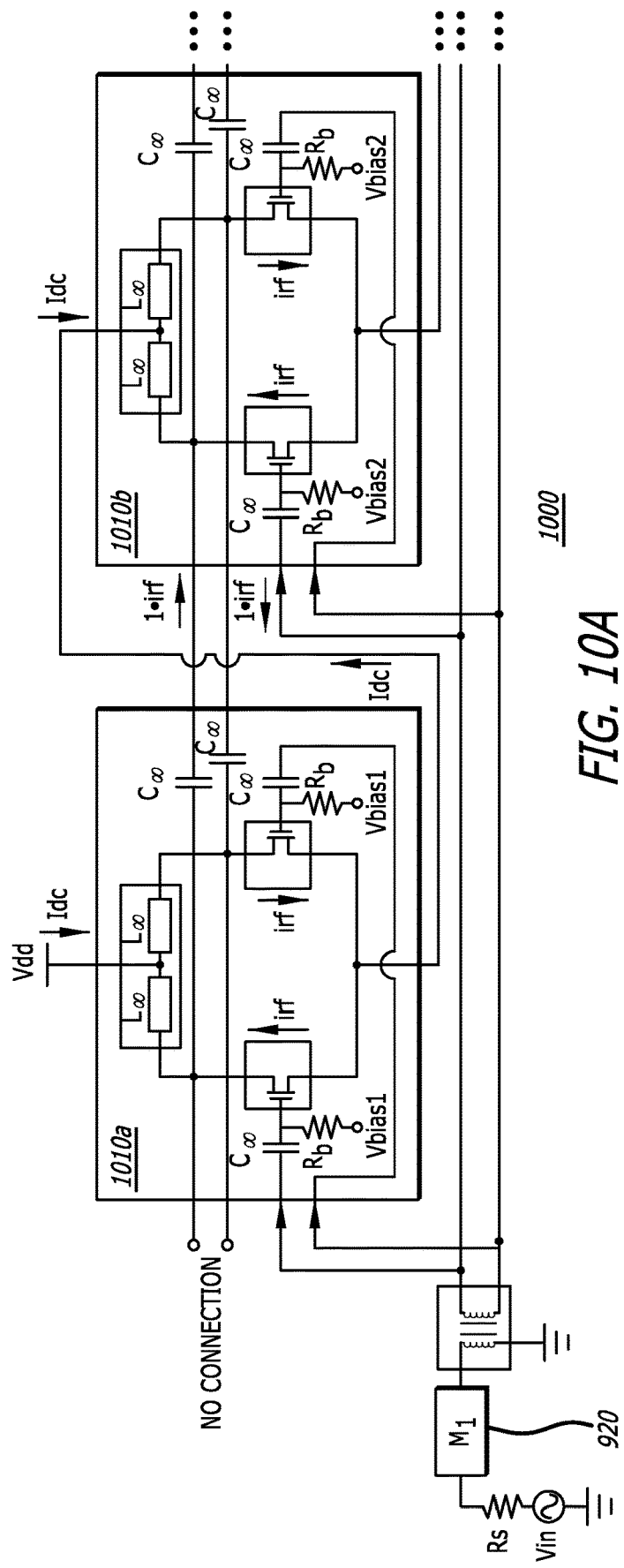
Figure 10B:
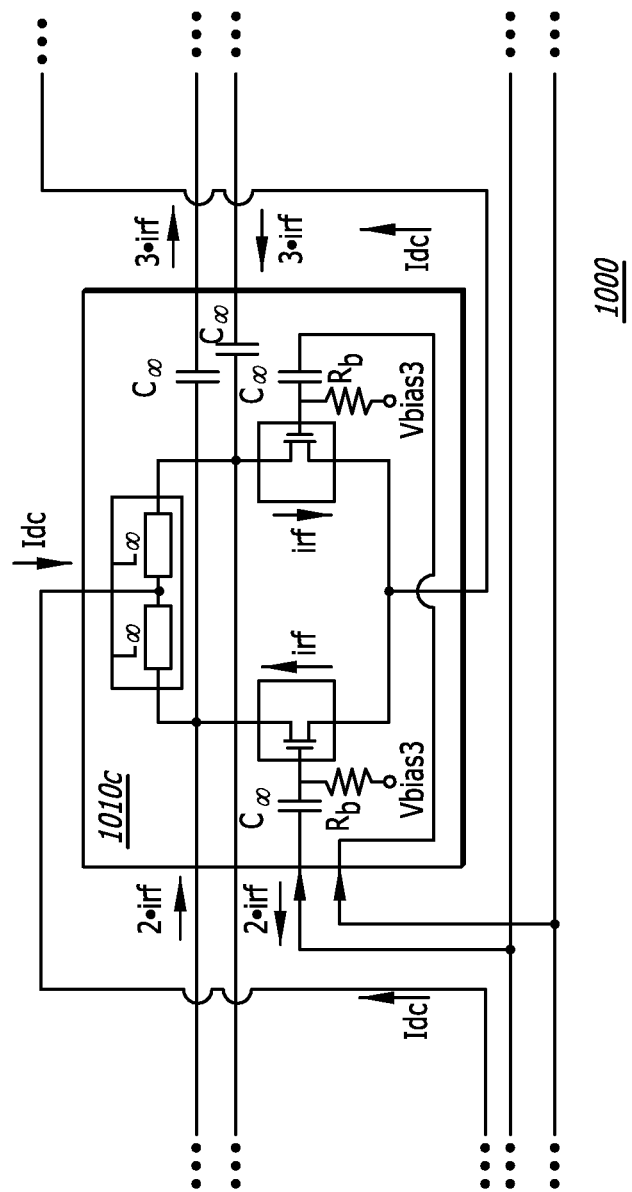
Figure 10C:
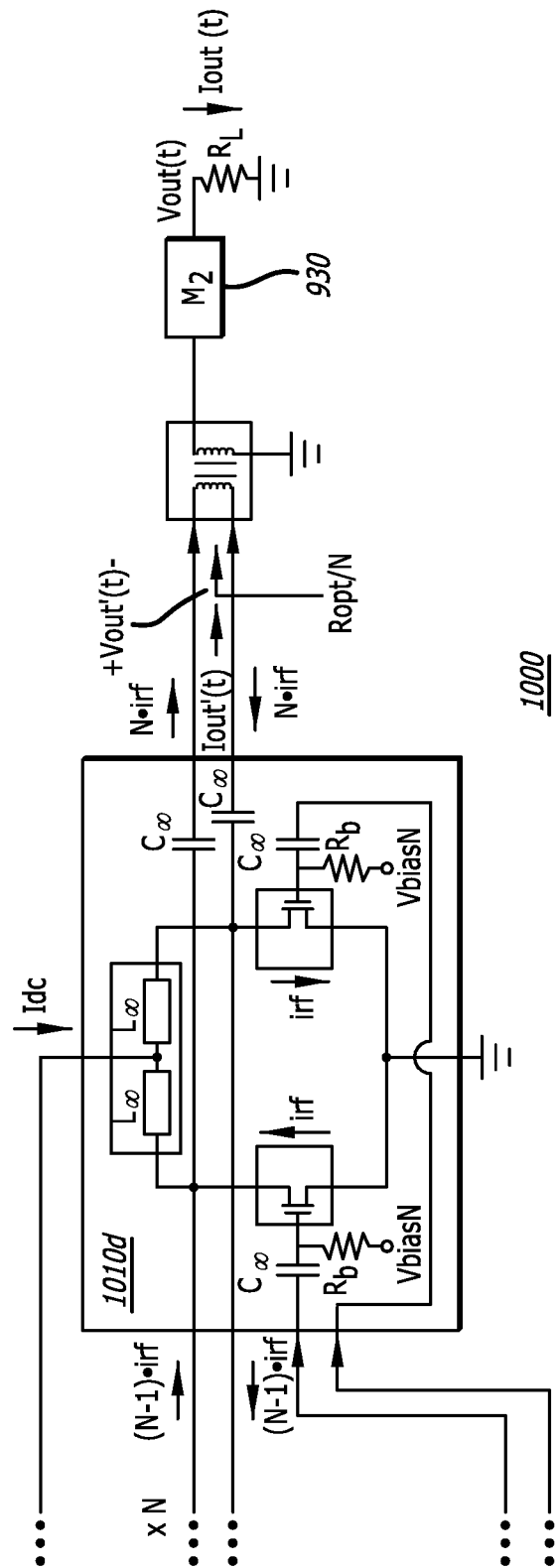

FIGS. 10A, 10B, and 10C together are a schematic circuit diagram of the disclosed differential single-stage "current mode" amplifier, with transconductance cells implemented as common-source cells with RF unit element devices each as a MOSFET, and in particular, an NMOS, in accordance with at least one embodiment of the present disclosure.

Figure 11A:
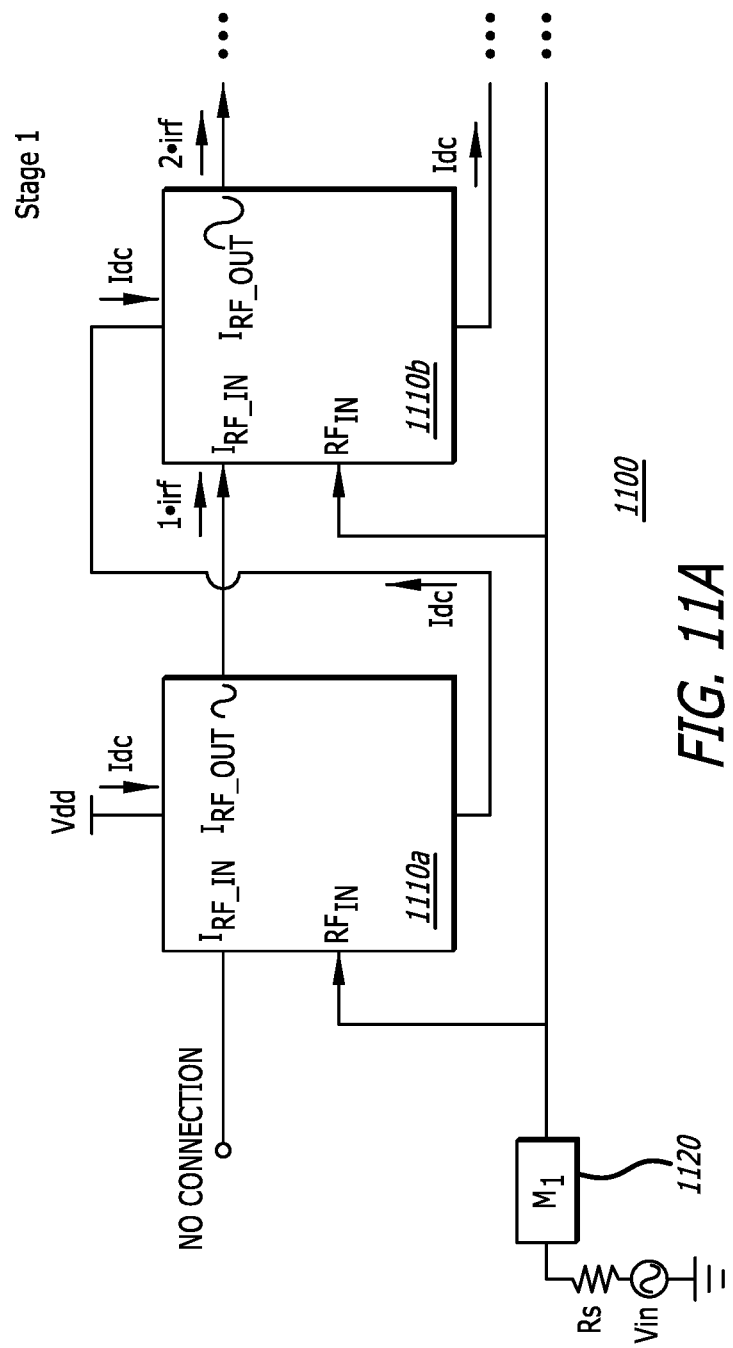
Figure 11B:
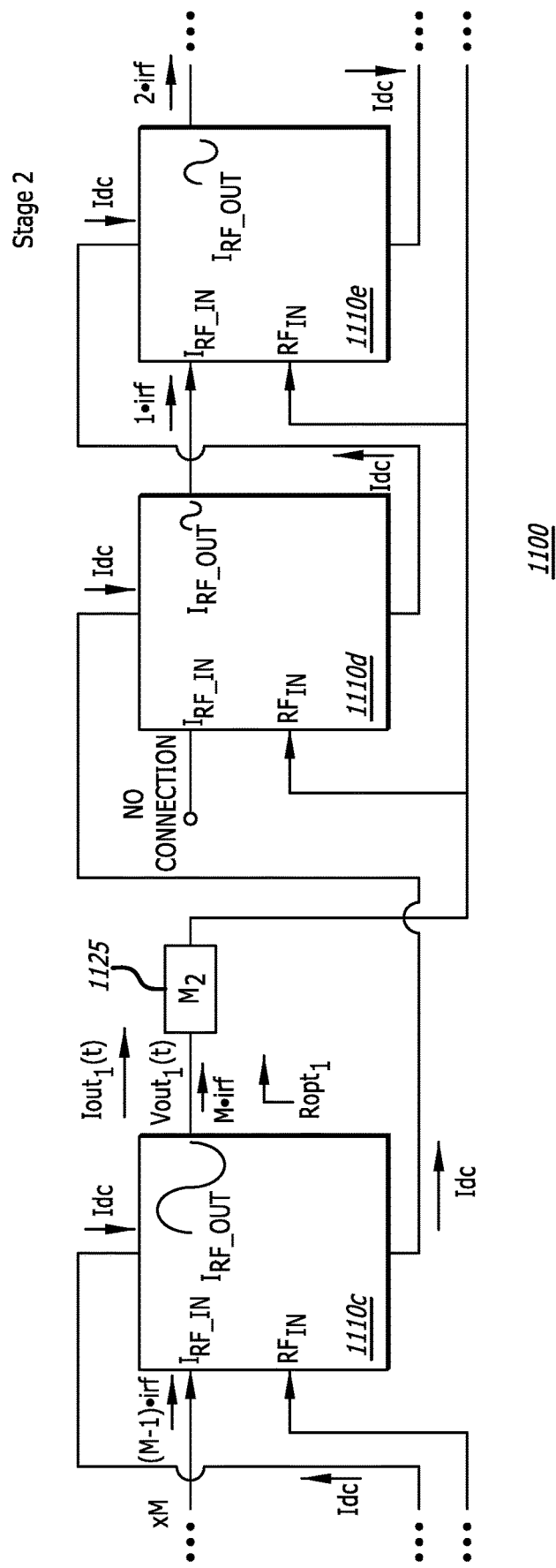
Figure 11C:
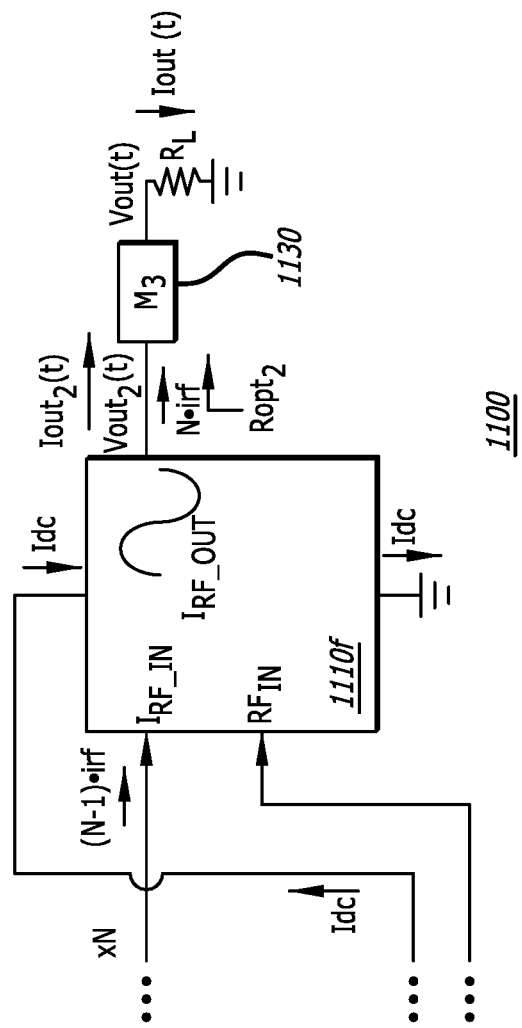

FIGS. 11A, 11B, and 11C together are a schematic circuit diagram of the disclosed multi-stage "current mode" amplifier with M number of first stage transconducting cells and N number of second stage transconducting cells, where the power supply voltage (Vdd) is applied to the first transconducting cell, in accordance with at least one embodiment of the present disclosure.

Figure 12A:
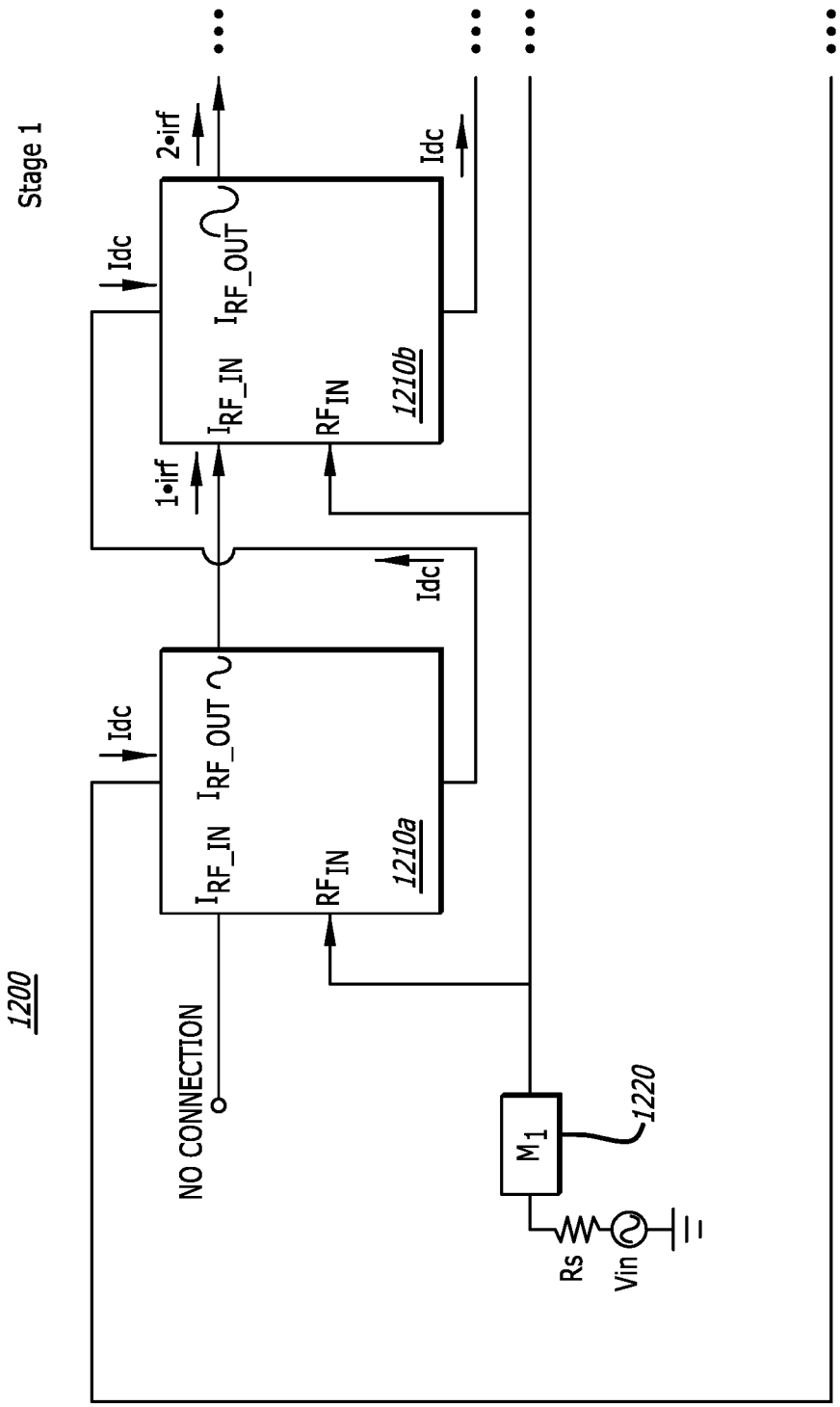
Figure 12B:
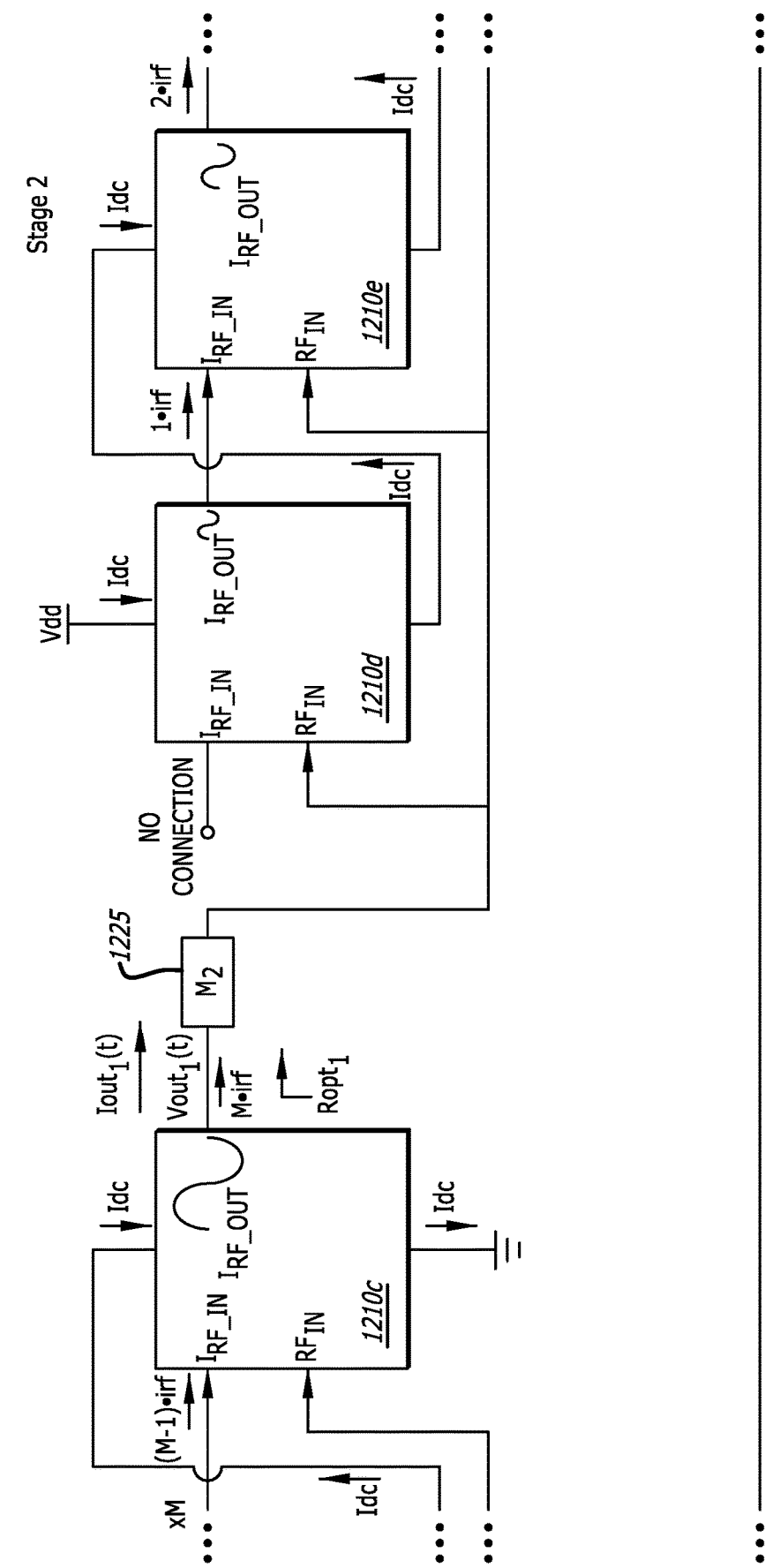
Figure 12C:
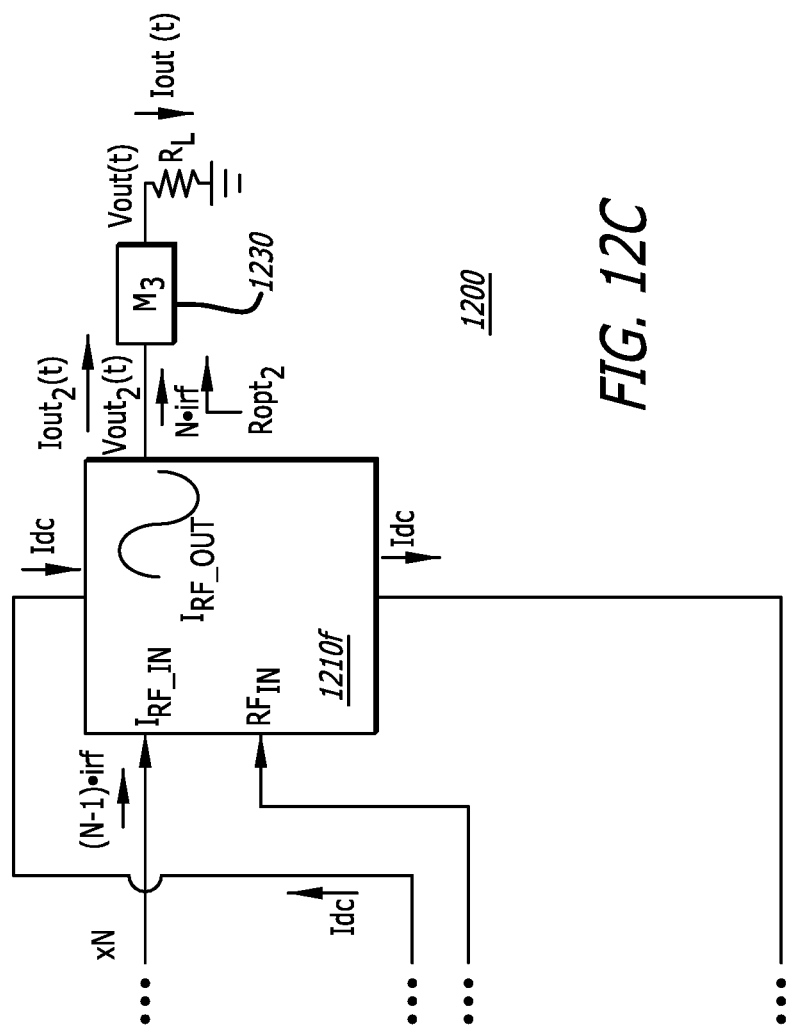

FIGS. 12A, 12B, and 12C together are a schematic circuit diagram of the disclosed multi-stage "current mode" amplifier with M number of first stage transconducting cells and N number of second stage transconducting cells, where the power supply voltage (Vdd) is applied to a transconducting cell other than the first transconducting cell, in accordance with at least one embodiment of the present disclosure.

FIGS. 13 to 16C are schematic circuit diagrams of the disclosed single-ended single-stage "current mode" amplifiers, in accordance with various embodiments of the present disclosure.

Figure 13:
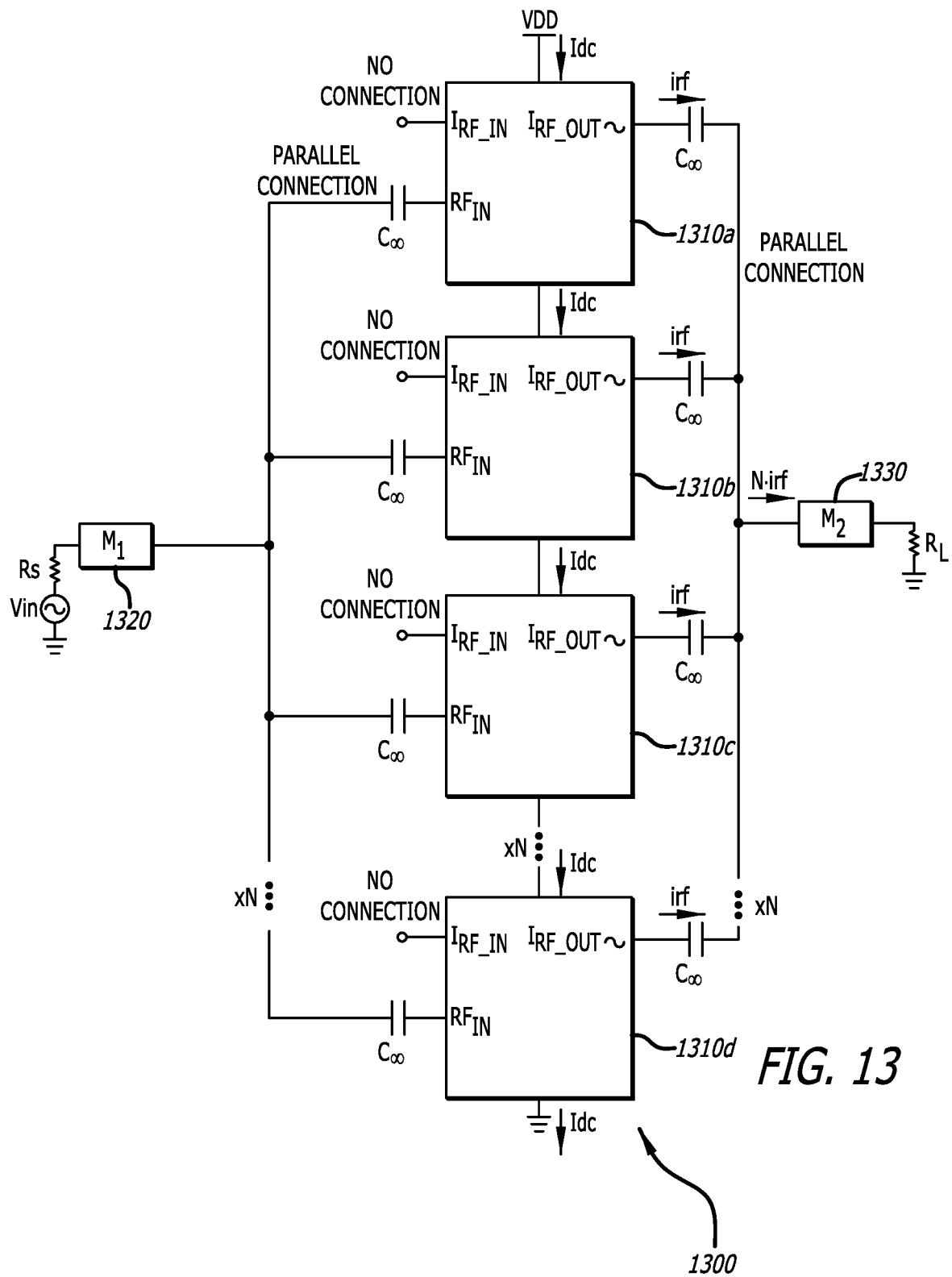

FIG. 13 is a schematic circuit diagram of the disclosed single-ended single-stage "current mode" amplifier, where the transconducting cells are connected together in parallel for the radio frequency (RF) input signal ($RF_{IN}$) and are connected together in parallel for the alternating current (AC) RF output currents ($I_{RF\_OUT}$), in accordance with at least one embodiment of the present disclosure.

FIGS. 14A to 14E are schematic circuit diagrams of the disclosed single-ended single-stage "current mode" amplifiers, where the transconducting cells are connected together in parallel for the RF input signal ($RF_{IN}$) and are connected together in cascade for the AC RF output currents ($I_{RF\_OUT}$), in accordance with various embodiments of the present disclosure.

Figure 14A:
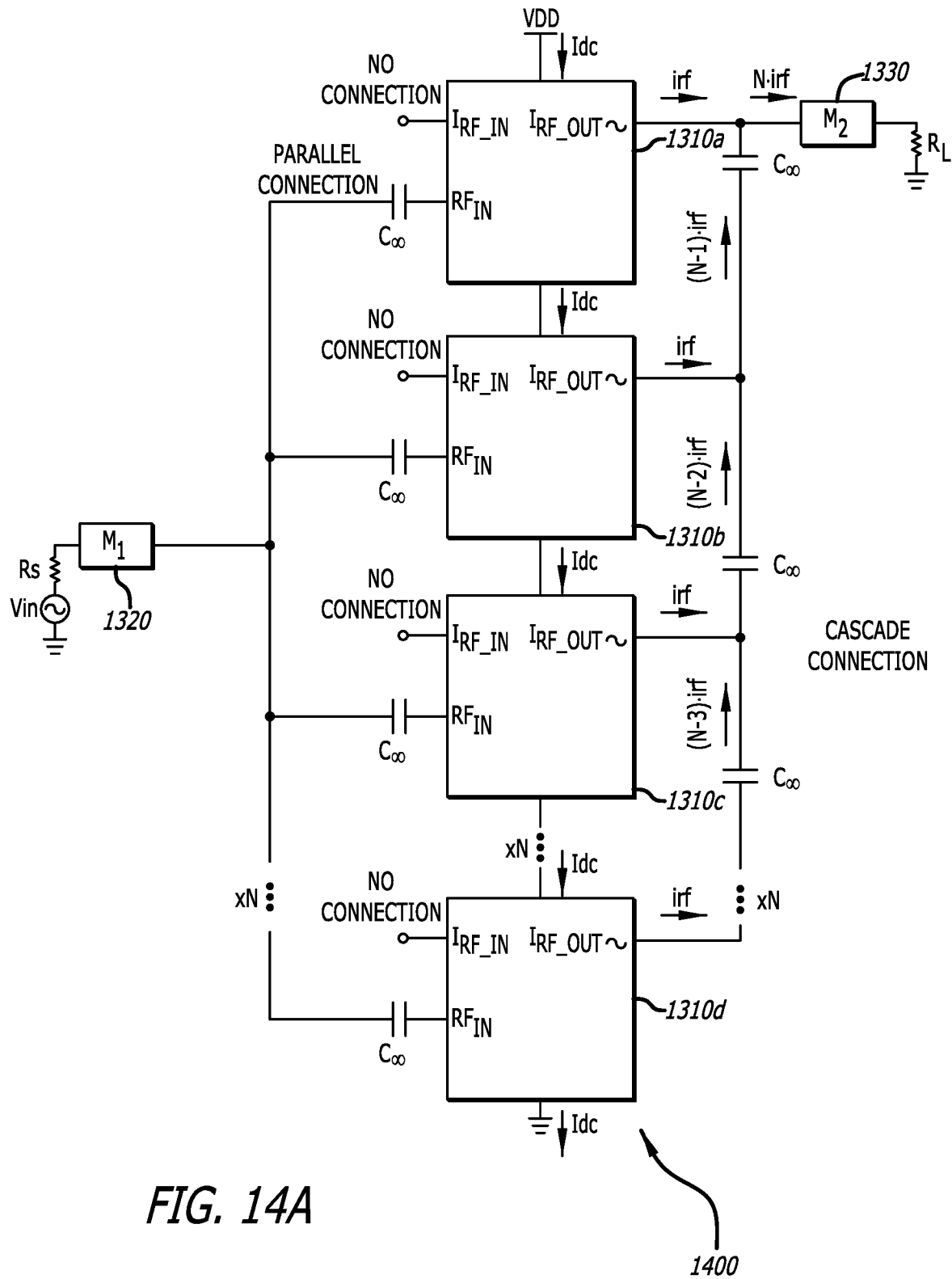

FIG. 14A is a schematic circuit diagram of the disclosed single-ended single-stage "current mode" amplifier, where the transconducting cells are connected together in parallel for the RF input signal ($RF_{IN}$) and are connected together in cascade for the AC RF output currents ($I_{RF\_OUT}$), and where the output matching network (M2) is connected to an output junction of a first transconducting cell 1310a, in accordance with at least one embodiment of the present disclosure.

Figure 14B:
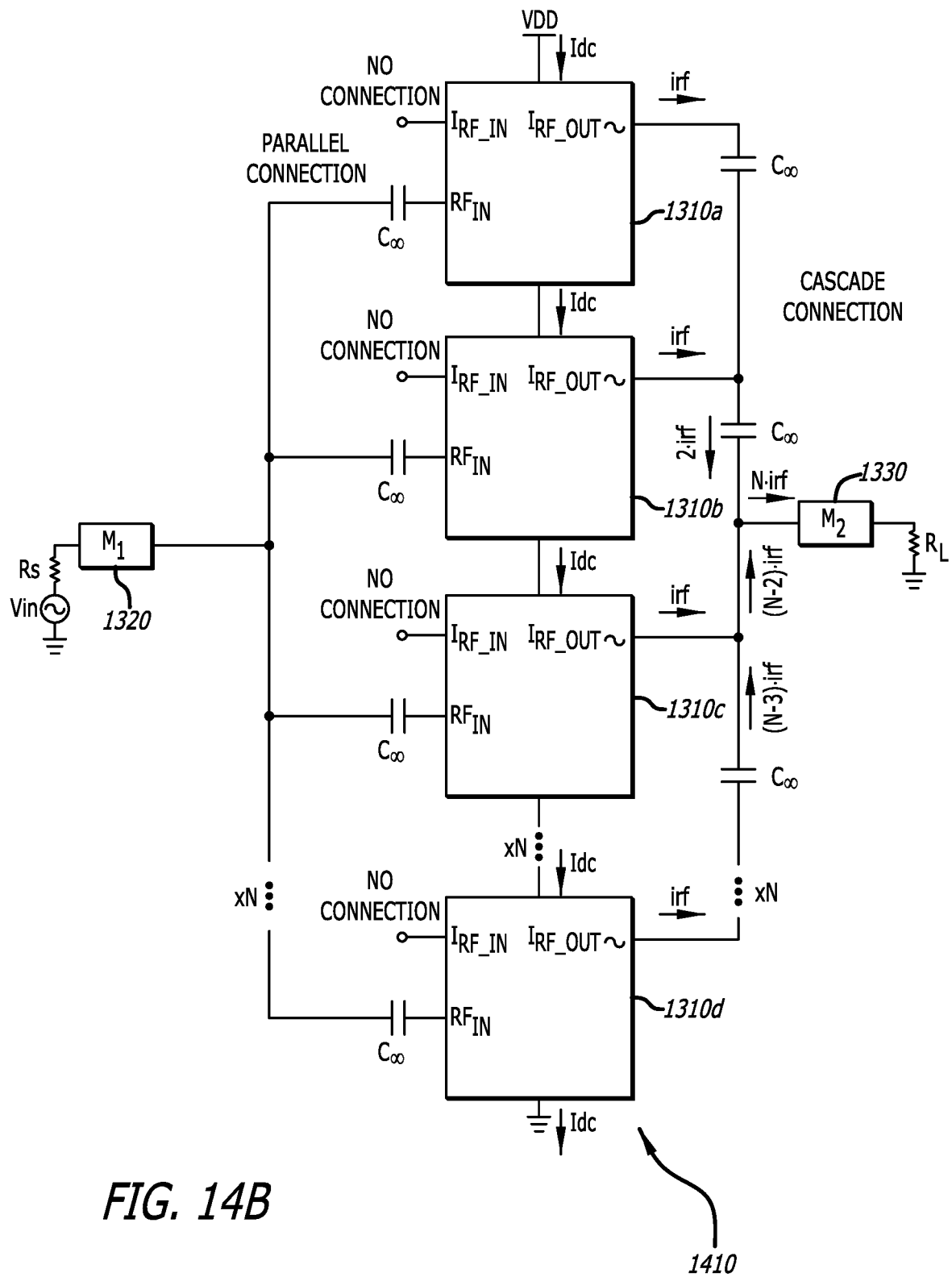

FIG. 14B is a schematic circuit diagram of the disclosed single-ended single-stage "current mode" amplifier, where the transconducting cells are connected together in parallel for the RF input signal ($RF_{IN}$) and are connected together in cascade for the AC RF output currents ($I_{RF\_OUT}$), and where the output matching network (M2) is connected to an output junction of a second transconducting cell 1310b, in accordance with at least one embodiment of the present disclosure.

Figure 14C:
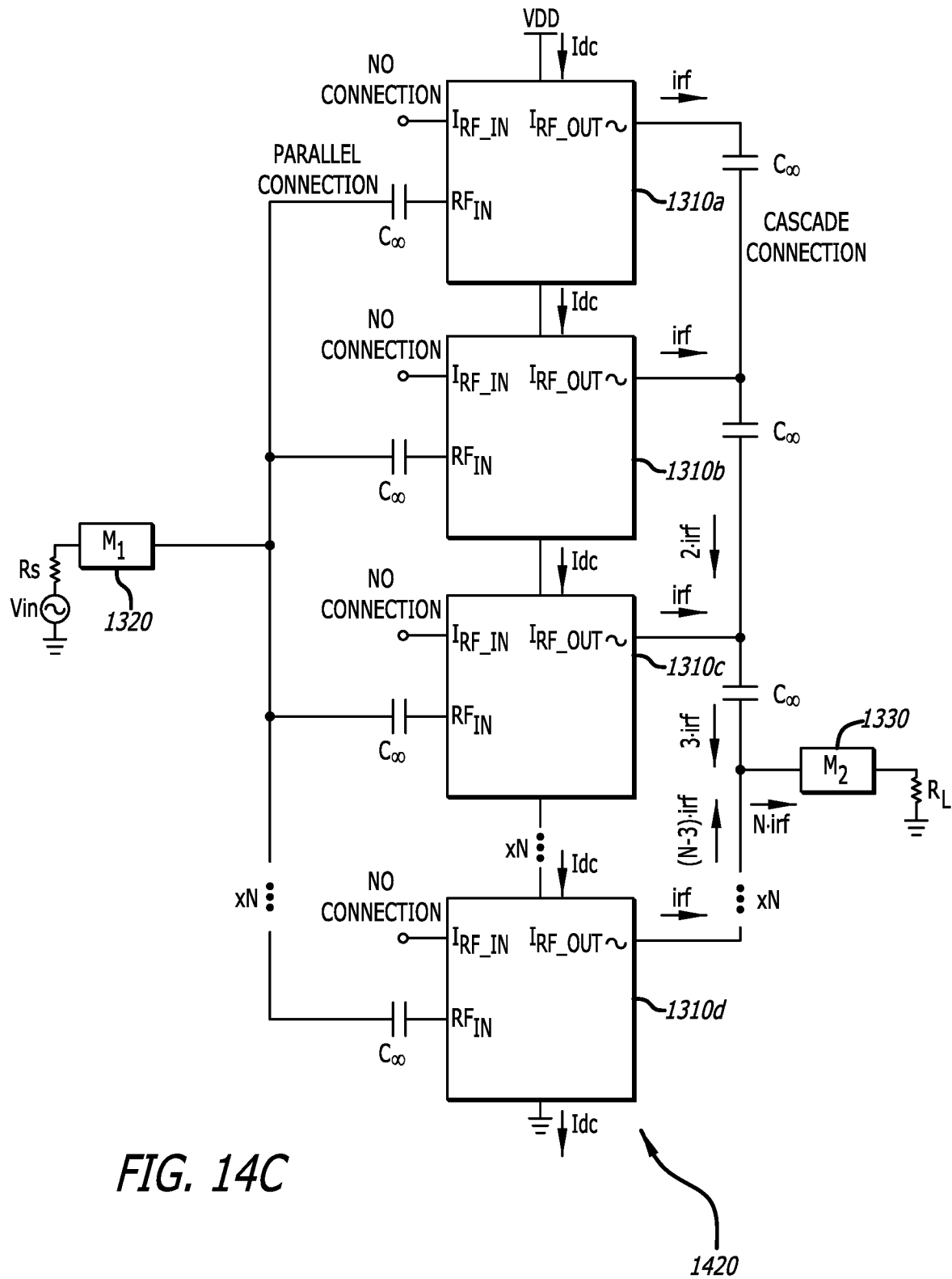

FIG. 14C is a schematic circuit diagram of the disclosed single-ended single-stage "current mode" amplifier, where the transconducting cells are connected together in parallel for the RF input signal ($RF_{IN}$) and are connected together in cascade for the AC RF output currents ($I_{RF\_OUT}$), and where the output matching network (M2) is connected to an output junction of a third transconducting cell 1310c, in accordance with at least one embodiment of the present disclosure.

Figure 14D:
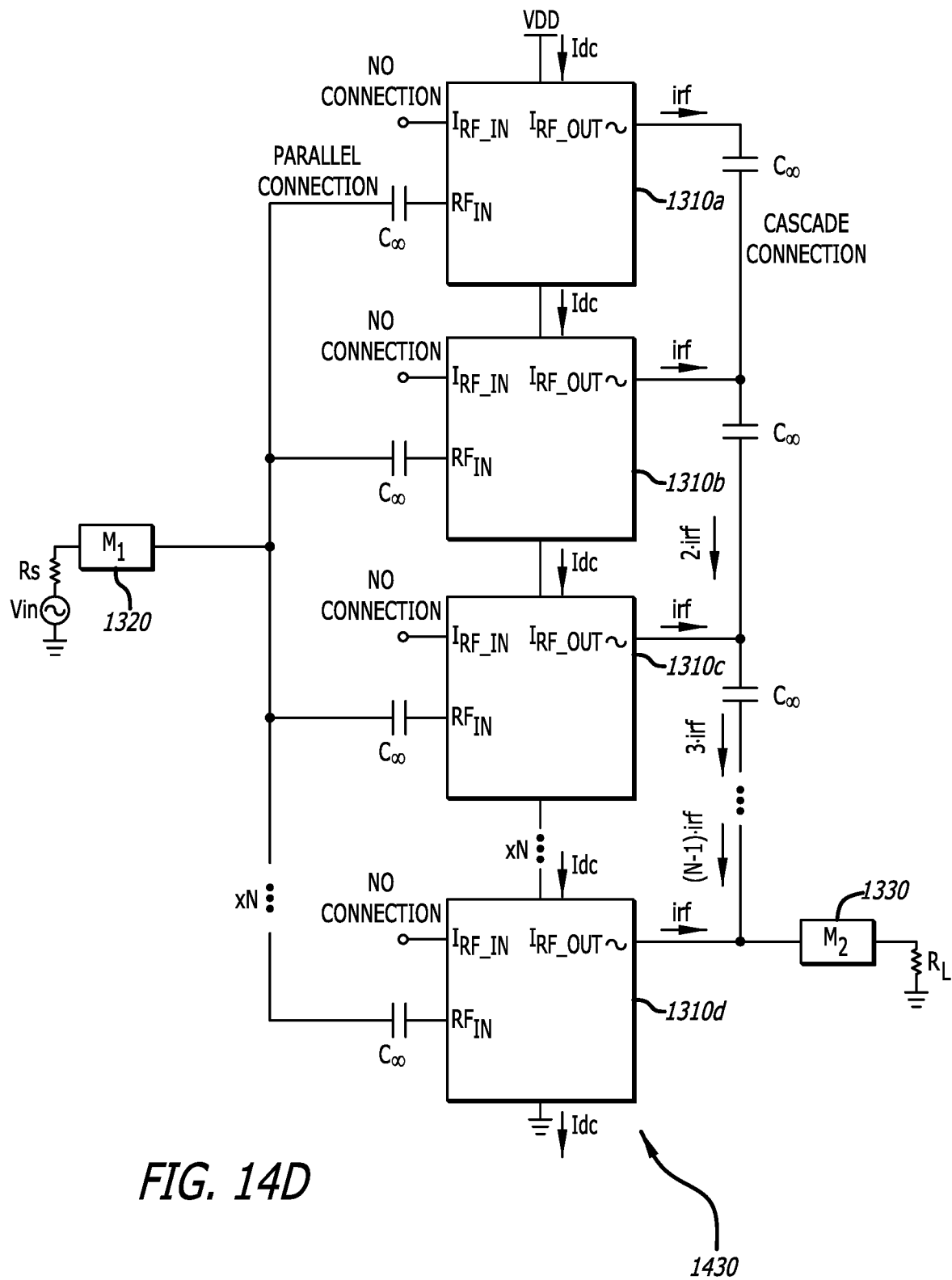

FIG. 14D is a schematic circuit diagram of the disclosed single-ended single-stage "current mode" amplifier, where the transconducting cells are connected together in parallel for the RF input signal ($RF_{IN}$) and are connected together in cascade for the AC RF output currents ($I_{RF\_OUT}$), and where the output matching network (M2) is connected to an output junction of a last transconducting cell 1310d, in accordance with at least one embodiment of the present disclosure.

Figure 14E:
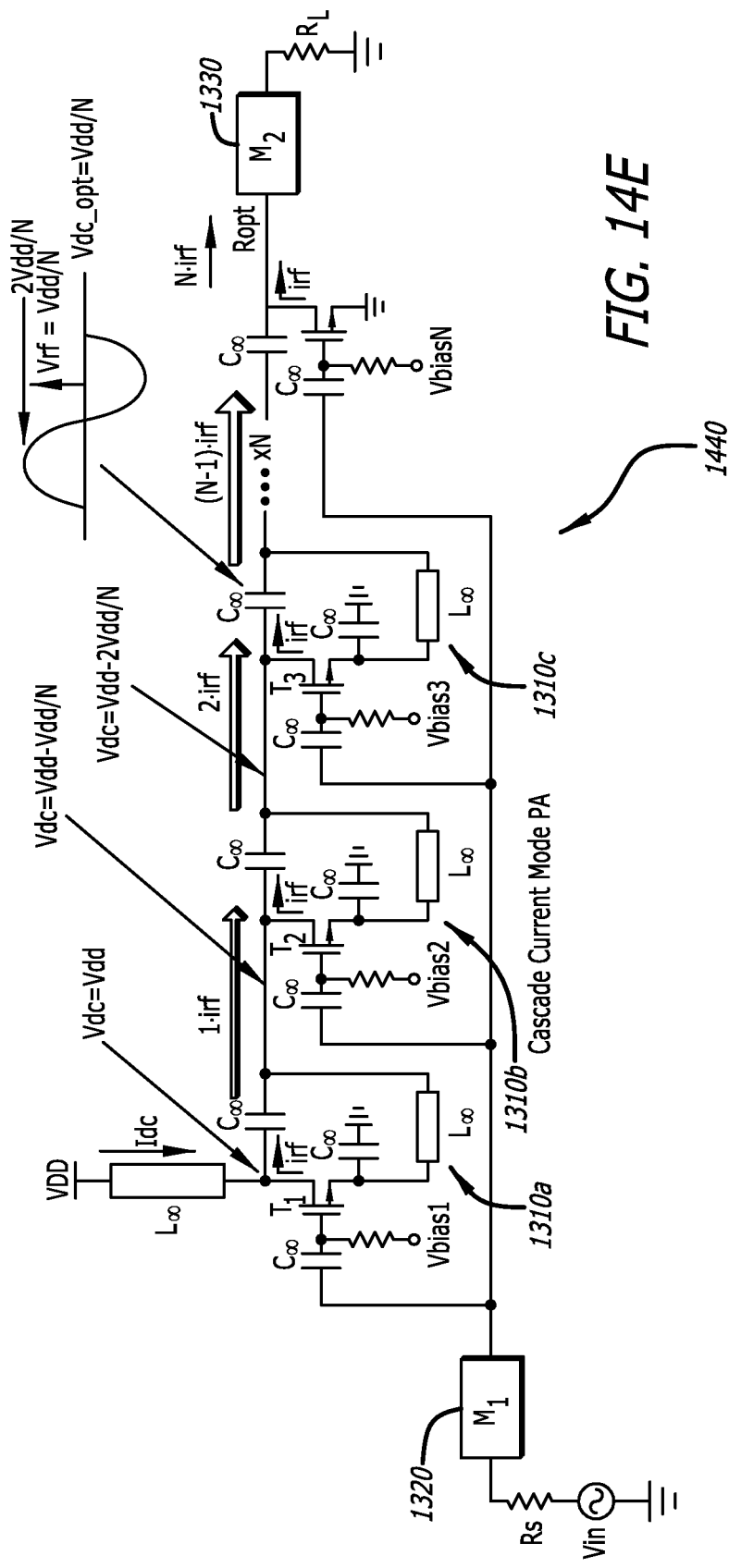

FIG. 14E is an exemplary detailed circuit diagram of the amplifier shown in FIG. 14D, in accordance with at least one embodiment of the present disclosure.

FIGS. 15A to 15D are schematic circuit diagrams of the disclosed single-ended single-stage "current mode" amplifiers, where the transconducting cells are connected together in cascade for the RF input signal ($RF_{IN}$) and are connected together in parallel for the AC RF output currents ($I_{RF\_OUT}$), in accordance with various embodiments of the present disclosure.

Figure 15A:
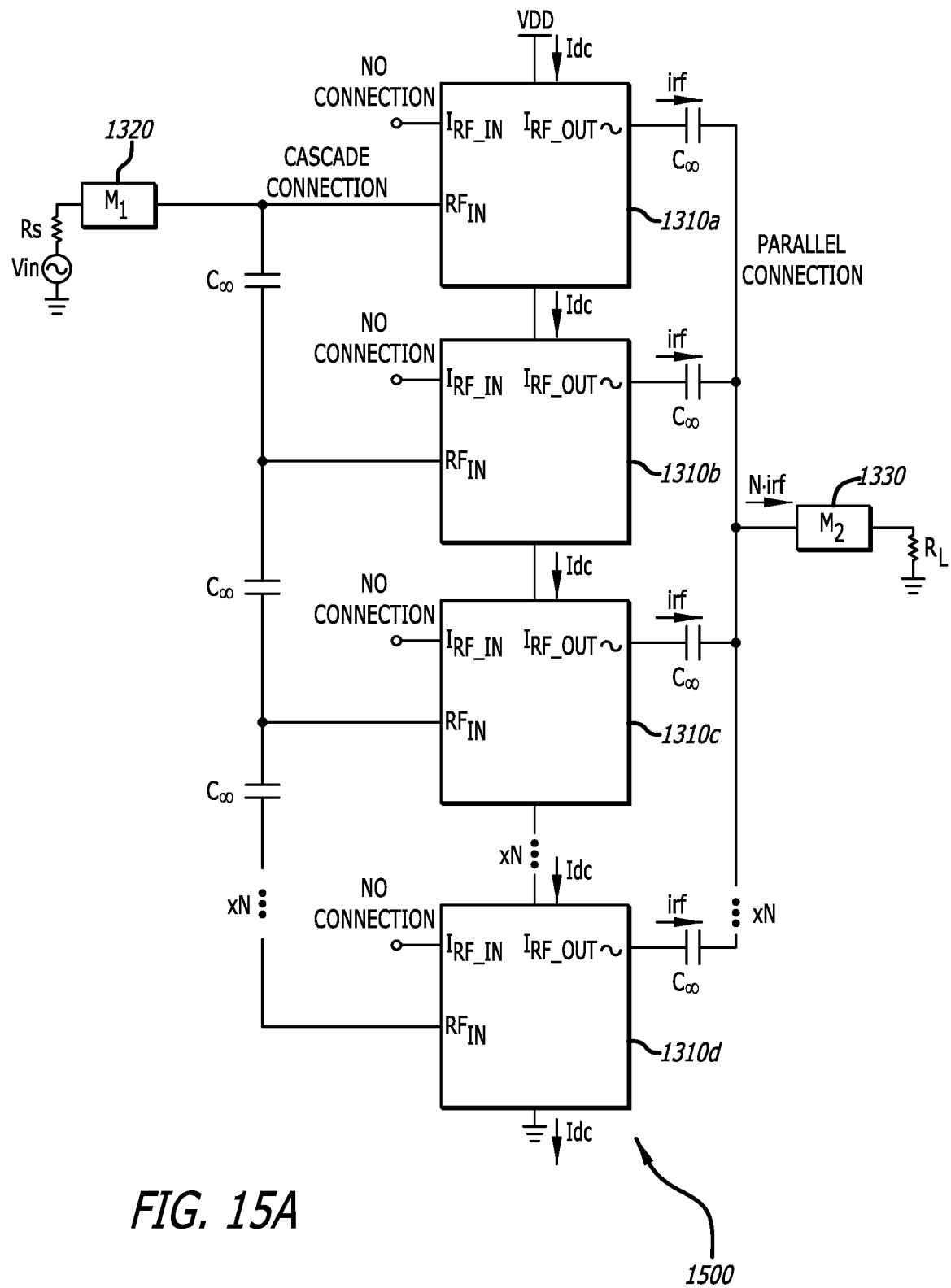

FIG. 15A is a schematic circuit diagram of the disclosed single-ended single-stage "current mode" amplifier, where the transconducting cells are connected together in cascade for the RF input signal ($RF_{IN}$) and are connected together in parallel for the AC RF output currents ($I_{RF\_OUT}$), and where the input matching network (M1) is connected to an input junction of a first transconducting cell 1310a, in accordance with at least one embodiment of the present disclosure.

Figure 15B:
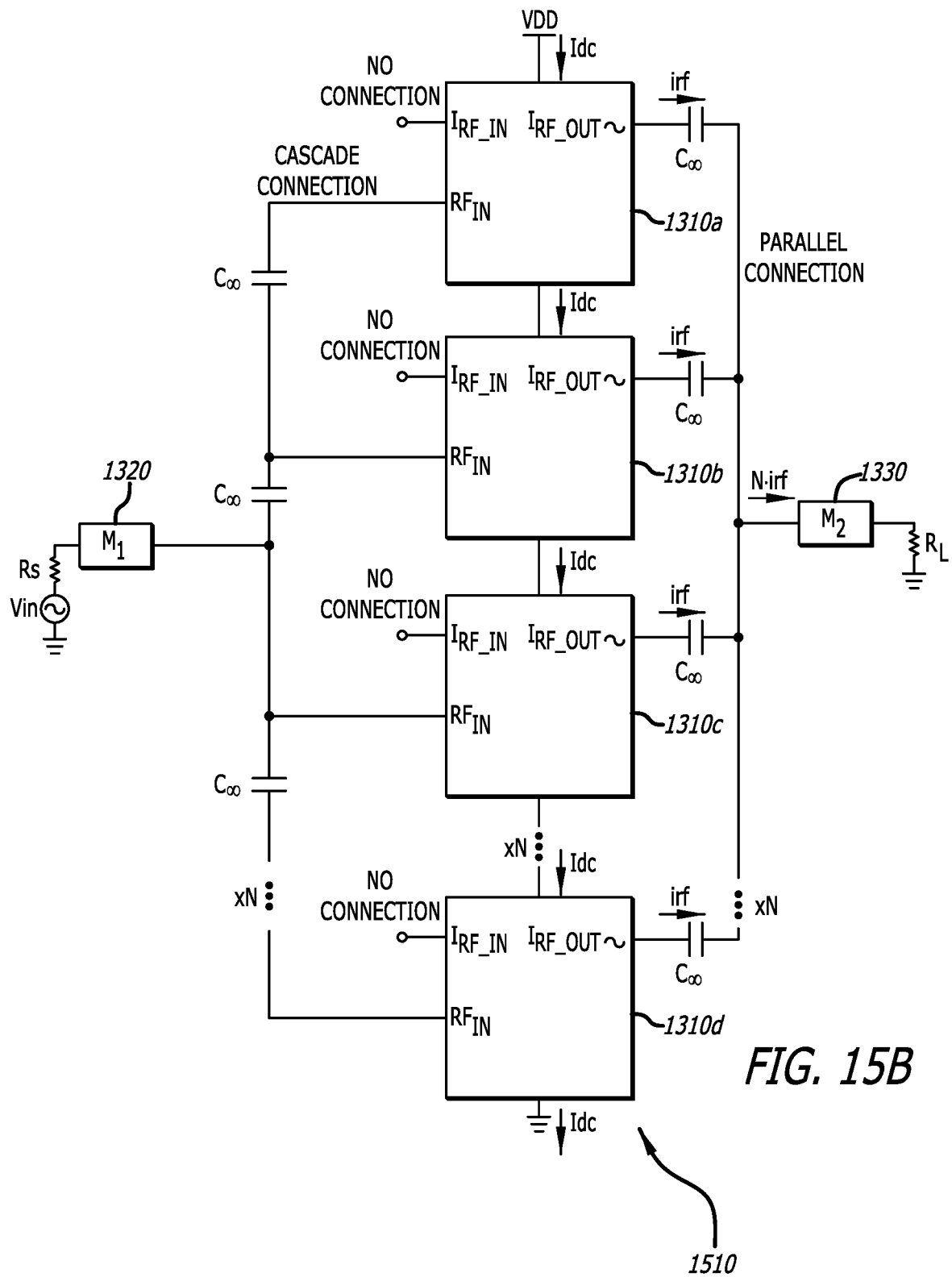

FIG. 15B is a schematic circuit diagram of the disclosed single-ended single-stage "current mode" amplifier, where the transconducting cells are connected together in cascade for the RF input signal ($RF_{IN}$) and are connected together in parallel for the AC RF output currents ($I_{RF\_OUT}$), and where the input matching network (M1) is connected to an input junction of a second transconducting cell 1310b, in accordance with at least one embodiment of the present disclosure.

Figure 15C:
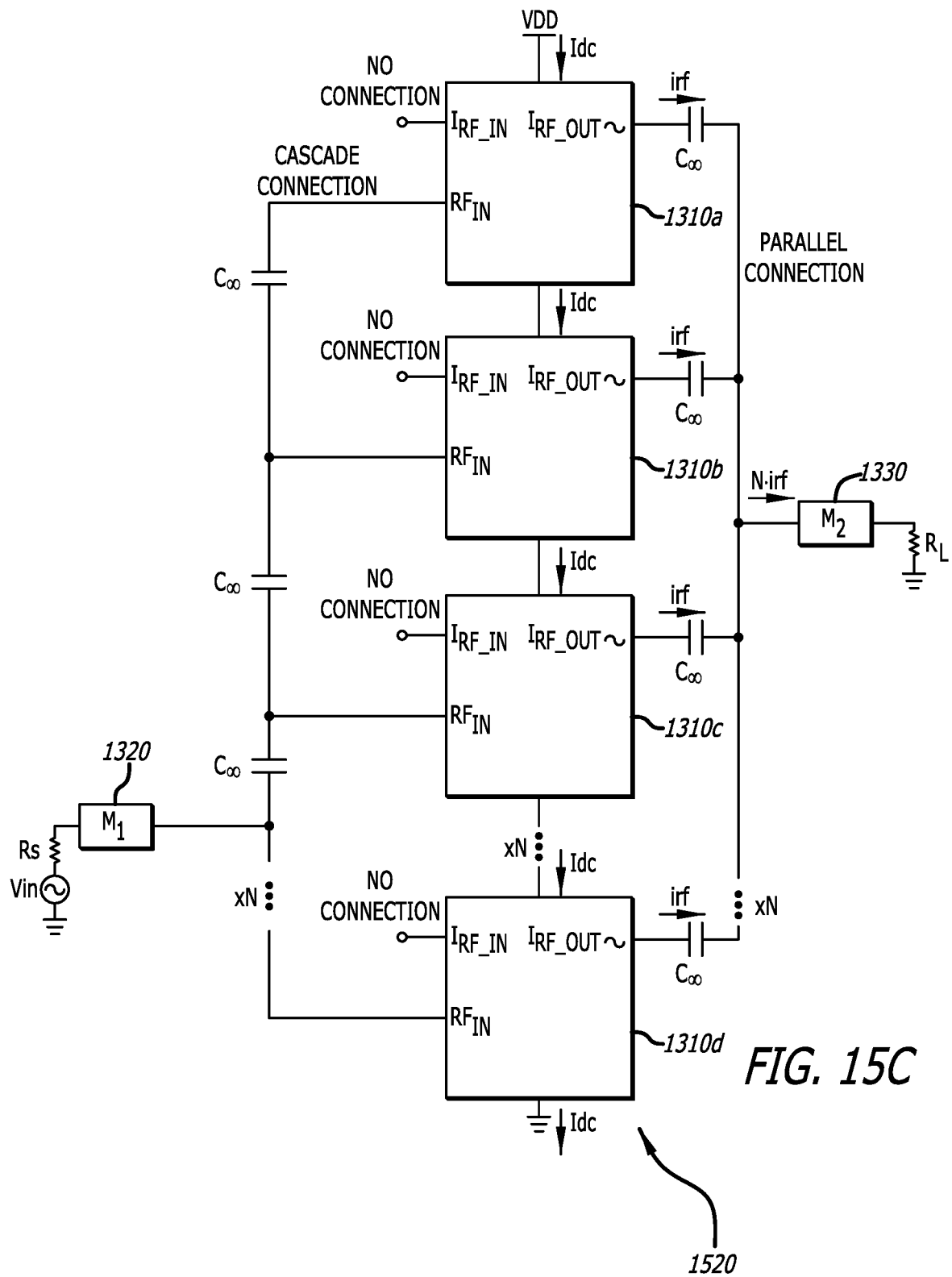

FIG. 15C is a schematic circuit diagram of the disclosed single-ended single-stage "current mode" amplifier, where the transconducting cells are connected together in cascade for the RF input signal ($RF_{IN}$) and are connected together in parallel for the AC RF output currents ($I_{RF\_OUT}$), and where the input matching network (M1) is connected to an input junction of a third transconducting cell 1310c, in accordance with at least one embodiment of the present disclosure.

Figure 15D:
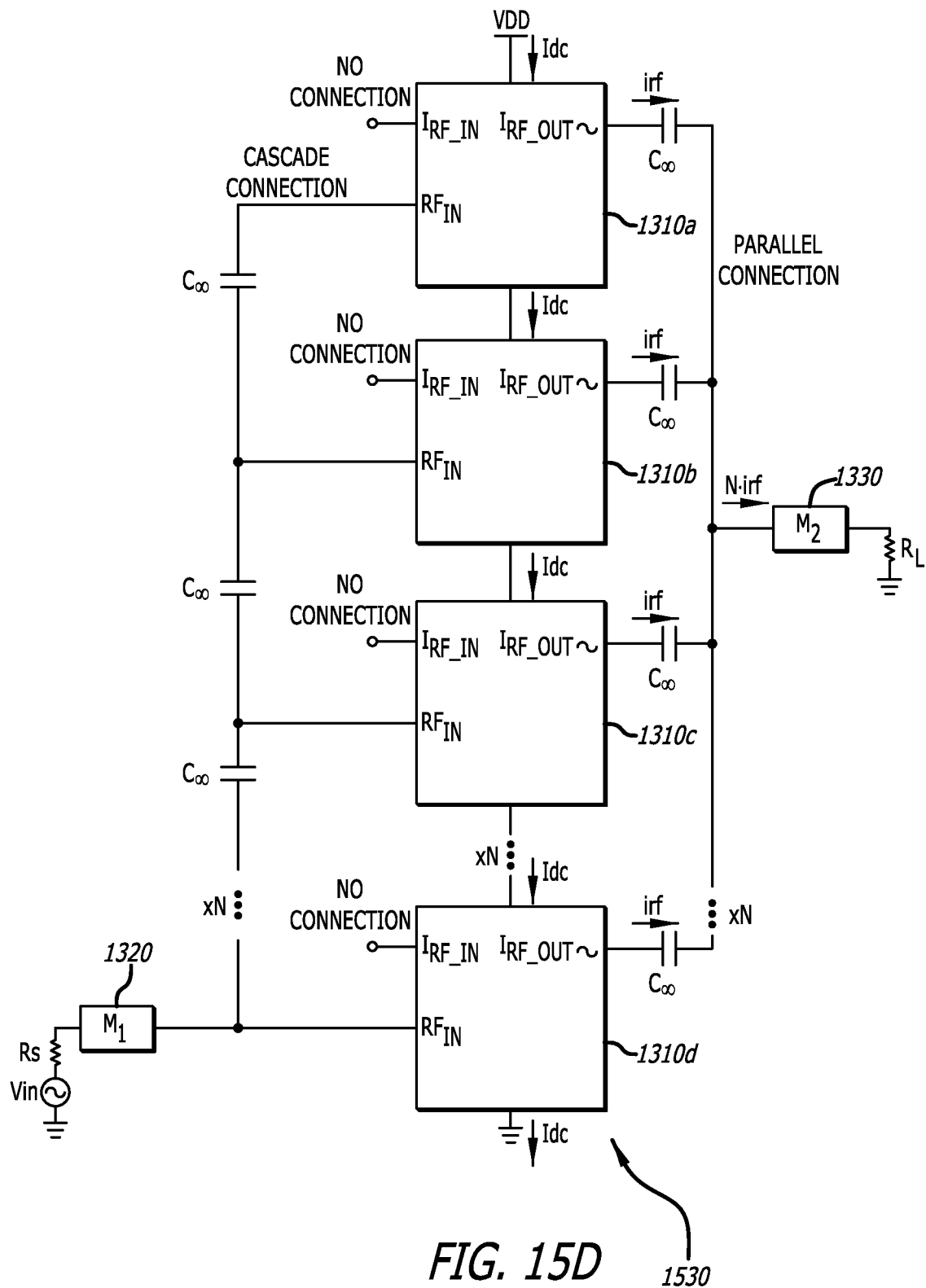

FIG. 15D is a schematic circuit diagram of the disclosed single-ended single-stage "current mode" amplifier, where the transconducting cells are connected together in cascade for the RF input signal ($RF_{IN}$) and are connected together in parallel for the AC RF output currents ($I_{RF\_OUT}$), and where the input matching network (M1) is connected to an input junction of a last transconducting cell 1310d, in accordance with at least one embodiment of the present disclosure.

Figure 16A:
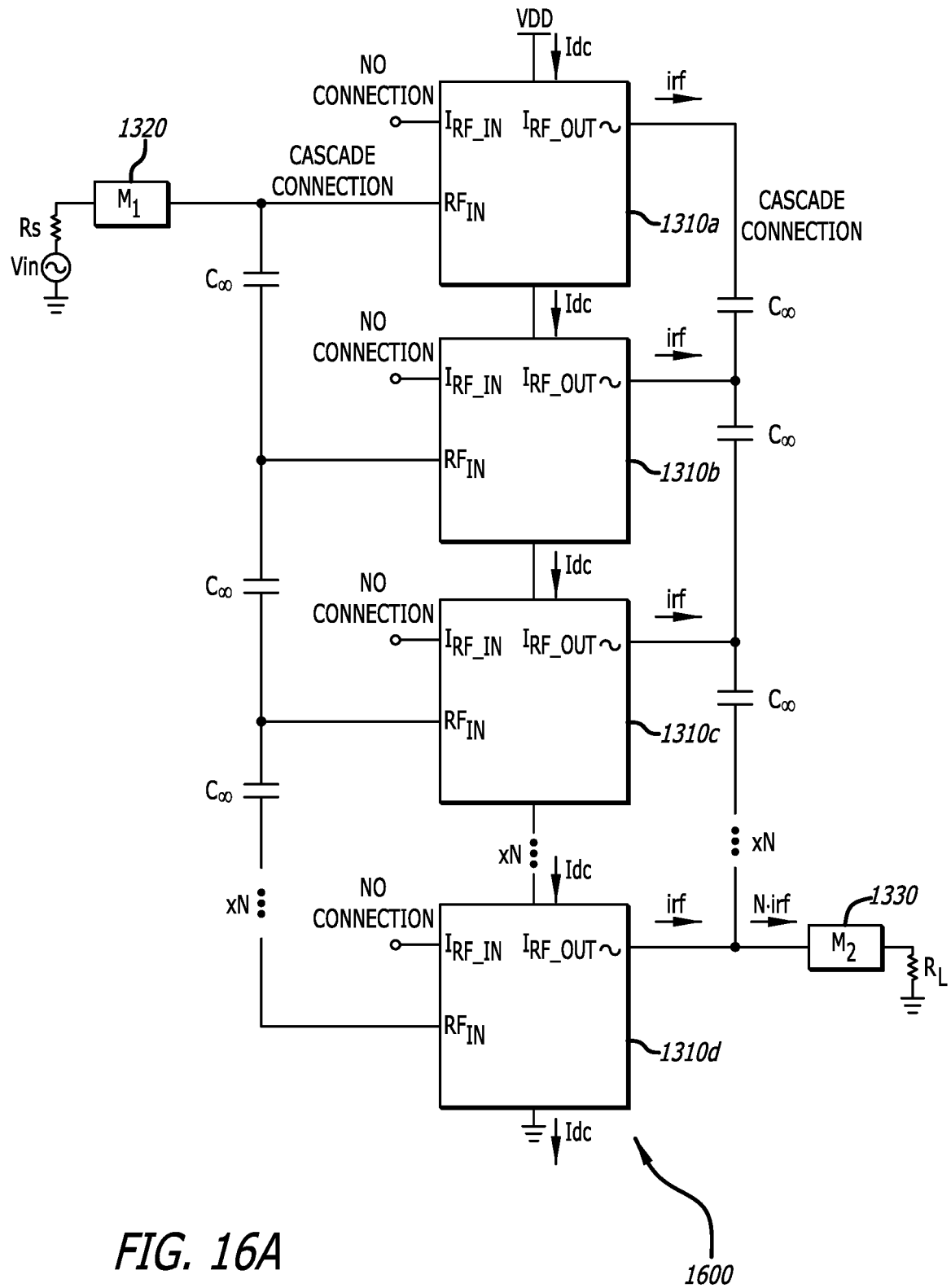
Figure 16B:
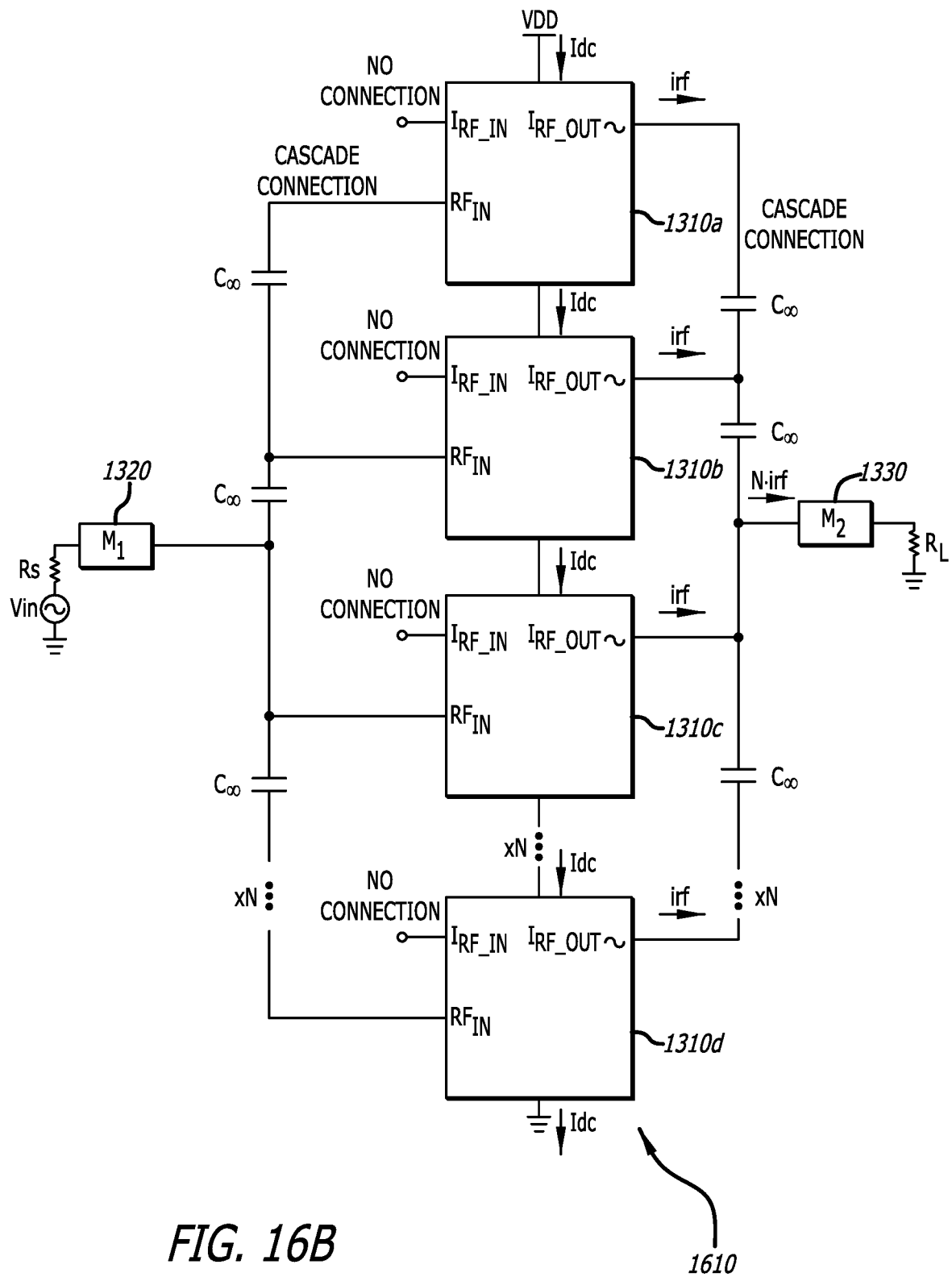
Figure 16C:
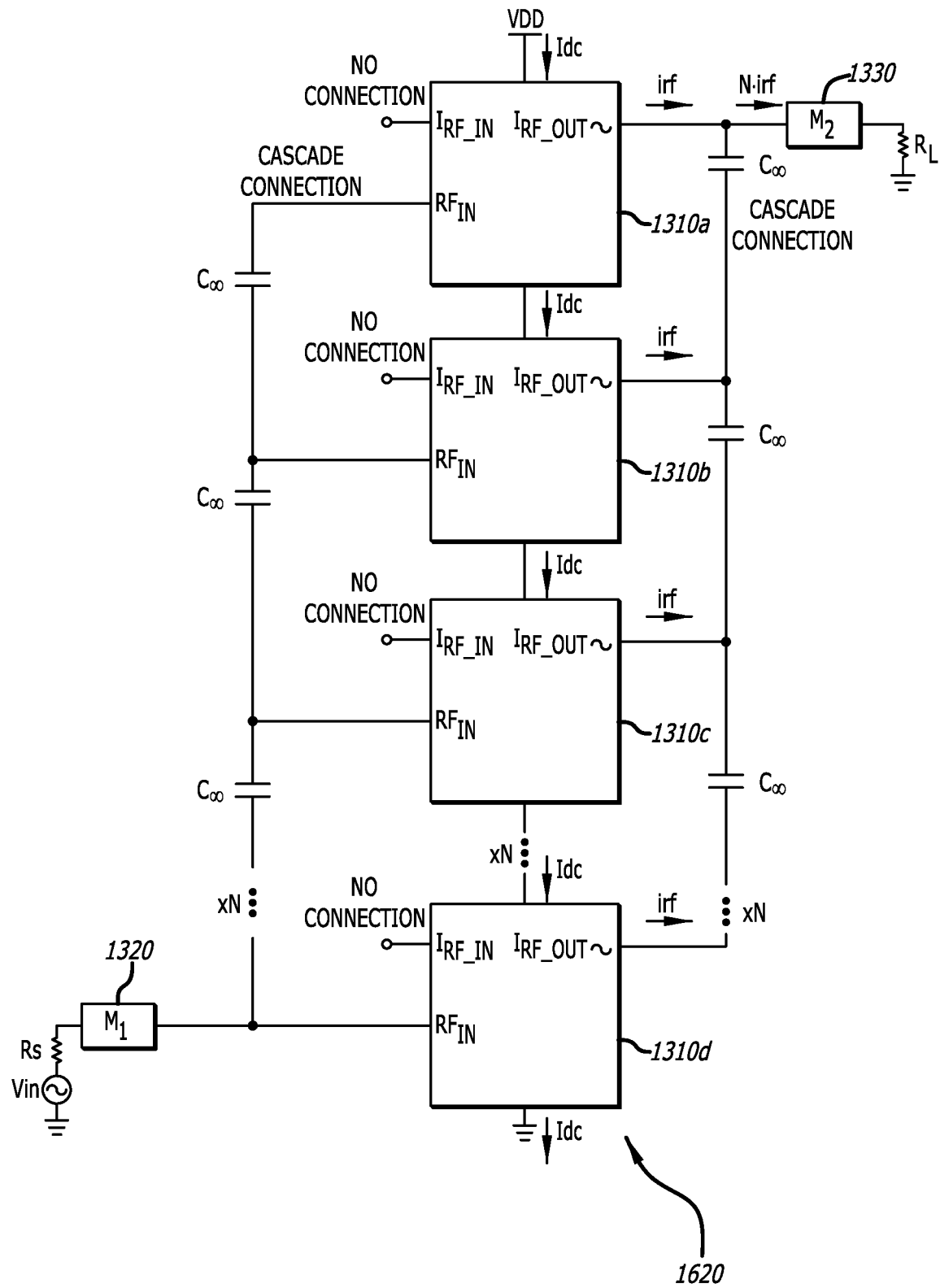

FIGS. 16A to 16C are schematic circuit diagrams of the disclosed single-ended single-stage "current mode" amplifiers, where the transconducting cells are connected together in cascade for the RF input signal ($RF_{IN}$) and are connected together in cascade for the AC RF output currents ($I_{RF\_OUT}$), in accordance with various embodiments of the present disclosure.

FIG. 16A is a schematic circuit diagram of the disclosed single-ended single-stage "current mode" amplifier, where the transconducting cells are connected together in cascade for the RF input signal ($RF_{IN}$) and are connected together in cascade for the AC RF output currents ($I_{RF\_OUT}$), and where the input matching network (M1) is connected to an input junction of a first transconducting cell 1310a and the output matching network (M2) is connected to an output junction of a last transconducting cell 1310d, in accordance with at least one embodiment of the present disclosure.

FIG. 16B is a schematic circuit diagram of the disclosed single-ended single-stage "current mode" amplifier, where the transconducting cells are connected together in cascade for the RF input signal ($RF_{IN}$) and are connected together in cascade for the AC RF output currents ($I_{RF\_OUT}$), and where the input matching network (M1) is connected to an input junction of a second transconducting cell 1310b and the output matching network (M2) is connected to an output junction of the second transconducting cell 1310b, in accordance with at least one embodiment of the present disclosure.

FIG. 16C is a schematic circuit diagram of the disclosed single-ended single-stage "current mode" amplifier, where the transconducting cells are connected together in cascade for the RF input signal ($RF_{IN}$) and are connected together in cascade for the AC RF output currents ($I_{RF\_OUT}$), and where the input matching network (M1) is connected to an input junction of a last transconducting cell 1310d and the output matching network (M2) is connected to an output junction of the first transconducting cell 1310a, in accordance with at least one embodiment of the present disclosure.

Figure 17:
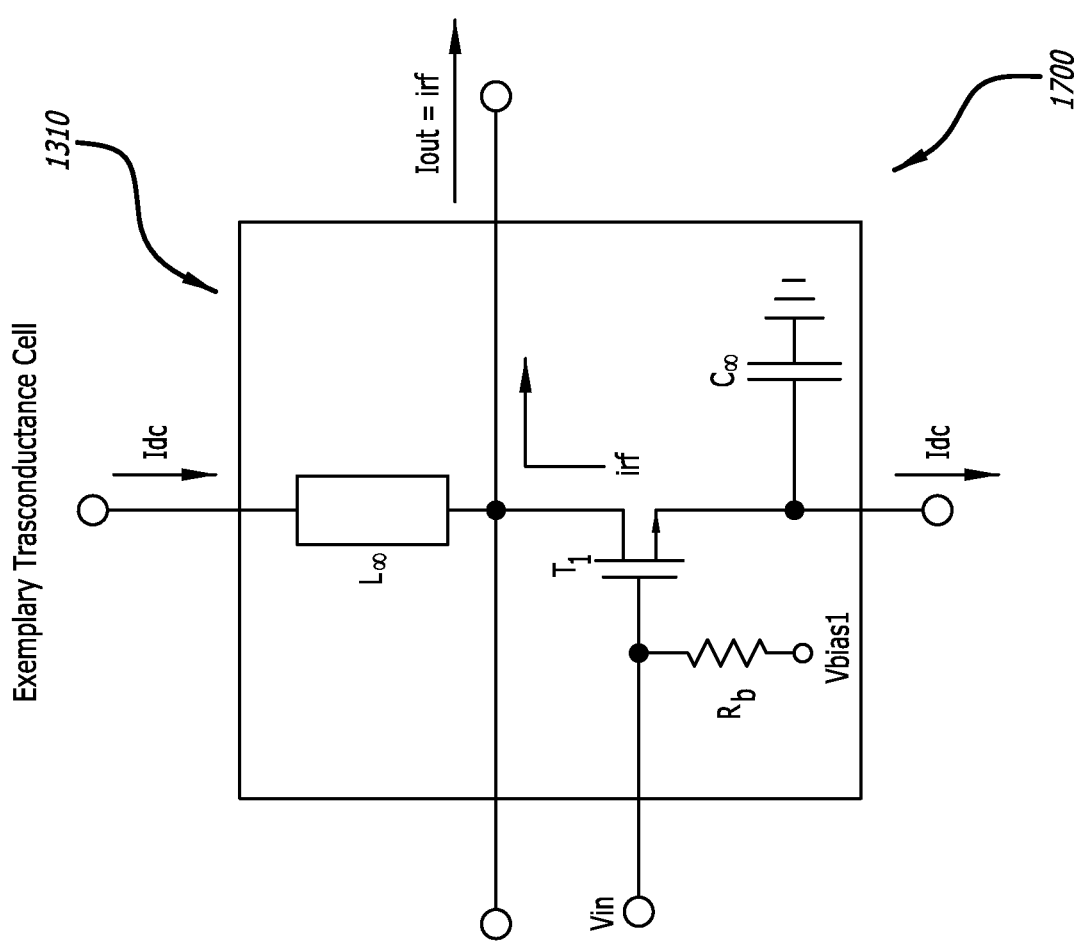

FIG. 17 is a schematic circuit diagram showing an exemplary transconducting cell that may be employed for the transconducting cells of the disclosed single-ended single-stage "current mode" amplifiers of FIGS. 13 to 16C, where the transconductance cells are implemented as common-source cells with RF unit element devices as MOSFET, and in particular, an n-channel MOSFET (NMOS), in accordance with at least one embodiment of the present disclosure.

Figure 18:
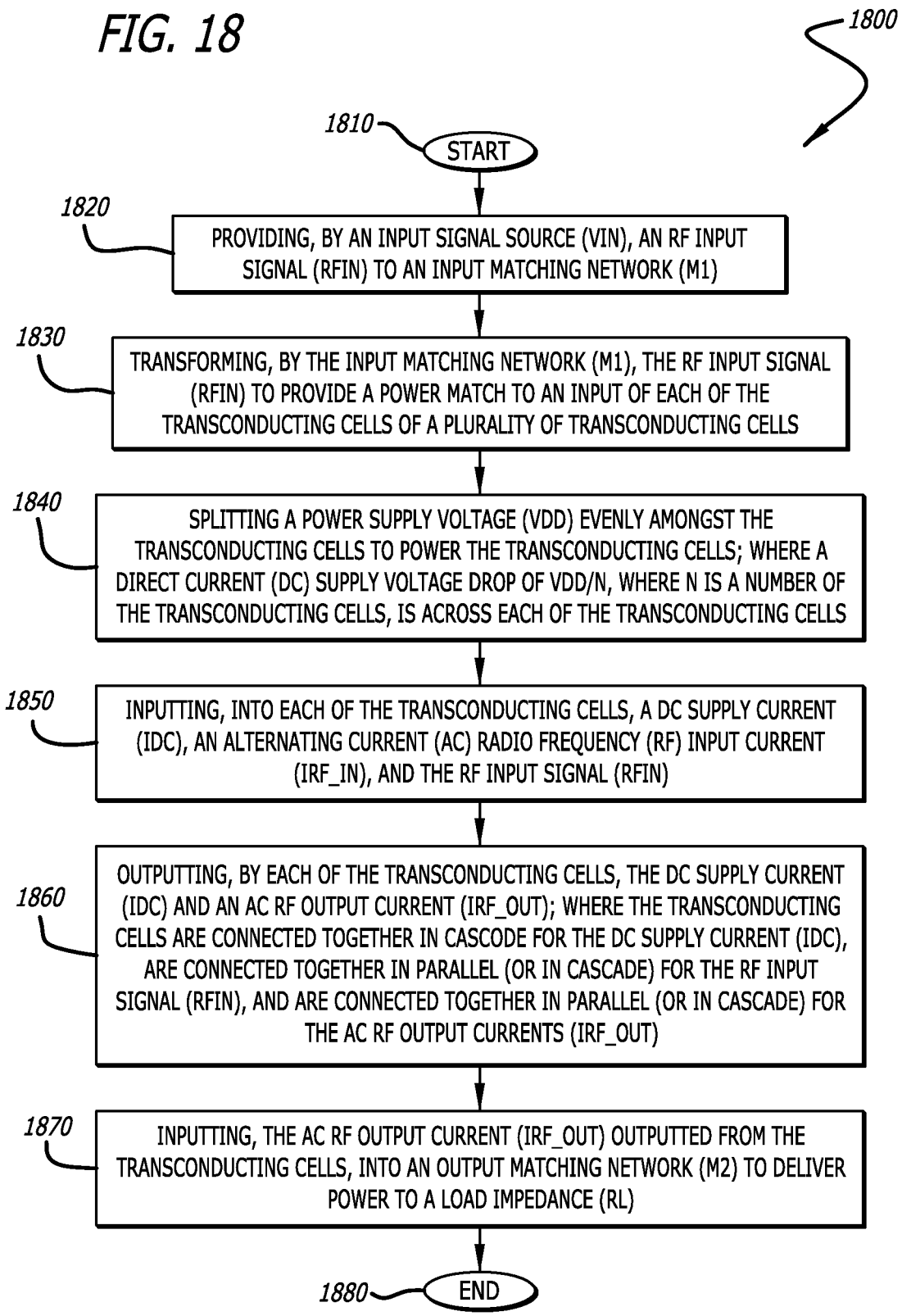

FIG. 18 is a flow chart showing the disclosed method for operation of the disclosed single-ended single-stage "current mode" amplifiers of FIGS. 13 to 16C, in accordance with at least one embodiment of the present disclosure.

Figure 19:
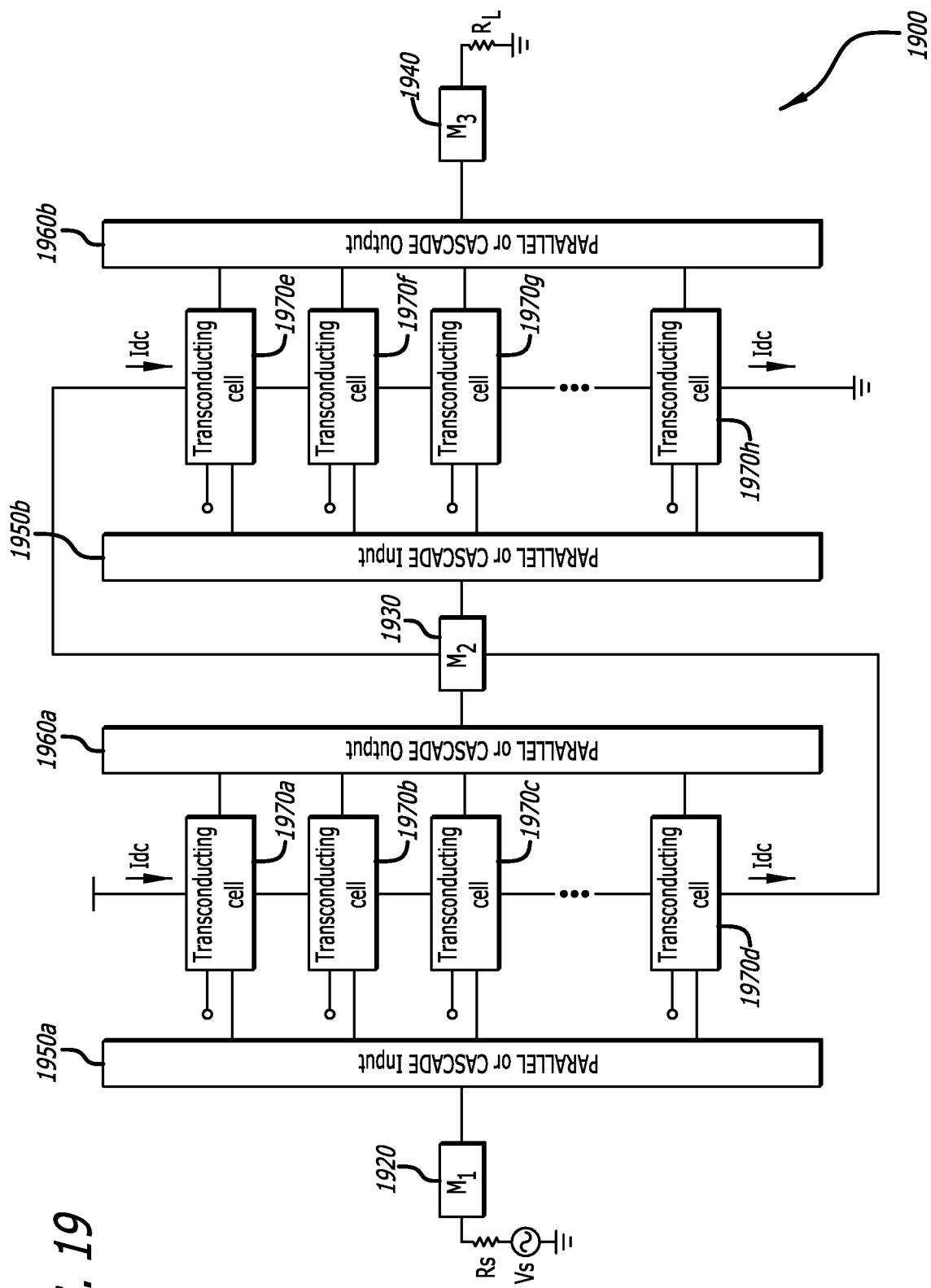

FIG. 19 is a schematic circuit diagram of the disclosed multi-stage "current mode" amplifier with M number of first stage transconducting cells and N number of second stage transconducting cells, where the transconducting cells in the first stage and the transconducting cells in the second stage are connected together in parallel (or in cascade) for the RF input signal ($RF_{IN}$) and are connected together in parallel (or in cascade) for the AC RF output currents ($I_{RF\_OUT}$), in accordance with at least one embodiment of the present disclosure.

Figure 20A:
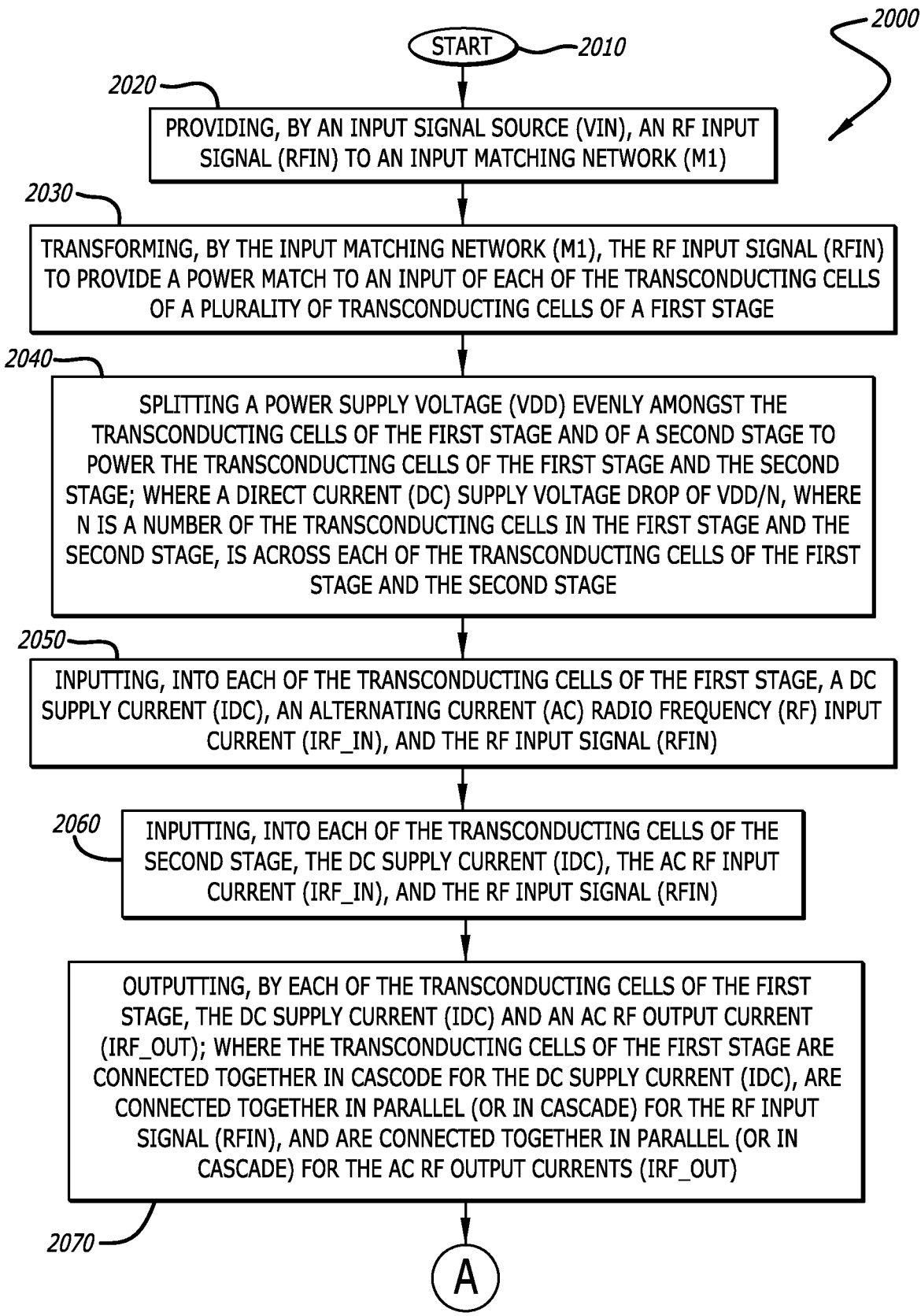
Figure 20B:
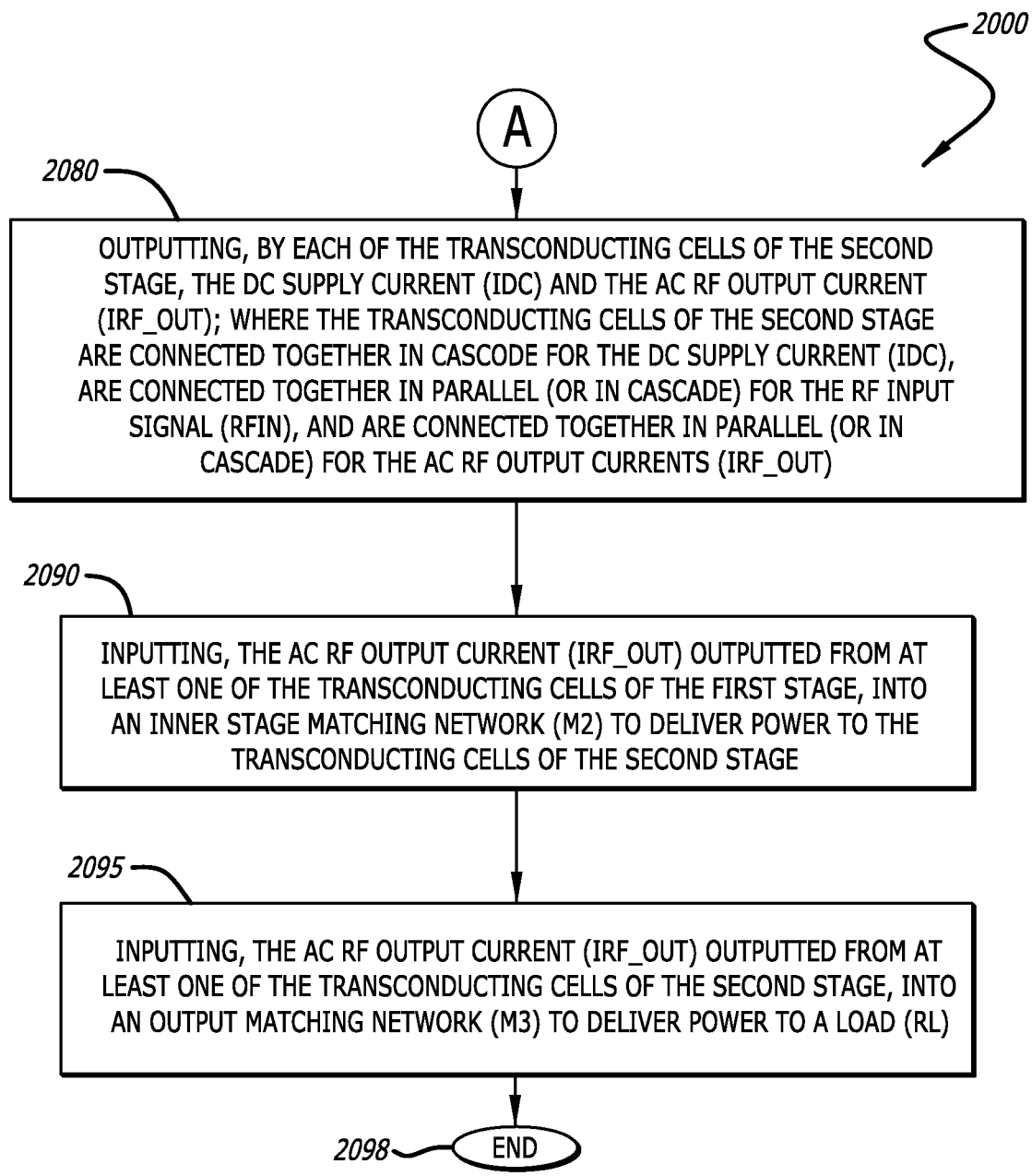

FIGS. 20A and 20B together are a flow chart showing the disclosed method for operation of the disclosed multi-stage "current mode" amplifier of FIG. 19, in accordance with at least one embodiment of the present disclosure.

Figure 21:
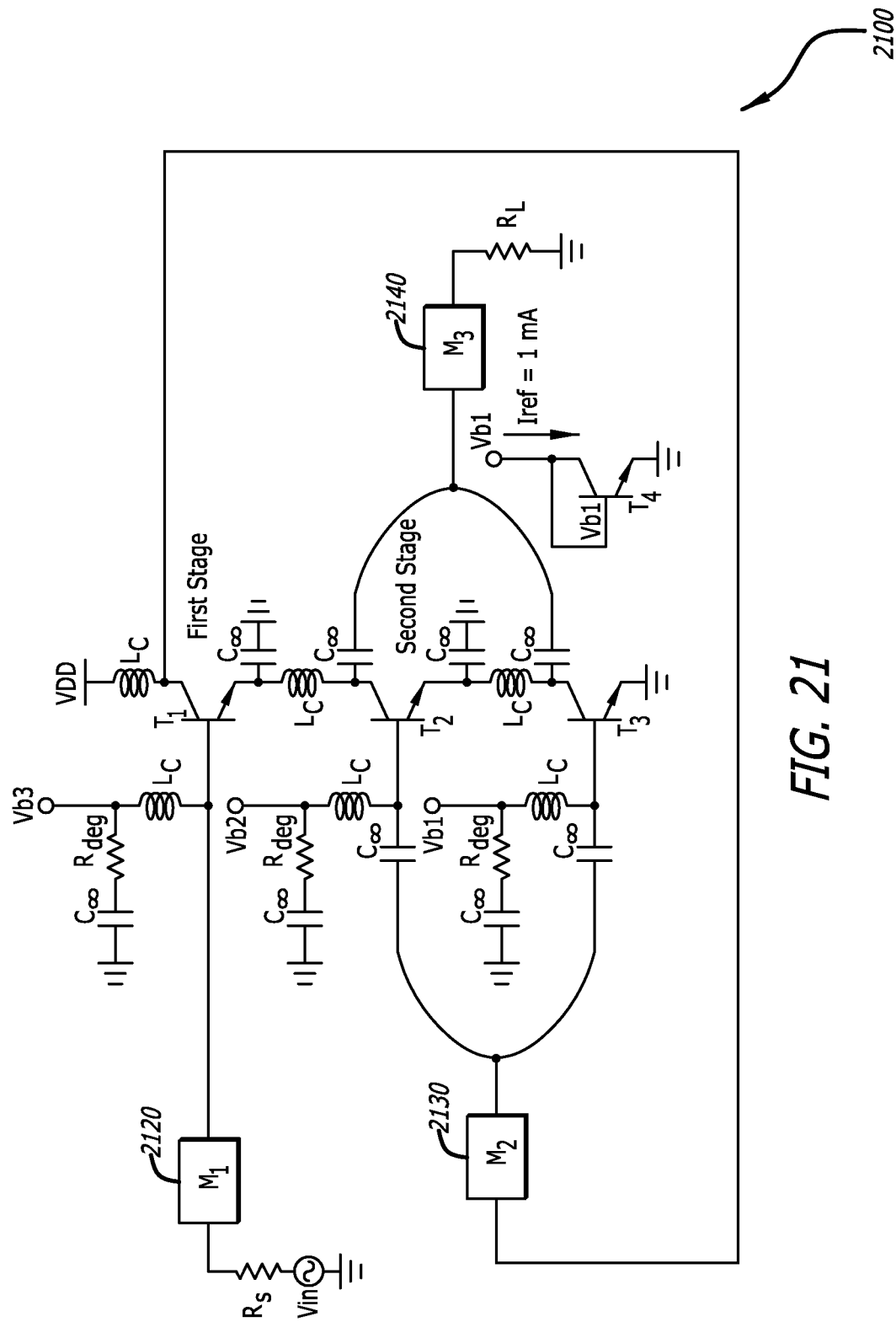

FIG. 21 is a schematic circuit diagram showing an exemplary circuit that may be employed for the disclosed multi-stage "current mode" amplifier, in accordance with at least one embodiment of the present disclosure.

Figure 22A:
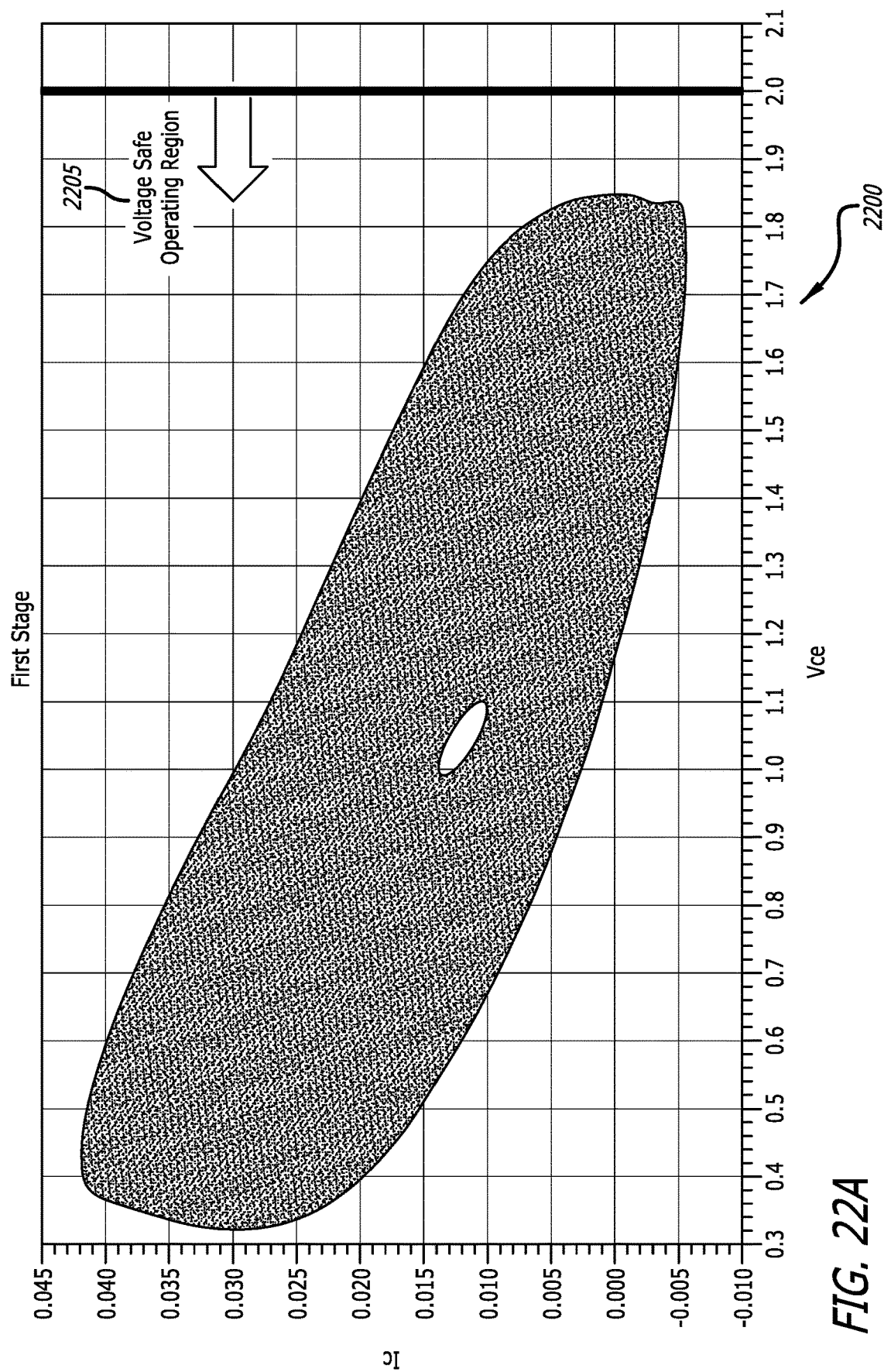

FIG. 22A is a graph showing simulation results of collector current (Ic) versus collector-emitter voltage (Vce) of the transistor T1 of the first stage of the multi-stage "current mode" amplifier of FIG. 21, in accordance with at least one embodiment of the present disclosure.

Figure 22B:
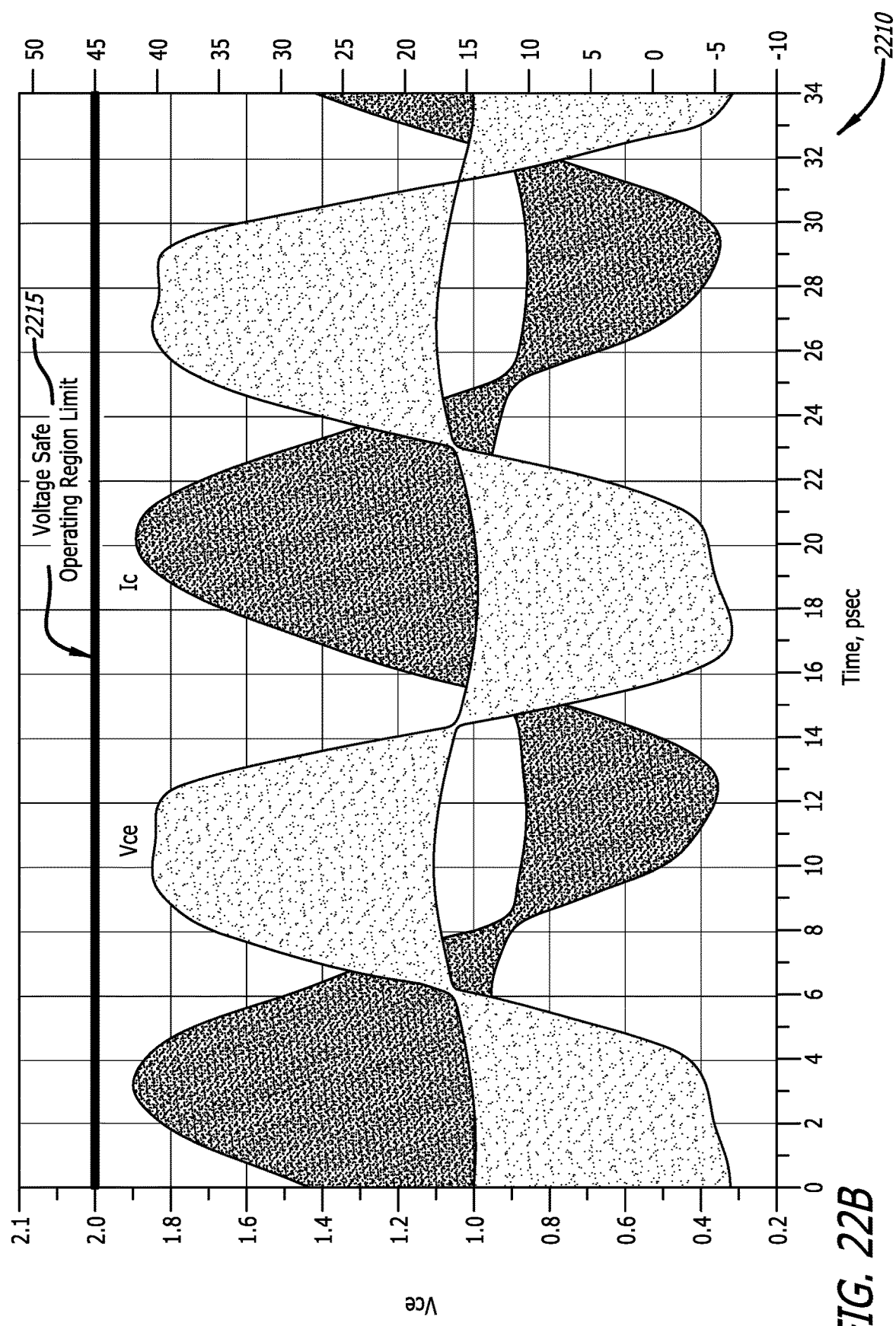

FIG. 22B is a graph showing simulation results of Ic/Vce versus time (in picoseconds (psec)) of the transistor T1 of the first stage of the multi-stage "current mode" amplifier of FIG. 21, in accordance with at least one embodiment of the present disclosure.

Figure 23A:
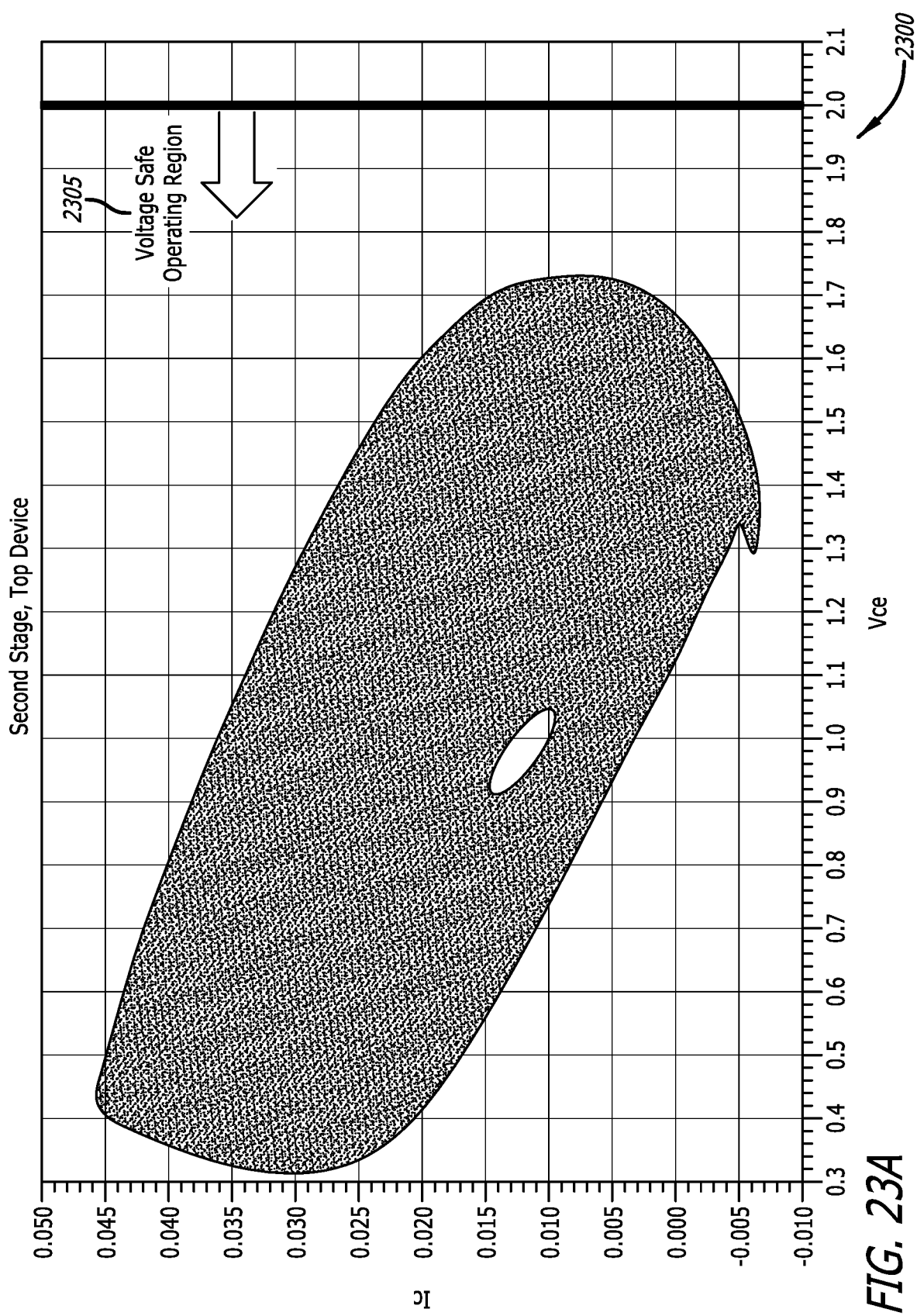

FIG. 23A is a graph showing simulation results of Ic versus Vce of the top transistor T2 of the second stage of the multi-stage "current mode" amplifier of FIG. 21, in accordance with at least one embodiment of the present disclosure.

Figure 23B:
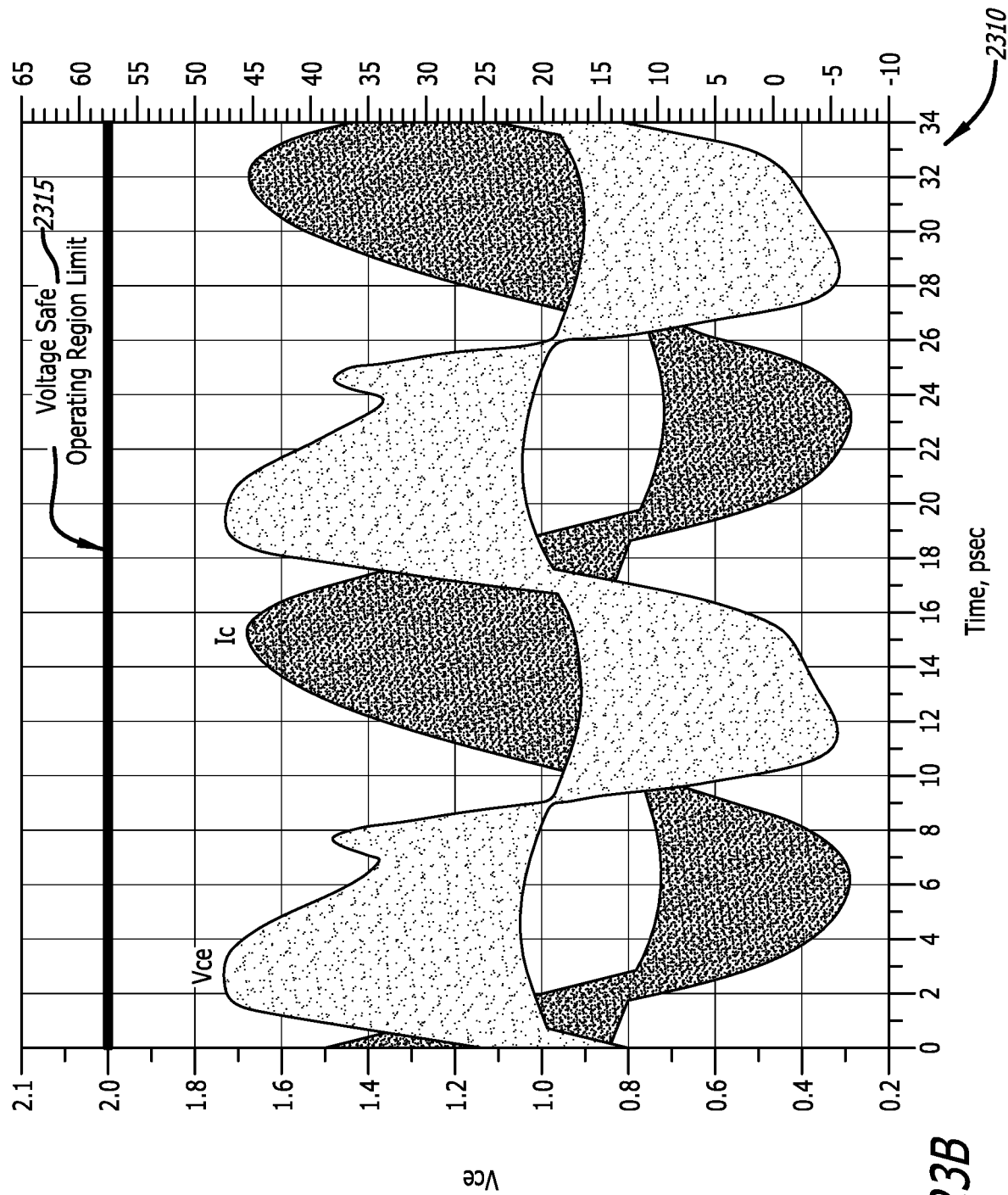

FIG. 23B is a graph showing simulation results of Ic/Vce versus time (psec) of the top transistor T2 of the second stage of the multi-stage "current mode" amplifier of FIG. 21, in accordance with at least one embodiment of the present disclosure.

Figure 24A:
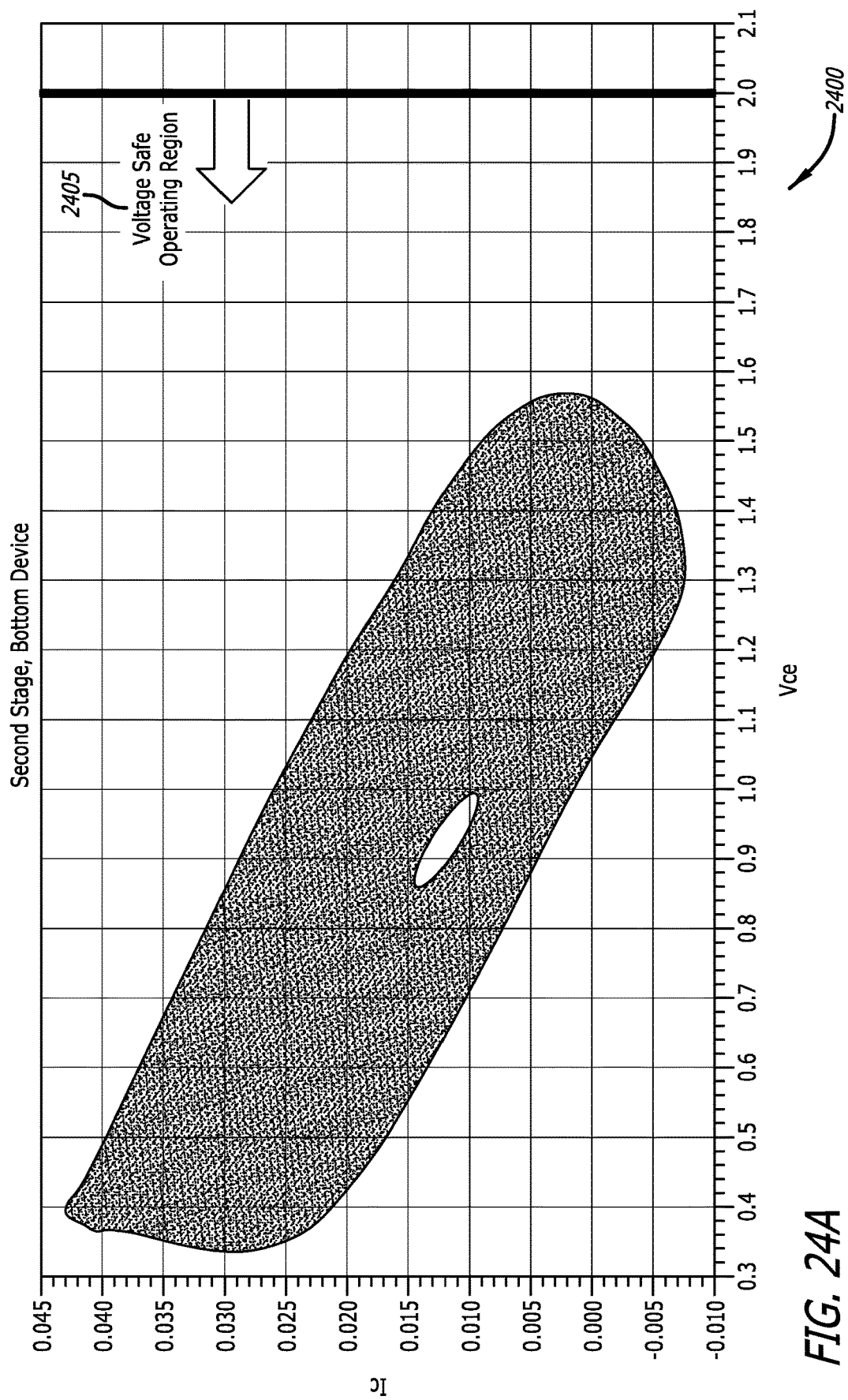

FIG. 24A is a graph showing simulation results of Ic versus Vce of the bottom transistor T3 of the second stage of the multi-stage "current mode" amplifier of FIG. 21, in accordance with at least one embodiment of the present disclosure.

Figure 24B:
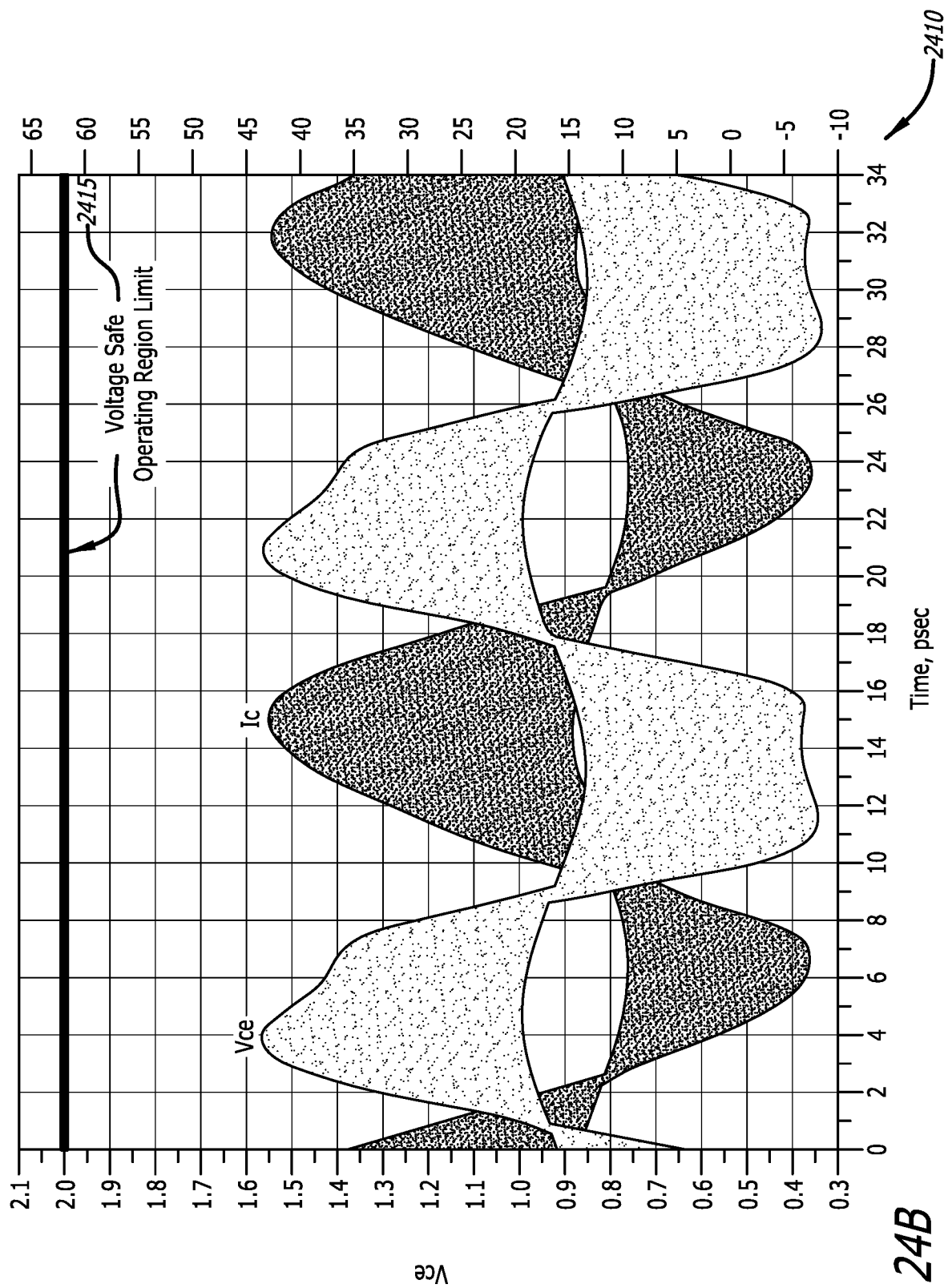

FIG. 24B is a graph showing simulation results of Ic/Vce versus time (psec) of the bottom transistor T3 of the second stage of the multi-stage "current mode" amplifier of FIG. 21, in accordance with at least one embodiment of the present disclosure.

Figure 25:
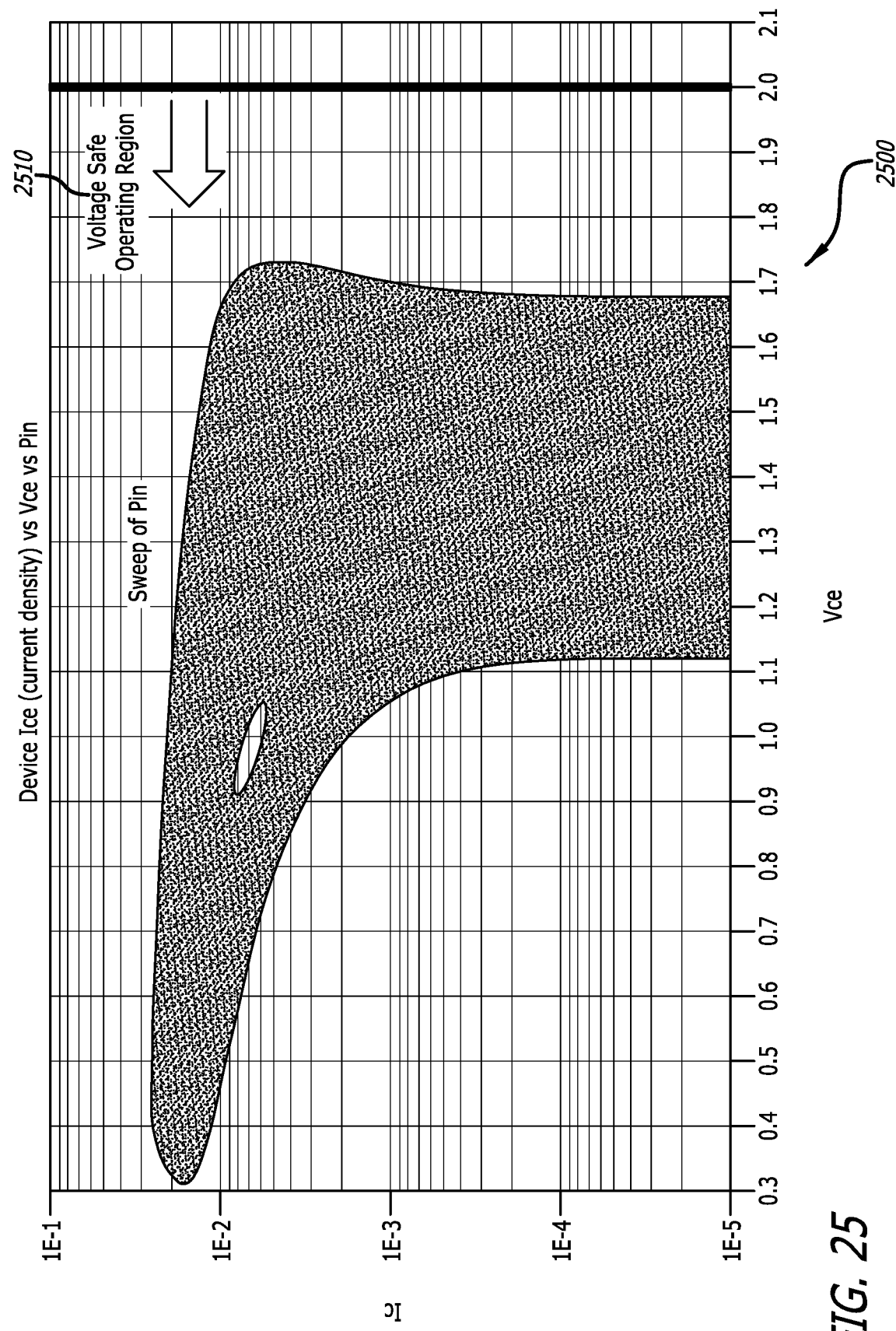

FIG. 25 is a graph showing simulation results of output current density (Ice) verses Vce versus input power (Pin) of the transistors T2 and T3 of the second stage of the multi-stage "current mode" amplifier of FIG. 21, in accordance with at least one embodiment of the present disclosure.

DESCRIPTION

The methods and apparatuses disclosed herein provide operative systems for an amplifier with stacked transconducting cells in "current mode combining". In one or more embodiments, the system of the present disclosure provides a power amplifier architecture that is more compact (e.g., by comprising a single-input, single-output matching network, for example refer to (M1) 520 of FIG. 5A and (M2) 530 of FIG. 5B) compared to conventional parallel input/output architectures of a similar type (e.g., refer to amplifier 100 of FIG. 1). As such, the disclosed amplifier architecture allows for a more compact device layout, which reduces chip area and cost. Moreover, the disclosed amplifier architecture reduces the stacked device's gate/base loss mechanism (as compared to the conventional "voltage mode" stacked devices), thereby improving output power and efficiency. Lastly, the disclosed amplifier topology can be extended to multi-stage power amplifiers.

Currently, power amplifiers with current sharing of series stacked transistor devices in "voltage mode combining" have been proposed to create amplifiers with low break-down voltage technology for high-voltage fixed supply systems. These architectures have limitations of the total number of stacked devices due to the stacked device's gate/base resistive losses, thereby limiting efficiency. Moreover, in parallel input/output combining implementations, a large die area is consumed by the combining networks. The disclosed approach is a "current mode" implementation of stacked devices that simplifies the structure to a single-input and single-output matching/combining network, which reduces layout size and alleviates gate/base stacked device losses, thereby improving die size as well as output power and efficiency.

Previous solutions have proposed stacked field-effect transistor (FET) topologies, in which the gates of the stacked devices are loaded with an impedance (i.e. a capacitive division) that allows for the gate voltages to track the source/drain voltages in such a way that the voltage swings across each device are below the device critical break-down voltage. This approach has a limitation in that the gate/base resistive losses provide a leakage path for the RF current, thereby limiting the efficiency. This limitation generally restricts this amplifier approach to FET technology (as opposed to BJT technology), which can have base resistive losses. Furthermore, parallel-input and parallel-output implementations of this topology require a large die area as the combining networks are often implemented as Wilkinson power combiners/dividers (e.g., refer to 220 and 230 of FIG. 2). Lastly, the conventional topologies of a voltage mode stacked FET have a strict dependency on performance relative to the absolute value of the gate capacitance and, as such, these topologies are process variation intolerant.

The system of the present disclosure provides a unique way of combining the RF current of devices in cascade (e.g., refer to FIG. 5D), while in a cascode (e.g., refer to FIG. 5C), current shared direct current (DC) configuration. It should be noted that the term "cascode" is defined herein as and used throughout to mean "a plurality of units with a first unit having the following plurality of units connected on top of the first unit in a 'stacked' succession." Also, the term "cascade" is defined herein as and used throughout to mean "a plurality of units with a first unit having a plurality of other units connected following the first unit in a 'serial' succession." As such, the resulting architecture for the disclosed system will then only require a single input matching network and a single output matching network. Due to the parallel combining of the devices with a single input matching network, the resistive losses of the gate/base can be neglected with a properly designed matching network. Furthermore, due the matching network simplification, die area can be saved with simplistic matching networks. Lastly, for the disclosed architecture, the dependency on the value of gate/base capacitance value on performance is alleviated (e.g., only large DC blocking capacitances are needed for the disclosed architecture, which are process variation tolerant).

In the following description, numerous details are set forth in order to provide a more thorough description of the system. It will be apparent, however, to one skilled in the art, that the disclosed system may be practiced without these specific details. In the other instances, well known features have not been described in detail, so as not to unnecessarily obscure the system.

Embodiments of the present disclosure may be described herein in terms of functional and/or logical components and various processing steps. It should be appreciated that such components may be realized by any number of hardware, software, and/or firmware components configured to perform the specified functions. For example, an embodiment of the present disclosure may employ various integrated circuit components (e.g., memory elements, digital signal processing elements, logic elements, look-up tables, or the like), which may carry out a variety of functions under the control of one or more processors, microprocessors, or other control devices. In addition, those skilled in the art will appreciate that embodiments of the present disclosure may be practiced in conjunction with other components, and that the systems described herein are merely example embodiments of the present disclosure.

For the sake of brevity, conventional techniques and components related to signal amplifiers, and other functional aspects of the overall system may not be described in detail herein. Furthermore, the connecting lines shown in the various figures contained herein are intended to represent example functional relationships and/or physical couplings between the various elements. It should be noted that many alternative or additional functional relationships or physical connections may be present in one or more embodiments of the present disclosure.

Figure 1:
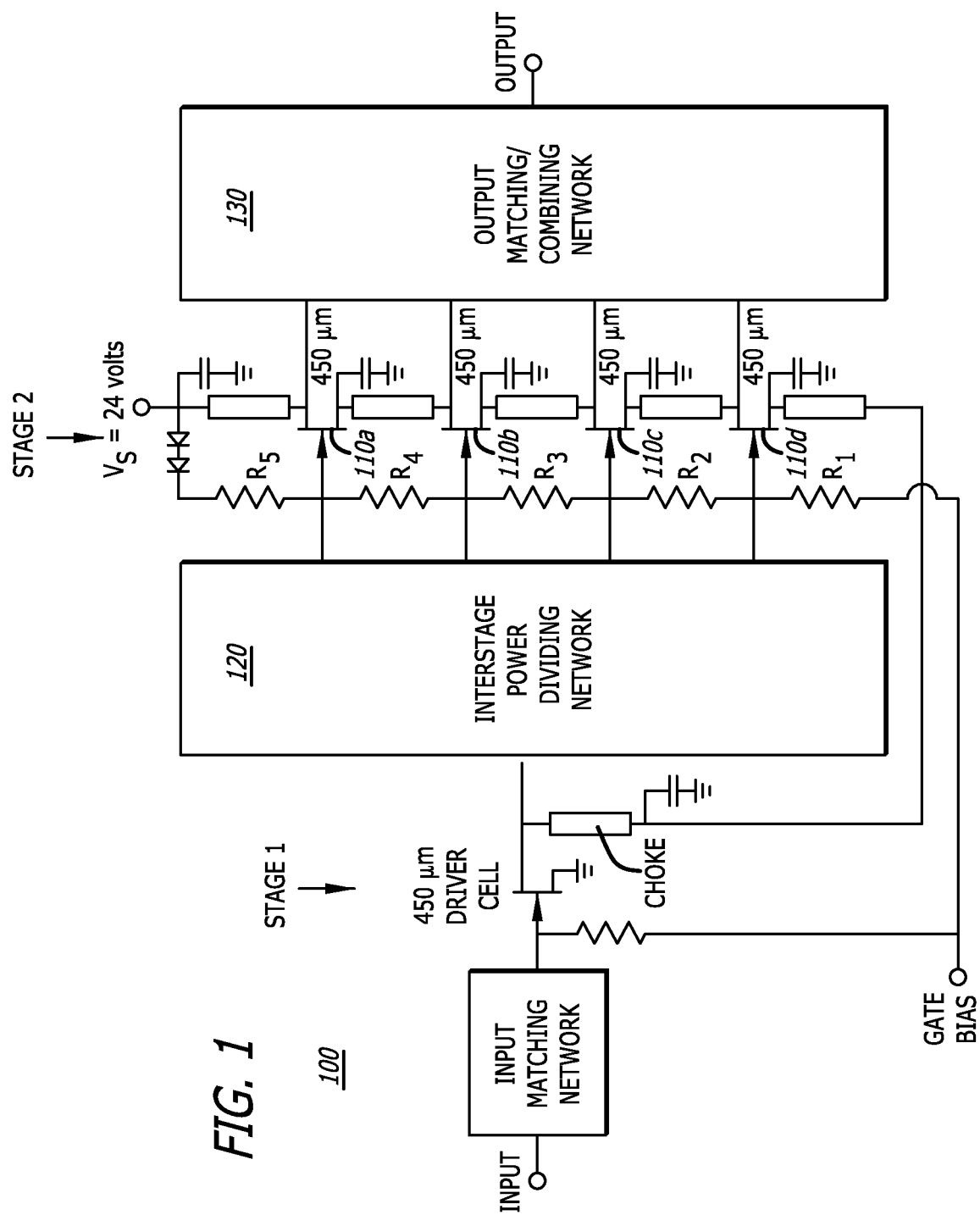
FIG. 1 is a schematic circuit diagram of a conventional two-stage amplifier, in which the second stage employs stacked devices with parallel-input and parallel-output power combining networks.

FIG. 1 is a schematic circuit diagram of a conventional two-stage amplifier 100, in which the second stage (i.e. stage 2) employs stacked devices (e.g., unit element FET devices 110a, 110b, 110c, 110d) with parallel-input and parallel-output power combining networks (e.g., an interstage power dividing network 120 and an output matching/combining network 130). In particular, the conventional two-stage amplifier 100 of FIG. 1 utilizes a current-shared stacked-device architecture, in which a high voltage supply (Vs) is divided across a cascading of common-source cells, each with a unit element FET device 110a, 110b, 110c, 110d. The power supply voltage (Vs) (e.g., 24 volts) is divided across the drain-to-source of each unit element FET device 110a, 110b, 110c, 110d to alleviate voltage breakdown of the unit element FET device 110a, 110b, 110c, 110d. A commonly shared DC drain-to-source current (i.e. "current sharing") exists through each common-source cell and unit element FET device 110a, 110b, 110c, 110d. Specifically, the architecture illustrates a two-stage (i.e. stage 1 and stage 2) architecture with a one-to-four stage-to-stage device fan-out. The second stage (i.e. stage 2) of the amplifier 100 uses a single-input to four-output power splitter (i.e. interstage power dividing network 120) and power combiner (i.e. output matching/combining network 130) to split and combine the input and output power of the four unit element FET devices 110a, 110b, 110c, 110d of the second stage, respectively. It should be noted that for the amplifier 100 of FIG. 1, the FET devices 110a, 110b, 110c, 110d are connected in cascode for the DC supply current (which travels down the devices), and are connected in parallel (not in cascade) for the AC RF signals (e.g., AC RF input and output currents) (which travel across the devices).

Figure 2:
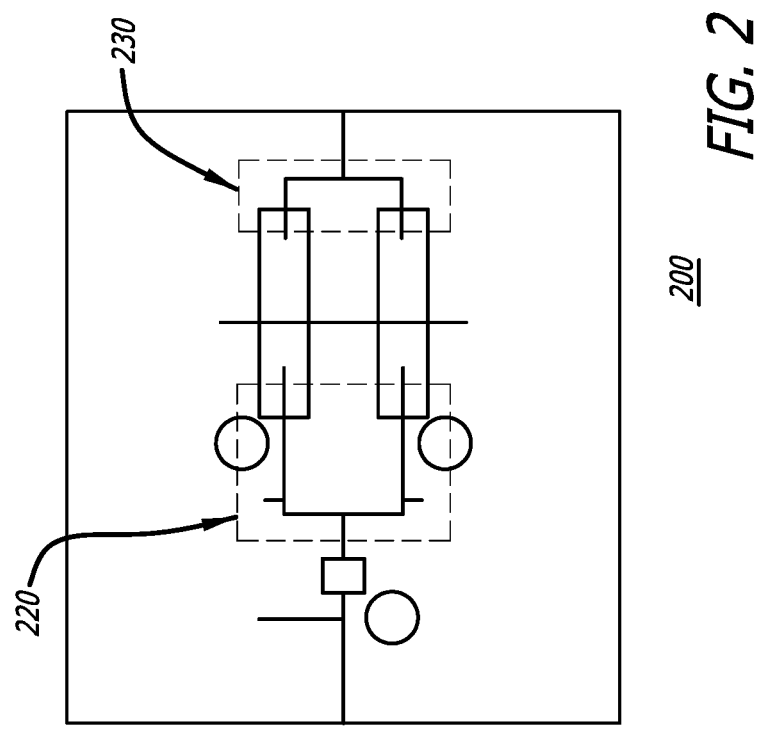
FIG. 2 is an illustration of an exemplary fabricated integrated circuit (IC) layout of the conventional two-stage amplifier of FIG. 1.

FIG. 2 is an illustration of an exemplary fabricated IC layout 200 of the conventional two-stage amplifier 100 of FIG. 1. In FIG. 2, the power splitter (i.e. interstage power dividing network 120) and the power combiner (i.e. output matching/combining network 130) of the amplifier 100 of FIG. 1 are implemented by a Wilkinson-type splitter 220 and a Wilkinson-type combiner 230, respectively. While this architecture illustrates an approach to implement low breakdown devices in a high voltage system with the current-sharing stacked FET technique, this architecture has the disadvantageous consequence of consuming large IC area because of the use of power splitters and combiners, which are large in size.

Figure 3:
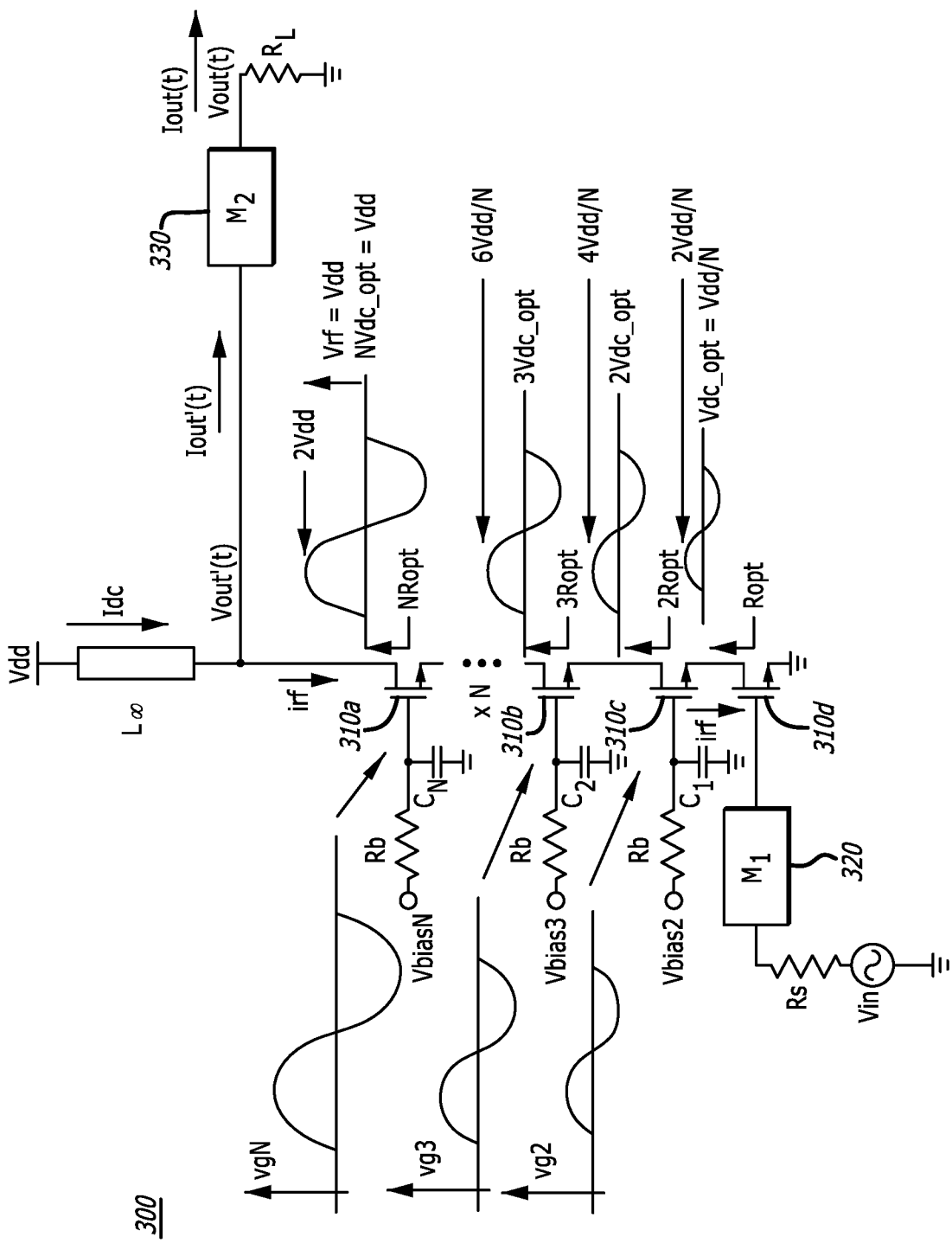
FIG. 3 is a schematic circuit diagram of a conventional single-stage amplifier, which employs stacked devices in "voltage mode combining" with a single-input single-output input matching network and a single-input single-output output matching network.

FIG. 3 is a schematic circuit diagram of a conventional single-stage amplifier 300, which employs stacked devices (i.e. unit element FET devices 310a, 310b, 310c, 310d) in "voltage mode combining" with a single-input single-output input matching network (M1) 320 and a single-input single-output output matching network (M2) 330. The amplifier 300 of FIG. 3 illustrates a similar architecture to the amplifier 100 of FIG. 1, in which the high voltage supply is distributed across each drain-to-source of the cascoded unit element FET devices 310a, 310b, 310c, 310d, thereby alleviating device break down as well as sharing a common DC current (Idc) through each unit element FET device 310a, 310b, 310c, 310d.

In particular, FIG. 3 illustrates a single-stage amplifier 300 with a single-input to single-output input matching network (M1) 320 driving a single unit element transconductance device creating a commonly shared alternating current (AC) current (irf) through each unit element FET device 310a, 310b, 310c, 310d. Following the bottom transconducting unit element FET device 310d is a cascoded unit element FET device 310c with an optimally tuned gate capacitance ($C_1$) to create a voltage divider between the cascoded unit element FET device's 310c drain-to-gate and gate-to-source capacitance such that the device voltage break down is never exceeded over an RF cycle.

It should be noted that for the amplifier 300 of FIG. 3, the FET devices 310a, 310b, 310c, 310d are connected in cascode for the DC supply current (Idc) (which travels down the devices), and are connected in cascode (not in cascade) for the AC RF signal (irf) (which travels down the devices).

To achieve the desired output power, each cascode unit element FET device gate capacitance (Cn) is scaled for each additional cascode to correspondingly scale the cascode's unit element FET device source impedance (Ropt is a function of Cn), thereby scaling the voltage swings across the unit element FET device 310a, 310b, 310c, as the cascode source voltage swing is proportional to Ropt·irf. As each additional cascode unit element FET device is added 310a, 310b, 310c, Cn correspondingly scales, increasing the voltage swings of the drain, gate, and source of each cascode unit element FET device 310a, 310b, 310c. A single-input to single-output output matching network (M2) 330 is used to provide NRopt to the drain of the final cascode unit element FET device 310a. By this construct, the amplifier 300 is said to be operating in "voltage mode combining", as the voltage swings scale with each additional cascode, thereby ensuring that the drain-to-gate and gate-to-source of each unit element FET device 310a, 310b, 310c never exceeds Vdd/N (which is set as the break-down voltage of a device), while simultaneously producing a large output voltage swing.

For class A operation and at peak input-signal drive for the "voltage mode" amplifier 300, the AC current amplitude of irf is Idc, with a peak current magnitude of 2·Idc delivered to the output matching network (M2) 330. The AC voltage amplitude of vrf is Vdd with a peak voltage magnitude of 2·Vdd.

Figure 4:
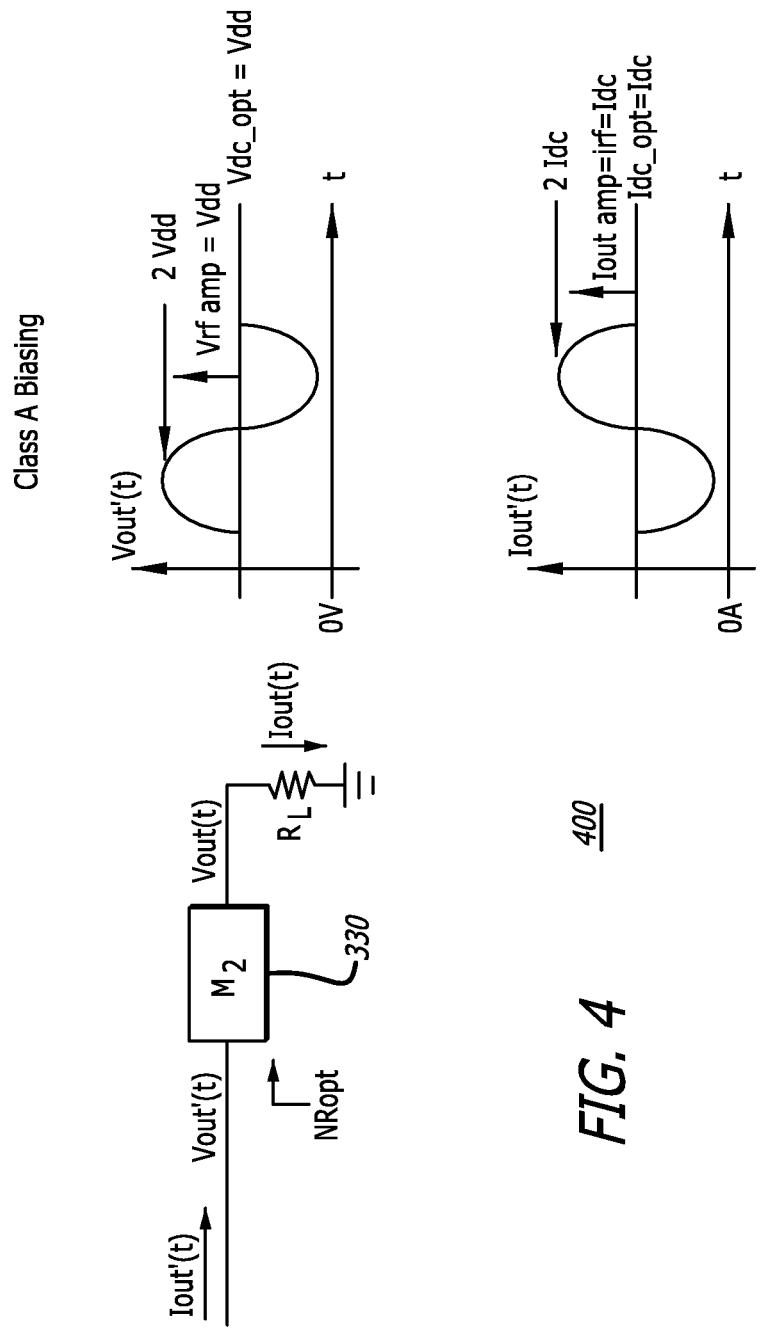
FIG. 4 is an illustration of class A biasing of "voltage mode combining" of the conventional single-stage amplifier of FIG. 3.

FIG. 4 is an illustration 400 of class A biasing of "voltage mode combining" of the conventional single-stage amplifier 300 of FIG. 3. For ideal class A operation of the amplifier 300 of FIG. 3, as illustrated in FIG. 4, the efficiency of the architecture approaches fifty (50) percent (%), neglecting non-ideal losses. As illustrated in FIG. 4, the peak drain voltage of the final Nth cascode unit element FET device 310a is 2·Vdd providing a large output voltage swing.

Referring back to FIG. 3, the voltage mode architecture of the conventional amplifier 300 has the advantage of having a single-input to single-output input matching network (M1) 320 and a single-input to single-output output matching network (M2) 330, which allow for a reduced IC layout area because they each comprise only a single input and only a single output.

However, there are several disadvantages to this architecture. A first disadvantage of amplifier 300 is that the previously described "floating gate" capacitive division is possible only in FET technologies that do not have a lossy resistive gate/base. For example, BJT bipolar unit element devices with a resistive base are not viable for this architecture. As such, this topology is limited to complementary-metal-oxide-semiconductor (CMOS) FET type unit element devices (e.g., 310a, 310b, 310c, 310d) only.

A second disadvantage of amplifier 300 is that due to the Cn path to ground, any resistive losses from the gate allows for power dissipation from the floating gate signal, thereby reducing output power efficiency. Again, this limitation prohibits the use of other resistive gate/base unit element devices.

A third disadvantage of amplifier 300 is that the architecture's voltage breakdown reliability of each unit element FET device (e.g., 310a, 310b, 310c, 310d) is dependent on strict tuning of the gate capacitance (Cn), thereby presenting reliability concerns over process fabrication variation.

A fourth disadvantage of amplifier 300 is that the "voltage mode" mechanism of the architecture creates further reliability constraints on the unit element FET device (e.g., 310a, 310b, 310c, 310d) as the voltage swings may be as large as 2·Vdd. Specifically, for bulk CMOS devices, the drain and source to body junction diode for large voltage swings can create non-linear distortion limiting the linear performance of the power amplifier (PA). At extreme cases of large voltage swings, the junction can break down and damage the device. This mechanism often restricts the technology to complementary-metal-oxide-semiconductor-silicon-on-insulator (CMOS-SOI) devices, which alleviate the parasitic body junction diodes for the unit element FET device (e.g., 310a, 310b, 310c, 310d). As such, conventional amplifiers 100, 300 employing stacked devices with power combining networks, or "voltage mode" combining, have strict limitation of IC layout area or reliability, thereby motivating the design of the system of the present disclosure, which alleviates these constraints.

FIGS. 5A and 5B together are a schematic circuit diagram of the disclosed single-ended single-stage "current mode" amplifier 500, in accordance with at least one embodiment of the present disclosure. The disclosed amplifier 500 utilizes a DC cascode of transconducting cells 510a, 510b, 510c, 510d sharing a common current (Idc), and splitting the power supply voltage (Vdd) across the transconducting cells 510a, 510b, 510c, 510d, thereby reducing voltage reliability concerns. The amplifier 500 has a parallel RF input signal (RF$_{IN}$) control while summing the cascade output RF current (I$_{RF\_OUT}$) of each of the transconducting cells 510a, 510b, 510c, 510d, thereby defining the amplifier 500 as "current mode". The present disclosed amplifier 500 alleviates the previously described concerns of large IC layout area power splitting/combining networks as single input/output matching networks (e.g., a single-input single-output input matching network (M1) 520 and a single-input single-output output matching network (M2) 530) may be utilized, and alleviates voltage swing reliability concerns as no large voltage swings are present.

The disclosed amplifier 500 utilizes a cascode stack of 'N' number of unit element transconducting cells 510a, 510b, 510c, 510d, which each take as an input: a supply current (Idc), an AC RF input current (I$_{RF\_IN}$), and an RF input signal (RF$_{IN}$); and each produce as an output: a DC current (Idc) and an AC RF output current (I$_{RF\_OUT}$). The transconducting cells 510a, 510b, 510c, 510d are cascoded in terms of the DC input and output current, such that a common current (Idc) is shared amongst each of the transconducting cells 510a, 510b, 510c, 510d, and a DC supply voltage drop of Vdd/N is across each of the transconducting cells 510a, 510b, 510c, 510d. The transconducting cells 510a, 510b, 510c, 510d are cascaded such that each transconducting cell's output current (I$_{RF\_OUT}$) is the input to the following cascaded transconducting cell's input current (I$_{RF\_IN}$). An input signal source (Vin) (along with a source resistor (Rs)) is followed by an input matching network (M1) 520, which drives each transconducting cell's RF input signal (RF$_{IN}$) in parallel. The final output current (I$_{RF\_OUT}$) of the last transconducting cell 510d is applied to an output matching network (M2) 520 to deliver power to a load impedance (R$_L$).

FIG. 5C is a schematic circuit diagram of the disclosed single-stage "current mode" amplifier 500 of FIG. 5A denoting the cascode connection of the transconducting cells 510a, 510b, 510c for the DC supply current (Idc), in accordance with at least one embodiment of the present disclosure. As previously mentioned above, the term "cascode" is defined herein as and used throughout to mean "a plurality of units (e.g., transconducting cells) with a first unit having the following plurality of units connected on top of the first unit in a 'stacked' succession."

FIG. 5D is a schematic circuit diagram of the disclosed single-stage "current mode" amplifier 500 of FIG. 5A denoting the cascade connection of the transconducting cells 510a, 510b, 510c for the AC RF input current (I$_{RF\_IN}$) and output current (I$_{RF\_OUT}$), in accordance with at least one embodiment of the present disclosure. As previously mentioned above, the term "cascade" is defined herein as and used throughout to mean "a plurality of units (e.g., transconducting cells) with a first unit having a plurality of other units connected following the first unit in a 'serial' succession."

FIG. 5E is a schematic circuit diagram of the disclosed single-stage "current mode" amplifier 500 of FIG. 5A showing the input matching network (M1) 520 driving each transconducting cell's 510a, 510b, 510c RF input signal (RF$_{IN}$) in parallel, in accordance with at least one embodiment of the present disclosure.

FIG. 5F is a flow chart showing the disclosed method for 505 operation of the disclosed single-ended single-stage "current mode" amplifier (e.g., amplifier 500 in FIGS. 5A and 5B), in accordance with at least one embodiment of the present disclosure. At the start 515 of the disclosed method 505, a DC supply current (Idc), an AC RF input current (I$_{RF\_IN}$), and an RF input signal (RF$_{IN}$) are all inputted into each transconducting cell of a plurality of transconducting cells 525. Also, each of the transconducting cells of the plurality of transconducting cells outputs the DC supply current (Idc) and an AC RF output current (I$_{RF\_OUT}$). In one or more embodiments, the transconducting cells are connected together in cascode (refer to FIG. 5C) for the DC supply current (Idc), and are connected together in cascade (refer to FIG. 5D) for the AC RF input and output currents 535. Then, the method 505 ends 545.

It should be noted that, in one or more embodiments of the present disclosure, the disclosed amplifier (e.g., 500 of FIGS. 5A and 5B, 600 of FIGS. 6A and 6B, and 700 of FIGS. 7A and 7B) implements each transconducting cell as a common source/emitter unit element. The common source/emitter unit element stages each have a RF unit element device that may be implemented utilizing any device technology (e.g., a FET device as in the amplifier 600 of FIGS. 6A and 6B, or a BJT device as in the amplifier 700 of FIGS. 7A and 7B). For example, FIGS. 6A and 6B together are a schematic circuit diagram of the disclosed single-ended single-stage "current mode" amplifier 600, with transconductance cells 610a, 610b, 610c, 610d implemented as common-source cells with RF unit element devices as a MOSFET, and in particular, an NMOS, in accordance with at least one embodiment of the present disclosure. And, FIGS. 7A and 7B together are a schematic circuit diagram of the disclosed single-ended single-stage "current mode" amplifier 700, with transconductance cells 710a, 710b, 710c, 710d implemented with common-emitter cells and RF unit element devices as a BJT, in accordance with at least one embodiment of the present disclosure.

For the disclosed amplifier 500, 600, 700, each RF unit element device (e.g., NMOS or BJT) within a common source/emitter element (e.g., the transconducting cells 510a, 510b, 510c, 510d) will have a drain-to-source (or collector-to-emitter) DC voltage of Vdd/N provided by a DC series connection of: a power supply Vdd, N number of inductive elements (L∞), and N number of unit element common source/emitter cells (e.g., the transconducting cells 510a, 510b, 510c, 510d) with RF unit element devices (e.g., NMOS or BJT). A common DC current (Idc) is shared through the series connection of the power supply (Vdd), N number of inductive elements (L∞), and N number of unit element common source/emitter stages (e.g., the transconducting cells 510a, 510b, 510c, 510d) with RF unit element devices (e.g., NMOS or BJT). The DC bias of each RF unit element device (e.g., NMOS or BJT) is provided by a voltage (Vbias N) and a large gate/base biasing resistance (Rb) such that each unit element device (e.g., NMOS or BJT) can be biased independently insuring a current Idc and nominal division of Vdd voltage across each unit element drain-to-source or collector-to-emitter.

The input RF signal following the single-input to single-output input matching network (M1) 520, drives the gate/base of each unit element device (e.g., NMOS or BJT) in parallel through large RF passing capacitors (C∞) at each unit element gate/base within each common source/emitter cell. Within the common source/emitter cell (e.g., the transconducting cells 510a, 510b, 510c, 510d), each unit element device (e.g., NMOS or BJT) acts as a common source/emitter transconductor with a large source/emitter capacitance (C∞) to ground and drain/collector RF inductive choke (L∞). The input RF signal from the input source (Vin) is power transformed via the single-input to single-output input matching network (M1) 520 to drive each common source/emitter unit element gate/base in parallel producing an AC current irf from each unit element device drain/collector. The output AC current of each unit element device (e.g., NMOS or BJT) is summed through an RF series connection of large RF capacitors (C∞), thereby creating a total AC output current of N·irf. The total output AC current (N·irf) is presented an impedance of Ropt/N (e.g., a resistance value chosen to optimize power and efficiency) transformed by a single-input to single-output output matching network (M2) 530 from a load impedance $R_L$. At peak input power drive of the amplifier, the total output AC current has an amplitude swing of N·Idc with a peak current magnitude of (N+1)·Idc delivered to Ropt/N, thereby producing an AC voltage amplitude swing of Vdd/N and a peak magnitude of 2Vdd/N.

FIG. 8 is an illustration of class A biasing of the "current mode" amplifier 500, 600, 700 of FIGS. 5A and 5B, 6A and 6B, and 7A and 7B, in accordance with at least one embodiment of the present disclosure. For ideal class A operation of the amplifier 500, 600, 700, as illustrated in FIG. 8, the efficiency of the architecture approaches 50%, neglecting non-ideal losses. Due to the nature of summing output currents of the common source/emitter cells (e.g., the transconducting cells 510a, 510b, 510c, 510d) in RF series, the amplifier architecture is in "current mode", which is in clear distinction from the conventional stacked "voltage mode" amplifiers (e.g., amplifier 100 of FIG. 1 and amplifier 300 of FIG. 3).

The design of matching input network (M1) 520 and matching output network (M2) 530 can follow a traditional matching network design with either lumped elements or transmission line stubs. For example, L number of matching networks can be utilized to form a compact IC area. For higher efficiency applications, the current mode amplifier 500, 600, 700 may adapt the architecture from class A biasing to non-class A biasing by adjusting Vbias appropriately for the given class of operation following conventional amplifier design. In addition, harmonic termination for waveform shaping may be absorbed into the output matching network (M2) 530.

As such, FIGS. 5A and 5B, FIGS. 6A and 6B, and FIGS. 7A and 7B illustrate embodiments for the disclosed single-stage amplifier 500, 600, 700, which has a single-stage power gain, which is denoted by "G" in decibels (dB). The disclosed amplifier 500, 600, 700 improves upon the conventional amplifier designs (e.g., amplifier 100 of FIG. 1 and amplifier 300 of FIG. 3) with several advantages. A first advantage of the disclosed amplifier 500, 600, 700 is that it employs a single-input single-output input matching network (M1) 520 and a single-input single-output output matching network (M2) 530, which can significantly reduce the chip area occupation on an IC, as compared to the conventional amplifier 100 of FIG. 1.

A second advantage of the disclosed amplifier 500, 600, 700 is that any unit element device technology may be used to implement the architecture, such as a FET or BJT. A third advantage of the disclosed amplifier 500, 600, 700 is that there is no reliance on strict gate capacitance matching to maintain voltage swing reliability of device breakdown, as in the conventional amplifier 300 of FIG. 3.

A fourth advantage of the disclosed amplifier 500, 600, 700 is that there is no gate/base leakage path to ground of the cascoded devices, thereby reducing efficiency as in the conventional amplifier 300 of FIG. 3. Finally, a fifth advantage of the disclosed amplifier 500, 600, 700 is that due to the current mode operation, there are no large voltage swings on the devices, thereby improving reliability of body junction breakdown as well as linearity.

A differential embodiment for the disclosed amplifier 900 may be adopted, as is shown in FIGS. 9A and 9B. FIGS. 9A and 9B together are a schematic circuit diagram of the disclosed differential single-stage "current mode" amplifier 900, in accordance with at least one embodiment of the present disclosure.

The disclosed differential single-stage "current mode" amplifier 900, illustrated in FIGS. 9A and 9B, utilizes a cascode stack of N number of differential unit element transconducting cells 910*a*, 910*b*, 910*c*, 910*d*, which each take as an input: a supply current Idc, a differential AC RF current ($I_{RF\_IN}$), and a differential RF input signal ($RF_{IN}$); and produce as an output: DC current (Idc) and differential AC RF current ($I_{RF\_OUT}$). The transconducting cells 910*a*, 910*b*, 910*c*, 910*d* are cascoded in terms of the DC input and output current, such that a common current (Idc) is shared amongst each transconducting cell 910*a*, 910*b*, 910*c*, 910*d*, and a DC supply voltage drop of Vdd/N is across each transconducting cell 910*a*, 910*b*, 910*c*, 910*d*. The transconducting cells 910*a*, 910*b*, 910*c*, 910*d* are cascaded such that each transconducting cell's differential output current ($I_{RF\_OUT}$) is the input to the following cascaded transconducting cell's differential input current ($I_{RF\_IN}$). An input signal source (Vin) (along with a source resistor Rs) is followed by a single-input single-output input matching network (M1) 920, which drives each transconducting cell's $RF_{IN}$ in parallel. The final output current of the last transconducting cell's 910*d* $I_{RF\_OUT}$ is applied to a single-input single-output output matching network (M2) 930 to deliver power to a load impedance $R_L$. Differential-to-single-ended baluns may be used to convert the differential $RF_{IN}$ to a single-ended input and convert a differential $I_{RF\_OUT}$ to a single-ended output.

In one or more embodiments of the present disclosure, the disclosed amplifier (e.g., 900 of FIGS. 9A and 9B, and 1000 of FIGS. 10A, 10B, and 10C) implements each transconducting cell as a differential common source/emitter unit element. The common source/emitter unit element stages each have a RF unit element device that may be implemented in any device technology (e.g., a FET device as in the amplifier 1000 of FIGS. 10A, 10B, and 10C; or a BJT device). FIGS. 10A, 10B, and 10C together are a schematic circuit diagram of the disclosed differential single-stage "current mode" amplifier 1000, with transconductance cells 1010*a*, 1010*b*, 1010*c*, 1010*d* implemented as common-source cells with RF unit element devices each as a MOSFET, and in particular, an NMOS, in accordance with at least one embodiment of the present disclosure.

For the disclosed amplifier 900, 1000, each RF unit element device (e.g., NMOS or BJT) within the common source/emitter element (e.g., the transconducting cells 1010*a*, 1010*b*, 1010*c*, 1010*d*) will have a drain-to-source (or collector-to-emitter) DC voltage of Vdd/N provided by a DC series connection of: power supply Vdd, N number of inductive elements (L∞), and N number of unit element common source/emitter cells (e.g., the transconducting cells 1010*a*, 1010*b*, 1010*c*, 1010*d*) with RF unit element devices (e.g., NMOS or BJT). A common DC current (Idc) is shared through the series connection of power supply (Vdd), N number of inductive elements (L∞), and N number of unit element common source/emitter stages (e.g., the transconducting cells 1010*a*, 1010*b*, 1010*c*, 1010*d*) with RF unit element devices (e.g., NMOS or BJT). The DC bias of each RF unit element device (e.g., NMOS or BJT) is provided by a voltage (VbiasN) and large gate/base biasing resistance (Rb), such that each unit element device can be biased independently insuring a current Idc and nominal division of Vdd voltage across each unit element drain-to-source or collector-to-emitter.

Similarly, the differential version of the disclosed amplifier (e.g., amplifier 900 of FIGS. 9A and 9B, and amplifier 1000 of FIGS. 10A, 10B, and 10C) may be designed in class A or non-class A biasing with a corresponding matching network design, as previously described. The efficiency for the differential architecture for the amplifier 900, 1000 for class A biasing, ideally approaches 50%, while maintaining the architecture advantages of compact simple matching networks (e.g., single-input single-output input matching network (M1) 920 and single-input single-output output matching network (M2) 930) as well as reliability.

A multi-stage embodiment for the disclosed amplifier (e.g., amplifier 500 of FIGS. 5A and 5B) may be adopted, as is shown in FIGS. 11A, 11B and 11C. In particular, FIGS. 11A, 11B, and 11C together are a schematic circuit diagram of the disclosed multi-stage "current mode" amplifier 1100 with M number (in this example, three (3)) of first stage transconducting cells 1110*a*, 1110*b*, 1110*c*, and N number (in this example, three (3)) of second stage transconducting cells 1110*d*, 1110*e*, 1110*f*, where the power supply voltage (Vdd) is applied to the first transconducting cell 1110*a*, in accordance with at least one embodiment of the present disclosure.

The disclosed single-ended multi-stage "current mode" amplifier 1100, illustrated in FIGS. 11A, 11B, and 11C, utilizes as its first stage, a cascode stack of M number of unit element transconducting cells 1110*a*, 1110*b*, 1110*c*, and as its second stage, a cascode stack of N number of unit element transconducting cells 1110*d*, 1110*e*, 1110*f*. Each of the transconducting cells 1110*a*, 1110*b*, 1110*c*, 1110*d*, 1110*e*, 1110*f* takes as an input: a DC supply current (Idc), an AC RF input current ($I_{RF\_IN}$), and a RF input signal ($RF_{IN}$); and produces as an output: the DC current (Idc) and an AC RF output current ($I_{RF\_OUT}$). The transconducting cells 1110*a*, 1110*b*, 1110*c*, 1110*d*, 1110*e*, 1110*f* are cascoded in terms of the DC input and output currents, such that a common current (Idc) is shared amongst each of the transconducting cells 1110*a*, 1110*b*, 1110*c*, 1110*d*, 1110*e*, 1110*f*, and such that a DC supply voltage drop of Vdd/(M+N) is across each of the transconducting cells 1110*a*, 1110*b*, 1110*c*, 1110*d*, 1110*e*, 1110*f*. The transconducting cells 1110*a*, 1110*b*, 1110*c*, 1110*d*, 1110*e*, 1110*f* within each stage (e.g., stage 1 and stage 2) are cascaded such that each transconducting cell's output current ($I_{RF\_OUT}$) is the input to the following cascaded transconducting cell's input current ($I_{RF\_IN}$).

An input signal source (Vin) (along with a source resistor Rs) is followed by a single-input single-output input matching network (M1) 1120, which drives each transconducting cell's RF input signal ($RF_{IN}$) in parallel of the first stage transconducting cells 1110*a*, 1110*b*, 1110*c*. The output current of the last transconducting cell's 1110*c* $I_{RF\_OUT}$ of the first stage is applied to a single-input single-output inner stage matching network (M2) 1125 to deliver power to the second stage. The output current ($I_{RF\_OUT}$) of the final stage of the amplifier 1100 is followed by a single-input single-output output matching network (M3) 1130 to deliver power to a load resistor (RL). It should be apparent that, in one or more embodiments, the preceding embodiment description might be extended to a multi-stage amplifier having more than two stages, with each stage having an independently defined number of transconducting cells.

It should be noted that, in one or more embodiments, each of the transconducting cells 1110*a*, 1110*b*, 1110*c*, 1110*d*, 1110*e*, 1110*f* of the amplifier 1100 may comprise a MOSFET device (e.g., refer to transconductance cell 610*a* of FIG. 6A) or comprise a BJT device (e.g., refer to transconductance cell 710*a* of FIG. 7A). In addition, in one or more embodiments, the amplifier 1100 of FIGS. 11A, 11B, and 11C may be configured to be a differential amplifier (e.g., refer to amplifier 900 of FIGS. 9A and 9B).

FIGS. 12A, 12B, and 12C together are a schematic circuit diagram of the disclosed multi-stage "current mode" amplifier 1200 with M number (in this example, three (3)) of first stage transconducting cells 1210*a*, 1210*b*, 1210*c*, and N number (in this example, three (3)) of second stage transconducting cells 1210*d*, 1210*e*, 1210*f*, where the power supply voltage (Vdd) is applied to a transconducting cell 1210*d* other than the first transconducting cell 1210*a*, in accordance with at least one embodiment of the present disclosure.

Also in this example, an input signal source (Vin) (along with a source resistor Rs) is followed by a single-input single-output input matching network (M1) 1220, which drives each transconducting cell's RF input signal (RF$_{IN}$) in parallel of the first stage transconducting cells 1210*a*, 1210*b*, 1210*c*. The output current of the last transconducting cell's 1210*c* I$_{RF\_OUT}$ of the first stage is applied to a single-input single-output inner stage matching network (M2) 1225 to deliver power to the second stage. The output current (I$_{RF\_OUT}$) of the final stage of the amplifier 1200 is followed by a single-input single-output output matching network (M3) 1230 to deliver power to a load resistor (RL).

The amplifier 1200 of FIGS. 12A, 12B, and 12C maintains the same DC current (Idc) and RF signal flow as the amplifier 1100 of FIGS. 11A, 11B, and 11C, with the exception of the location of the supply voltage (Vdd). The supply voltage (Vdd) need not necessarily originate from the first transconducting unit cell 1210*a* of the first stage, but may originate at any transconducting cell 1210*a*, 1210*b*, 1210*c*, 1210*d*, 1210*e*, 1210*f* of any stage (e.g., stage 1 or stage 2). For illustration, the amplifier 1200 in FIGS. 12A, 12B, and 12C depicts a two-stage amplifier 1200 with the power supply voltage (Vdd) originating from the first transconducting cell 1210*d* of the second stage, and the DC current from the second stage supplies the DC current of the first stage.

It should be noted that, in one or more embodiments, each of the transconducting cells 1210*a*, 1210*b*, 1210*c*, 1210*d*, 1210*e*, 1210*f* of the amplifier 1200 may comprise a MOSFET device (e.g., refer to transconductance cell 610*a* of FIG. 6A) or comprise a BJT device (e.g., refer to transconductance cell 710*a* of FIG. 7A). In addition, in one or more embodiments, the amplifier 1200 of FIGS. 12A, 12B, and 12C may be configured to be a differential amplifier (e.g., refer to amplifier 900 of FIGS. 9A and 9B).

FIGS. 13 to 16C are schematic circuit diagrams of the disclosed single-ended single-stage "current mode" amplifiers 1300, 1400, 1410, 1420, 1430, 1500, 1510, 1520, 1530, 1600, 1610, 1620 of FIGS. 13 to 16C, in accordance with various embodiments of the present disclosure. In particular, the schematic circuit diagrams of FIGS. 13 to 16C show the various different connection configurations (e.g., in parallel and/or in cascade) that may be employed for the disclosed single-ended single-stage "current mode" amplifier 1300, 1400, 1410, 1420, 1430, 1500, 1510, 1520, 1530, 1600, 1610, 1620.

FIG. 13 is a schematic circuit diagram of the disclosed single-ended single-stage "current mode" amplifier 1300, where the transconducting cells 1310*a*, 1310*b*, 1310*c*, 1310*d* are connected together in parallel (i.e. "parallel connection") for the radio frequency (RF) input signal (RF$_{IN}$) and are connected together in parallel (i.e. "parallel connection") for the alternating current (AC) RF output currents (I$_{RF\_OUT}$), in accordance with at least one embodiment of the present disclosure.

In FIG. 13, the amplifier 1300 is shown to comprise N number of transconducting cells 1310*a*, 1310*b*, 1310*c*, 1310*d*. An exemplary transconducting cell 1310 that may be employed for the transconducting cells 1310*a*, 1310*b*, 1310*c*, 1310*d* of the amplifier 1300 is shown in FIG. 17. It should be noted that, in one or more embodiments, each of the transconducting cells 1310*a*, 1310*b*, 1310*c*, 1310*d* of the amplifier 1300 may comprise a MOSFET device (e.g., refer to transconductance cell 1310 of FIG. 17) or comprise a BJT device (e.g., refer to transconductance cell 710*a* of FIG. 7A).

During operation of the amplifier 1300, a power supply voltage (Vdd) is split evenly amongst the transconducting cells 1310*a*, 1310*b*, 1310*c*, 1310*d* to power the transconducting cells 1310*a*, 1310*b*, 1310*c*, 1310*d*. A DC supply voltage drop of Vdd/N (where N is the number of the transconducting cells 1310*a*, 1310*b*, 1310*c*, 1310*d*) is across each of the transconducting cells 1310*a*, 1310*b*, 1310*c*, 1310*d*. The transconducting cells 1310*a*, 1310*b*, 1310*c*, 1310*d* are connected together in DC cascode, sharing a common DC supply current (Idc).

An input signal source (Vin) provides an RF input signal (RF$_{IN}$) to an input matching network (M1) 1320. In one or more embodiments, the input matching network (M1) 1320 is a single-input single-output matching network. The input matching network (M1) 1320 transforms the RF input signal (RF$_{IN}$) to provide a power match to an input of each of the transconducting cells 1310*a*, 1310*b*, 1310*c*, 1310*d*.

As such, a DC supply current (Idc), an RF input signal (RF$_{IN}$), as well as an AC RF input current (I$_{RF\_IN}$) are inputted into each of the transconducting cells 1310*a*, 1310*b*, 1310*c*, 1310*d*. Each of the transconducting cells 1310*a*, 1310*b*, 1310*c*, 1310*d* outputs the DC supply current (Idc) as well as an AC RF output current (I$_{RF\_OUT}$) (i.e. irf). The AC RF output currents (I$_{RF\_OUT}$) (irf) combine to create a combined current (N·irf).

The AC RF output currents (I$_{RF\_OUT}$) (irf) outputted from the transconducting cells (i.e. as a combined current (N·irf)) is inputted into an output matching network (M2) 1330 to deliver power to a load impedance (R$_L$). The output matching network (M2) transforms the combined current (N·irf) into the load impedance (R$_L$). In one or more embodiments, the output matching network (M2) 1330 is a single-input single-output matching network.

Also in FIG. 13, a DC blocking capacitor (C∞) that passes an RF signal is placed at the RF input and RF output of each of the transconducting cells 1310*a*, 1310*b*, 1310*c*, 1310*d*. These DC blocking capacitors (C∞) provide DC isolation between the inputs and outputs of the connections of the transconducting cells 1310*a*, 1310*b*, 1310*c*, 1310*d*.

FIGS. 14A to 14E are schematic circuit diagrams of the disclosed single-ended single-stage "current mode" amplifiers 1400, 1410, 1420, 1430, where the transconducting cells 1310*a*, 1310*b*, 1310*c*, 1310*d* are connected together in parallel for the RF input signal (RF$_{IN}$) and are connected together in cascade for the AC RF output currents (I$_{RF\_OUT}$), in accordance with various embodiments of the present disclosure. It should be noted that the amplifiers 1400, 1410, 1420, 1430 shown in FIGS. 14A to 14E are essentially the same as the amplifier 1300 of FIG. 13, except that for the amplifiers 1400, 1410, 1420, 1430 of FIGS. 14A to 14E, the transconducting cells 1310*a*, 1310*b*, 1310*c*, 1310*d* are connected together in cascade (instead of connected together in parallel, as the amplifier 1300 of FIG. 13) for the AC RF output currents (I$_{RF\_OUT}$). For the cascade connection in FIGS. 14A to 14E, the AC RF output current (I$_{RF\_OUT}$) (irf) of each of the transconducting cells 1310*a*, 1310*b*, 1310*c*, 1310*d* is summed together in cascade to form a combined current (N·irf).

In particular, the schematic circuit diagrams of FIGS. 14A to 14E show various different connection configurations for the connection of the output matching network (M2) 1330 to an output junction of one of the transconducting cells 1310*a*,

1310b, 1310c, 1310d. As such, the output matching network (M2) 1330 may be placed at any location at the "cascade connection" of the output of the cascade network. For example, FIG. 14A is a schematic circuit diagram of the disclosed single-ended single-stage "current mode" amplifier 1400, where the transconducting cells 1310a, 1310b, 1310c, 1310d are connected together in parallel for the RF input signal ($RF_{IN}$) and are connected together in cascade for the AC RF output currents ($I_{RF\_OUT}$), and where the output matching network (M2) 1330 is connected to an output junction of a first transconducting cell 1310a, in accordance with at least one embodiment of the present disclosure. It should be noted that the amplifier 1400 of FIG. 14A is equivalent to the amplifier 500 of FIGS. 5A and 5B; however, with the distinction that the output matching network (M2) (e.g., refer to 1330 of FIG. 14A) may be placed at the location of the RF output junction of the first transconducting cell (e.g., transconducting cell 1310a of FIG. 14A) as opposed to the RF output junction of the last transconducting cell (e.g., transconducting cell 510d of FIG. 5B, or transconducting cell 1310d of FIG. 14A).

FIGS. 14B to 14D show the output matching network (M2) 1330 connected to an output junction of various different transconducting cells 1310b, 1310c, 1310d than to the output junction of the first transconducting cell 1310a, as is shown in FIG. 14A. For example, FIG. 14B shows a schematic circuit diagram of the disclosed single-ended single-stage "current mode" amplifier, where the transconducting cells 1310a, 1310b, 1310c, 1310d are connected together in parallel for the RF input signal ($RF_{IN}$) and are connected together in cascade for the AC RF output currents ($I_{RF\_OUT}$), and where the output matching network (M2) 1330 is connected to an output junction of a second transconducting cell 1310b, in accordance with at least one embodiment of the present disclosure. In addition, FIG. 14C illustrates a schematic circuit diagram of the disclosed single-ended single-stage "current mode" amplifier, where the transconducting cells 1310a, 1310b, 1310c, 1310d are connected together in parallel for the RF input signal ($RF_{IN}$) and are connected together in cascade for the AC RF output currents ($I_{RF\_OUT}$), and where the output matching network (M2) 1330 is connected to an output junction of a third transconducting cell 1310c, in accordance with at least one embodiment of the present disclosure. Also, FIG. 14D is a schematic circuit diagram of the disclosed single-ended single-stage "current mode" amplifier, where the transconducting cells 1310a, 1310b, 1310c, 1310d are connected together in parallel for the RF input signal ($RF_{IN}$) and are connected together in cascade for the AC RF output currents ($I_{RF\_OUT}$), and where the output matching network (M2) 1330 is connected to an output junction of a last transconducting cell 1310d, in accordance with at least one embodiment of the present disclosure.

FIG. 14E is an exemplary detailed circuit diagram 1440 of the amplifier 1430 shown in FIG. 14D, in accordance with at least one embodiment of the present disclosure. In particular, FIG. 14E is an implementation of the cascade current mode amplifier 1430 comprising transconducting cells 1310a, 1310b, 1310c employing NMOS devices.

FIGS. 15A to 15D are schematic circuit diagrams of the disclosed single-ended single-stage "current mode" amplifiers 1500, 1510, 1520, 1530, where the transconducting cells 1310a, 1310b, 1310c, 1310d are connected together in cascade for the RF input signal ($RF_{IN}$) and are connected together in parallel for the AC RF output currents ($I_{RF\_OUT}$), in accordance with various embodiments of the present disclosure. It should be noted that the amplifiers 1500, 1510, 1520, 1530 shown in FIGS. 15A to 15D are essentially the same as the amplifier 1300 of FIG. 13, except that for the amplifiers 1500, 1510, 1520, 1530 of FIGS. 15A to 15D, the transconducting cells 1310a, 1310b, 1310c, 1310d are connected together in cascade (instead of connected together in parallel, as the amplifier 1300 of FIG. 13) for the RF input signal ($RF_{IN}$).

In particular, the schematic circuit diagrams of FIGS. 15A to 15D show various different connection configurations for the connection of the input matching network (M1) 1320 to an input junction of one of the transconducting cells 1310a, 1310b, 1310c, 1310d. As such, the input matching network (M1) 1320 may be placed at any location at the "cascade connection" of the input of the cascade network. For example, FIG. 15A is a schematic circuit diagram of the disclosed single-ended single-stage "current mode" amplifier 1500, where the transconducting cells 1310a, 1310b, 1310c, 1310d are connected together in cascade for the RF input signal ($RF_{IN}$) and are connected together in parallel for the AC RF output currents ($I_{RF\_OUT}$), and where the input matching network (M1) 1320 is connected to an input junction of a first transconducting cell 1310a, in accordance with at least one embodiment of the present disclosure.

FIGS. 15B to 15D show the input matching network (M1) 1320 connected to an input junction of various different transconducting cells 1310b, 1310c, 1310d than to the input junction of the first transconducting cell 1310a, as is shown in FIG. 15A. For example, FIG. 15B shows a schematic circuit diagram of the disclosed single-ended single-stage "current mode" amplifier 1510, where the transconducting cells 1310a, 1310b, 1310c, 1310d are connected together in cascade for the RF input signal ($RF_{IN}$) and are connected together in parallel for the AC RF output currents ($I_{RF\_OUT}$), and where the input matching network (M1) 1320 is connected to an input junction of a second transconducting cell 1310b, in accordance with at least one embodiment of the present disclosure. Also, FIG. 15C illustrates a schematic circuit diagram of the disclosed single-ended single-stage "current mode" amplifier 1520, where the transconducting cells 1310a, 1310b, 1310c, 1310d are connected together in cascade for the RF input signal ($RF_{IN}$) and are connected together in parallel for the AC RF output currents ($I_{RF\_OUT}$), and where the input matching network (M1) 1320 is connected to an input junction of a third transconducting cell 1310c, in accordance with at least one embodiment of the present disclosure. In addition, FIG. 15D shows a schematic circuit diagram of the disclosed single-ended single-stage "current mode" amplifier 1530, where the transconducting cells 1310a, 1310b, 1310c, 1310d are connected together in cascade for the RF input signal ($RF_{IN}$) and are connected together in parallel for the AC RF output currents ($I_{RF\_OUT}$), and where the input matching network (M1) 1320 is connected to an input junction of a last transconducting cell 1310d, in accordance with at least one embodiment of the present disclosure.

FIGS. 16A to 16C are schematic circuit diagrams of the disclosed single-ended single-stage "current mode" amplifiers 1600, 1610, 1620, where the transconducting cells 1310a, 1310b, 1310c, 1310d are connected together in cascade for the RF input signal ($RF_{IN}$) and are connected together in cascade for the AC RF output currents ($I_{RF\_OUT}$), in accordance with various embodiments of the present disclosure. It should be noted that the amplifiers 1600, 1610, 1620 shown in FIGS. 16A to 16C are essentially the same as the amplifier 1300 of FIG. 13, except that for the amplifiers 1600, 1610, 1620 of FIGS. 16A to 16C, the transconducting cells 1310a, 1310b, 1310c, 1310d are connected together in cascade (instead of connected together in parallel, as the amplifier 1300 of FIG. 13) for the RF input signal (RF$_{IN}$), and are connected together in cascade (instead of connected together in parallel, as the amplifier 1300 of FIG. 13) for the AC RF output currents (I$_{RF\_OUT}$). For the output cascade connection in FIGS. 16A to 16C, the AC RF output current (I$_{RF\_OUT}$) (irf) of each of the transconducting cells 1310*a*, 1310*b*, 1310*c*, 1310*d* is summed together in cascade to form a combined current (N·irf).

In particular, the schematic circuit diagrams of FIGS. 16A to 16C show various different connection configurations for the connection of the input matching network (M1) 1320 to an input junction of one of the transconducting cells 1310*a*, 1310*b*, 1310*c*, 1310*d*, and shows various different configuration connections for the connection of the output matching network (M2) 1330 to the output junction of one of the transconducting cells 1310*a*, 1310*b*, 1310*c*, 1310*d*. It should be noted that FIGS. 16A to 16C merely illustrate some (not all) of the possible connection configurations. As such, the input matching network (M1) 1320 may be placed at any location at the "cascade connection" of the input of the cascade network. And, the output matching network (M2) 1330 may be placed at any location at the "cascade connection" of the output of the cascade network. For example, FIG. 16A is a schematic circuit diagram of the disclosed single-ended single-stage "current mode" amplifier 1600, where the transconducting cells 1310*a*, 1310*b*, 1310*c*, 1310*d* are connected together in cascade for the RF input signal (RF$_{IN}$) and are connected together in cascade for the AC RF output currents (I$_{RF\_OUT}$), and where the input matching network (M1) 1320 is connected to an input junction of a first transconducting cell 1310*a* and the output matching network (M2) 1330 is connected to an output junction of a last transconducting cell 1310*d*, in accordance with at least one embodiment of the present disclosure.

FIGS. 16B and 16C show the input matching network (M1) 1320 connected to an input junction of various different transconducting cells 1310*b*, 1310*d* than to the input junction of the first transconducting cell 1310*a*, as is shown in FIG. 16A. Also, FIGS. 16B and 16C show the output matching network (M2) 1330 connected to an output junction of various different transconducting cells 1310*a*, 1310*b* than to the output junction of the last transconducting cell 1310*d*, as is shown in FIG. 16A. For example, FIG. 16B shows a schematic circuit diagram of the disclosed single-ended single-stage "current mode" amplifier 1610, where the transconducting cells 1310*a*, 1310*b*, 1310*c*, 1310*d* are connected together in cascade for the RF input signal (RF$_{IN}$) and are connected together in cascade for the AC RF output currents (I$_{RF\_OUT}$), and where the input matching network (M1) 1320 is connected to an input junction of a second transconducting cell 1310*b* and the output matching network (M2) 1330 is connected to an output junction of the second transconducting cell 1310*b*, in accordance with at least one embodiment of the present disclosure. Also, FIG. 16C illustrates a schematic circuit diagram of the disclosed single-ended single-stage "current mode" amplifier 1620, where the transconducting cells 1310*a*, 1310*b*, 1310*c*, 1310*d* are connected together in cascade for the RF input signal (RF$_{IN}$) and are connected together in cascade for the AC RF output currents (I$_{RF\_OUT}$), and where the input matching network (M1) 1320 is connected to an input junction of a last transconducting cell 1310*d* and the output matching network (M2) 1330 is connected to an output junction of the first transconducting cell 1310*a*, in accordance with at least one embodiment of the present disclosure.

FIG. 17 is a schematic circuit diagram showing an exemplary transconducting cell 1310 that may be employed for the transconducting cells 1310*a*, 1310*b*, 1310*c*, 1310*d* of the disclosed single-ended single-stage "current mode" amplifiers 1300, 1400, 1410, 1420, 1430, 1500, 1510, 1520, 1530, 1600, 1610, 1620 of FIGS. 13 to 16C, where the transconductance cells are implemented as common-source cells with RF unit element devices as MOSFET, and in particular, an n-channel MOSFET (NMOS), in accordance with at least one embodiment of the present disclosure. It should be noted that the although the transconducting cell 1310 is shown to employ an NMOS device T1, the transconducting cell 1310 may be implemented with any transconducting transistor technology, such as a CMOS, Silicon Germanium (SiGe), or other III-V semiconductor device technology.

In FIG. 17, the drain of the device T1 contains an RF choking element (L∞), and may be implemented by an inductor or transmission line. The drain also contains an input RF port and an output RF port (which happen to be on the same node). A DC gate bias is provided by a biasing resistor (Rb). The source of the device T1 is an RF short created by a shunt large capacitor (C∞). A DC supply current flows through the drain-to-source of value Idc.

FIG. 18 is a flow chart showing the disclosed method 1800 for operation of the disclosed single-ended single-stage "current mode" amplifiers 1300, 1400, 1410, 1420, 1430, 1500, 1510, 1520, 1530, 1600, 1610, 1620 of FIGS. 13 to 16C, in accordance with at least one embodiment of the present disclosure. At the start 1810 of the method 1800, an input signal source (Vin) provides an RF input signal (RF$_{IN}$) to an input matching network (M1) 1820. The input matching network (M1) transforms the RF input signal (RF$_{IN}$) to provide a power match to an input of each of the transconducting cells of a plurality of transconducting cells 1830.

A power supply voltage (Vdd) is split evenly amongst the transconducting cells to power the transconducting cells; where a direct current (DC) supply voltage drop of Vdd/N, where N is a number of the transconducting cells, is across each of the transconducting cells 1840.

A DC supply current (Idc), an alternating current (AC) radio frequency (RF) input current (I$_{RF\_IN}$), and the RF input signal (RF$_{IN}$) are inputted into each of the transconducting cells 1850. The DC supply current (Idc) and an AC RF output current (I$_{RF\_OUT}$) are outputted by each of the transconducting cells, where each of the transconducting cells are connected together in cascode for the DC supply current (Idc), are connected together in parallel (or in cascade) for the RF input signal (RF$_{IN}$), and are connected together in parallel (or in cascade) for the AC RF output currents (I$_{RF\_OUT}$) 1860.

The AC RF output current (I$_{RF\_OUT}$) outputted from the transconducting cells is inputted into an output matching network (M2) to deliver power to a load impedance (R$_L$) 1870. Then, the method 1800 ends 1880.

FIG. 19 is a schematic circuit diagram of the disclosed multi-stage "current mode" amplifier 1900 with M number of first stage transconducting cells 1970*a*, 1970*b*, 1970*c*, 1970*d*, and N number of second stage transconducting cells 1970*e*, 1970*f*, 1970*g*, 1970*h*, where the transconducting cells 1970*a*, 1970*b*, 1970*c*, 1970*d* in the first stage and the transconducting cells 1970*e*, 1970*f*, 1970*g*, 1970*h* in the second stage are connected together in parallel (or in cascade) 1950*a*, 1950*b* for the RF input signal (RF$_{IN}$), and are connected together in parallel (or in cascade) 1960*a*, 1960*b* for the AC RF output currents (I$_{RF\_OUT}$), in accordance with at least one embodiment of the present disclosure. In particular, FIG. 19 illustrates a multi-stage (e.g., a two stage)

current mode amplifier 1900 in which the DC bias current (Idc) is shared between the two stages (i.e. the first stage and the second stage). A power supply voltage (Vdd) is supplied to the first stage. The input and output splitting and combining networks 1950a, 1960a, 1950b, 1960b of each stage may be either a cascade connection or a parallel connection. An inner stage matching network (M2) 1930 is employed between the stages (i.e. the first stage and the second stage). It should be noted that although FIG. 19 shows the multi-stage "current mode" amplifier 1900 comprising a total of two stages, in one or more embodiments, the disclosed multi-stage "current mode" amplifier may comprise more than two stages, as is shown in FIG. 19.

In the multi-stage "current mode" amplifier 1900 of FIG. 19, the first stage and the second stage may each be implemented with any of the exemplary single-stage amplifiers 1300, 1400, 1410, 1420, 1430, 1500, 1510, 1520, 1530, 1600, 1610, 1620 shown in FIGS. 13 to 16C. Also, in one or more embodiments, the transconducting cells 1970a, 1970b, 1970c, 1970d, 1970e, 1970f, 1970g, 1970h of the multi-stage amplifier 1900 may each be implemented with the exemplary transconducting cell 1310 of FIG. 17, or may alternatively employ any other transconducting transistor technology other than an NMOS device technology as is shown in FIG. 17, including, but not limited to a CMOS, Silicon Germanium (SiGe), or other III-V semiconductor device technology. It should be noted that, in one or more embodiments, each of the transconducting cells 1970a, 1970b, 1970c, 1970d, 1970e, 1970f, 1970g, 1970h of the amplifier 1900 may comprise a MOSFET device (e.g., refer to transconductance cell 1310 of FIG. 17) or comprise a BJT device (e.g., refer to transconductance cell 710a of FIG. 7A).

During operation of the amplifier 1900, a power supply voltage (Vdd) (e.g., refer to FIG. 13) is split evenly amongst the transconducting cells 1970a, 1970b, 1970c, 1970d, 1970e, 1970f, 1970g, 1970h of the first stage and the second stage to power the transconducting cells 1970a, 1970b, 1970c, 1970d, 1970e, 1970f, 1970g, 1970h of the first stage and the second stage. A DC supply voltage drop of Vdd/N (where N is the number of the transconducting cells 1970a, 1970b, 1970c, 1970d, 1970e, 1970f, 1970g, 1970h of the first stage and the second stage) is across each of the transconducting cells 1970a, 1970b, 1970c, 1970d, 1970e, 1970f, 1970g, 1970h of the first stage and the second stage. The transconducting cells 1970a, 1970b, 1970c, 1970d, 1970e, 1970f, 1970g, 1970h of the first stage and the second stage are connected together in DC cascode, sharing a common DC supply current (Idc).

An input signal source (Vin) provides an RF input signal ($RF_{IN}$) to an input matching network (M1) 1920. In one or more embodiments, the input matching network (M1) 1920 is a single-input single-output matching network. The input matching network (M1) 1920 transforms the RF input signal ($RF_{IN}$) to provide a power match to an input of each of the transconducting cells 1970a, 1970b, 1970c, 1970d of the first stage.

As such, a DC supply current (Idc), an RF input signal ($RF_{IN}$), as well as an AC RF input current ($I_{RF\_IN}$) are inputted into each of the transconducting cells 1970a, 1970b, 1970c, 1970d of the first stage. Each of the transconducting cells 1970a, 1970b, 1970c, 1970d of the first stage outputs the DC supply current (Idc) as well as an AC RF output current ($I_{RF\_OUT}$) (i.e. irf). The AC RF output currents ($I_{RF\_OUT}$) (irf) combine to create a combined current (N·irf).

The AC RF output currents ($I_{RF\_OUT}$) (irf) outputted (i.e. as a combined current (N·irf)) from at least one of the transconducting cells 1970a, 1970b, 1970c, 1970d of the first stage is inputted into an inner stage matching network (M2) 1930 to power the transconducting cells 1970e, 1970f, 1970g, 1970h of the second stage. In one or more embodiments, the inner stage matching network (M2) 1930 is a single-input single-output matching network. The inner stage matching network (M2) 1930 transforms the combined current (N·irf) to provide a power match to an input of each of the transconducting cells 1970e, 1970f, 1970g, 1970h of the second stage.

As such, a DC supply current (Idc), an RF input signal ($RF_{IN}$), as well as an AC RF input current ($I_{RF\_IN}$) are inputted into each of the transconducting cells 1970e, 1970f, 1970g, 1970h of the second stage. Each of the transconducting cells 1970e, 1970f, 1970g, 1970h of the second stage outputs the DC supply current (Idc) as well as an AC RF output current ($I_{RF\_OUT}$) (i.e. irf). The AC RF output currents ($I_{RF\_OUT}$) (irf) combine to create a combined current (N·irf).

The AC RF output currents ($I_{RF\_OUT}$) (irf) outputted (i.e. as a combined current (N·irf)) from at least one of the transconducting cells 1970e, 1970f, 1970g, 1970h of the second stage is inputted into an outer stage matching network (M3) 1940 to deliver power to a load ($R_L$). In one or more embodiments, the outer stage matching network (M3) 1940 is a single-input single-output matching network.

FIGS. 20A and 20B together are a flow chart showing the disclosed method 2000 for operation of the disclosed multi-stage "current mode" amplifier 1900 of FIG. 19, in accordance with at least one embodiment of the present disclosure. At the start 2010 of the method 2000, an input signal source (Vin) provides an RF input signal ($RF_{IN}$) to an input matching network (M1) 2020. The input matching network (M1) transforms the RF input signal ($RF_{IN}$) to provide a power match to an input of each of the transconducting cells of a plurality of transconducting cells of a first stage 2030.

A power supply voltage (Vdd) is split evenly amongst the transconducting cells of the first stage and of a second stage to power the transconducting cells of the first stage and the second stage; where a direct current (DC) supply voltage drop of Vdd/N, where N is a number of the transconducting cells in the first stage and in the second stage, is across each of the transconducting cells in the first stage and the second stage 2040.

A DC supply current (Idc), an alternating current (AC) radio frequency (RF) input current ($I_{RF\_IN}$), and the RF input signal ($RF_{IN}$) are inputted into each of the transconducting cells of the first stage 2050. The DC supply current (Idc), the AC RF input current ($I_{RF\_IN}$), and the RF input signal ($RF_{IN}$) are inputted into each of the transconducting cells of the second stage 2060.

The DC supply current (Idc) and an AC RF output current ($I_{RF\_OUT}$) are outputted by each of the transconducting cells of the first stage, where each of the transconducting cells of the first stage are connected together in cascode for the DC supply current (Idc), are connected together in parallel (or in cascade) for the RF input signal ($RF_{IN}$), and are connected together in parallel (or in cascade) for the AC RF output currents ($I_{RF\_OUT}$) 2070.

The DC supply current (Idc) and an AC RF output current ($I_{RF\_OUT}$) are outputted by each of the transconducting cells of the second stage, where each of the transconducting cells of the second stage are connected together in cascode for the DC supply current (Idc), are connected together in parallel (or in cascade) for the RF input signal ($RF_{IN}$), and are connected together in parallel (or in cascade) for the AC RF output currents ($I_{RF\_OUT}$) 2080.

The AC RF output current ($I_{RF\_OUT}$) outputted from at least one of the transconducting cells of the first stage is inputted into an inner stage matching network (M2) to deliver power to the transconducting cells of the second stage 2090. The AC RF output current ($I_{RF\_OUT}$) outputted from at least one of the transconducting cells of the second stage is inputted into an output matching network (M3) to delivery power to a load ($R_L$) 2095. Then, the method 2000 ends 2098.

FIG. 21 is a schematic circuit diagram showing an exemplary circuit 2100 that may be employed for the disclosed multi-stage "current mode" amplifier, in accordance with at least one embodiment of the present disclosure. In particular, the circuit 2100 of FIG. 21 is an implementation of a multi-stage power amplifier in which the first stage comprises a common-emitter amplifier, and the second stage comprises a parallel input/parallel output current mode amplifier (e.g., refer to amplifier 1300 of FIG. 13). The circuit 2100 is shown to comprises an input matching network (M1) 2120, an inner stage matching network (M2) 2130, and an output matching network (M3) 2140. Also, the first stage is shown to comprise a single transconducting device T1 (e.g., in the form of a BJT transistor), and the second stage is shown to comprise two transconducting devices T2 and T3 (e.g., in the form of BJT transistors). As with the amplifier 1900 of FIG. 19, a DC supply current (Idc) is shared between the stages (i.e. the first stage and the second stage), and an inner matching network 2130 is utilized between the stages.

FIG. 22A is a graph 2200 showing simulation results of collector current (Ic) versus collector-emitter voltage (Vce) of the transistor T1 of the first stage of the multi-stage "current mode" amplifier of FIG. 21, in accordance with at least one embodiment of the present disclosure. The graph 2200 shows the load line plot of swept input power (Pin) of the Ic versus Vce of the T1 device. The curve illustrates the output voltage across the T1 device stays below the unsafe region of operation (i.e. the device breakdown region) 2205.

FIG. 22B is a graph 2210 showing simulation results of Ic/Vce versus time (in picoseconds (psec)) of the transistor T1 of the first stage of the multi-stage "current mode" amplifier of FIG. 21, in accordance with at least one embodiment of the present disclosure. Graph 2210 is a time domain plot of the Vce voltage and Ic current across the T1 device. The graph 2210 illustrates that the voltage across the T1 device stays below the unsafe region of operation 2215.

FIG. 23A is a graph 2300 showing simulation results of Ic versus Vce of the top transistor T2 of the second stage of the multi-stage "current mode" amplifier of FIG. 21, in accordance with at least one embodiment of the present disclosure. Graph 2300 shows the load line plot of swept input power (Pin) of the Ic versus Vce of the T2 device. The curve illustrates the output voltage across the T2 device stays below the unsafe region of operation (i.e. the device breakdown region) 2305.

FIG. 23B is a graph 2310 showing simulation results of Ic/Vce versus time (psec) of the top transistor T2 of the second stage of the multi-stage "current mode" amplifier of FIG. 21, in accordance with at least one embodiment of the present disclosure. The graph 2310 is a time domain plot of the Vce voltage and Ic current across the T2 device. The graph 2310 illustrates that the voltage across the T2 device stays below the unsafe region of operation 2315.

FIG. 24A is a graph 2400 showing simulation results of Ic versus Vce of the bottom transistor T3 of the second stage of the multi-stage "current mode" amplifier of FIG. 21, in accordance with at least one embodiment of the present disclosure. The graph 2400 shows the load line plot of swept input power (Pin) of the Ic versus Vce of the T3 device. The curve illustrates the output voltage across the T3 device stays below the unsafe region of operation (i.e. the device breakdown region) 2405.

FIG. 24B is a graph 2410 showing simulation results of Ic/Vce versus time (psec) of the bottom transistor T3 of the second stage of the multi-stage "current mode" amplifier of FIG. 21, in accordance with at least one embodiment of the present disclosure. Graph 2410 is a time domain plot of the Vce voltage and Ic current across the T3 device. The graph 2410 illustrates that the voltage across the T3 device stays below the unsafe region of operation 2415.

FIG. 25 is a graph 2500 showing simulation results of output current density (Ice) verses Vce versus input power (Pin) of the transistors T2 and T3 of the second stage of the multi-stage "current mode" amplifier of FIG. 21, in accordance with at least one embodiment of the present disclosure. Graph 2500 illustrates that the device output current density (Ice) stays below the unsafe region of operation 2510 of the devices T2 and T3.

Although particular embodiments have been shown and described, it should be understood that the above discussion is not intended to limit the scope of these embodiments. While embodiments and variations of the many aspects of the invention have been disclosed and described herein, such disclosure is provided for purposes of explanation and illustration only. Thus, various changes and modifications may be made without departing from the scope of the claims.

Where methods described above indicate certain events occurring in certain order, those of ordinary skill in the art having the benefit of this disclosure would recognize that the ordering may be modified and that such modifications are in accordance with the variations of the present disclosure. Additionally, parts of methods may be performed concurrently in a parallel process when possible, as well as performed sequentially. In addition, more steps or less steps of the methods may be performed.

Accordingly, embodiments are intended to exemplify alternatives, modifications, and equivalents that may fall within the scope of the claims.

Although certain illustrative embodiments and methods have been disclosed herein, it can be apparent from the foregoing disclosure to those skilled in the art that variations and modifications of such embodiments and methods can be made without departing from the true spirit and scope of this disclosure. Many other examples exist, each differing from others in matters of detail only. Accordingly, it is intended that this disclosure be limited only to the extent required by the appended claims and the rules and principles of applicable law.

We claim:

1. A method for operation of a high-voltage multi-stage signal amplifier, the method comprising:
    inputting, into each transconducting cell of a plurality of transconducting cells of a first stage, a direct current (DC) supply current (Idc), an alternating current (AC) radio frequency (RF) input current ($I_{RF\_IN}$), and an RF input signal ($RF_{IN}$);
    inputting, into each transconducting cell of a plurality of transconducting cells of a second stage, the DC supply current (Idc), the AC RF input current ($I_{RF\_IN}$), and the RF input signal ($RF_{IN}$);

outputting, by each of the transconducting cells of the plurality of transconducting cells of the first stage, the DC supply current (Idc) and an AC RF output current ($I_{RF\_OUT}$); and outputting, by each of the transconducting cells of the plurality of transconducting cells of the second stage, the DC supply current (Idc) and the AC RF output current ($I_{RF\_OUT}$), wherein the transconducting cells of the first stage are connected together in cascode for the DC supply current (Idc), are connected together in parallel or in cascade for the RF input signal ($RF_{IN}$), and are connected together in parallel or in cascade for the AC RF output currents ($I_{RF\_OUT}$), wherein the transconducting cells of the second stage are connected together in cascode for the DC supply current (Idc), are connected together in parallel or in cascade for the RF input signal ($RF_{IN}$), and are connected together in parallel or in cascade for the AC RF output currents ($I_{RF\_OUT}$), and wherein the first stage and the second stage are connected together in cascode for the DC supply current.

2. The method of claim 1, wherein the method further comprises splitting a power supply voltage (Vdd) evenly amongst the transconducting cells of the first stage and the second stage to power the transconducting cells of the first stage and the second stage.

3. The method of claim 2, wherein a DC supply voltage drop of Vdd/N, where N is a number of the transconducting cells of the first stage and the second stage, is across each of the transconducting cells of the first stage and the second stage.

4. The method of claim 1, wherein the method further comprises providing, by an input signal source (Vin), the RF input signal ($RF_{IN}$) to an input matching network (M1).

5. The method of claim 4, wherein the input matching network (M1) is a single-input single-output matching network.

6. The method of claim 4, wherein the method further comprises transforming, by the input matching network (M1), the RF input signal ($RF_{IN}$) to provide a power match to an input of each of the transconducting cells of the first stage.

7. The method of claim 1, wherein the method further comprises inputting, the AC RF output current ($I_{RF\_OUT}$) outputted from at least one of the transconducting cells of the plurality transconducting cells of the first stage, into an inner stage matching network (M2) to deliver power to the transconducting cells of the second stage.

8. The method of claim 7, wherein the inner stage matching network (M2) is a single-input single-output matching network.

9. The method of claim 1, wherein the method further comprises inputting the AC RF output current ($I_{RF\_OUT}$) outputted from at least one of the transconducting cells of the plurality transconducting cells of the second stage, into an output matching network (M3) to deliver power to a load ($R_L$).

10. The method of claim 9, wherein the output matching network (M3) is a single-input single-output matching network.

11. A high-voltage multi-stage signal amplifier, the amplifier comprising:
a plurality of transconducting cells of a first stage, each configured to receive a direct current (DC) supply current (Idc), an alternating current (AC) radio frequency (RF) input current ($I_{RF\_IN}$), and an RF input signal ($RF_{IN}$); and each configured to output the DC supply current (Idc) and an AC RF output current ($I_{RF\_OUT}$); and a plurality of transconducting cells of a second stage, each configured to receive the DC supply current (Idc), the AC RF input current ($I_{RF\_IN}$), and the RF input signal ($RF_{IN}$); and each configured to output the DC supply current (Idc) and the AC RF output current ($I_{RF\_OUT}$), wherein the transconducting cells of the first stage are connected together in cascode for the DC supply current (Idc), are connected together in parallel or in cascade for the RF input signal ($RF_{IN}$), and are connected together in parallel or in cascade for the AC RF output currents ($I_{RF\_OUT}$), wherein the transconducting cells of the second stage are connected together in cascode for the DC supply current (Idc), are connected together in parallel or in cascade for the RF input signal ($RF_{IN}$), and are connected together in parallel or in cascade for the AC RF output currents ($I_{RF\_OUT}$), and wherein the first stage and the second stage are connected together in cascode for the DC supply current.

12. A method for operation of a high-voltage signal amplifier, the method comprising:
inputting, into each transconducting cell of a plurality of transconducting cells, a direct current (DC) supply current (Idc), an alternating current (AC) radio frequency (RF) input current ($I_{RF\_IN}$), and an RF input signal ($RF_{IN}$); and outputting, by each of the transconducting cells of the plurality of transconducting cells, the DC supply current (Idc) and an AC RF output current ($I_{RF\_OUT}$), wherein the transconducting cells are connected together in cascode for the DC supply current (Idc), are connected together in parallel or in cascade for the RF input signal ($RF_{IN}$), and are connected together in parallel or in cascade for the AC RF output currents ($I_{RF\_OUT}$).

13. The method of claim 12, wherein the method further comprises providing, by an input signal source (Vin), the RF input signal ($RF_{IN}$) to an input matching network (M1).

14. The method of claim 13, wherein the method further comprises transforming, by the input matching network (M1), the RF input signal ($RF_{IN}$) to provide a power match to an input of each of the transconducting cells.

15. The method of claim 13, wherein when the transconducting cells are connected together in cascade for the RF input signal ($RF_{IN}$), the input matching network (M1) is connected to an input junction of one of the transconducting cells.

16. The method of claim 12, wherein the method further comprises inputting, the AC RF output current ($I_{RF\_OUT}$) outputted from the transconducting cells of the plurality transconducting cells, into an output matching network (M2) to deliver power to a load impedance ($R_L$).

17. The method of claim 16, wherein when the transconducting cells are connected together in cascade for the AC RF output currents ($I_{RF\_OUT}$), the output matching network (M2) is connected to an output junction of one of the transconducting cells.

18. The method of claim 12, wherein the method further comprises splitting a power supply voltage (Vdd) evenly amongst the transconducting cells to power the transconducting cells.

19. The method of claim 18, wherein a DC supply voltage drop of Vdd/N, where N is a number of the transconducting cells, is across each of the transconducting cells.

20. A high-voltage signal amplifier, the amplifier comprising:
- a plurality of transconducting cells, each configured to receive a direct current (DC) supply current (Idc), an alternating current (AC) radio frequency (RF) input current ($I_{RF\_IN}$), and an RF input signal ($RF_{IN}$); and each configured to output the DC supply current (Idc) and an AC RF output current ($I_{RF\_OUT}$),
- wherein the transconducting cells are connected together in cascode for the DC supply current (Idc), are connected together in parallel or in cascade for the RF input signal ($RF_{IN}$), and are connected together in parallel or in cascade for the AC RF output currents ($I_{RF\_OUT}$).

* * * * *